(12) United States Patent
Hashemi et al.

(10) Patent No.: US 8,441,615 B2
(45) Date of Patent: May 14, 2013

(54) SYSTEM FOR ISOLATING AN EXPOSURE APPARATUS

(75) Inventors: Fardad A. Hashemi, Moraga, CA (US); Douglas C. Watson, Campbell, CA (US); Christopher Margeson, Mountain View, CA (US)

(73) Assignee: Nikon Corporation, Tokyo (JP)

( * ) Notice: Subject to any disclaimer, the term of this patent is extended or adjusted under 35 U.S.C. 154(b) by 684 days.

(21) Appl. No.: 12/548,895

(22) Filed: Aug. 27, 2009

(65) Prior Publication Data

US 2010/0053589 A1   Mar. 4, 2010

Related U.S. Application Data

(60) Provisional application No. 61/094,182, filed on Sep. 4, 2008, provisional application No. 61/098,009, filed on Sep. 18, 2008, provisional application No. 61/098,016, filed on Sep. 18, 2008, provisional application No. 61/098,029, filed on Sep. 18, 2008, provisional application No. 61/098,039, filed on Sep. 18, 2008, provisional application No. 61/098,047, filed on Sep. 18, 2008, provisional application No. 61/098,057, filed on Sep. 18, 2008, provisional application No. 61/098,061, filed on Sep. 18, 2008, provisional application No. 61/098,050, filed on Sep. 18, 2008, provisional application No. 61/234,734, filed on Aug. 18, 2009.

(51) Int. Cl.
*G03B 27/58* (2006.01)
*G03B 27/62* (2006.01)
*F16M 13/00* (2006.01)

(52) U.S. Cl.
USPC ................................ 355/72; 355/75; 248/562

(58) Field of Classification Search .................... 355/53, 355/72–76; 285/226; 138/121; 248/562
See application file for complete search history.

(56) References Cited

U.S. PATENT DOCUMENTS 2,293,437 A    8/1942   La Coste et al.
2,377,889 A    6/1945   La Coste et al.
(Continued)

FOREIGN PATENT DOCUMENTS

JP   2004165416 A   6/2004

OTHER PUBLICATIONS

Jean-Charles Dumas et al., Overview of ACIGA high performance vibration isolator, LIGO document G050544-00-Z, 2005, http://www.iop.org/EJ/article/1742-6596/32/1018/jpcon6_32_018.pdf?request-id=5323ec4e-ad-29-448d-a262-97ea54291297.

(Continued)

*Primary Examiner* — Hung Henry Nguyen
(74) *Attorney, Agent, or Firm* — Roeder & Broder LLP

(57) ABSTRACT

A precision assembly (10) for fabricating a substrate (42) includes a precision fabrication apparatus (12), a pedestal assembly (14) and a suspension system (16). The precision fabrication apparatus (12) fabricates the substrate (42). The pedestal assembly (14) supports at least a portion of the fabrication apparatus (12). The suspension system (16) inhibits the transfer of motion between the mounting base (20) and the pedestal assembly (14). The suspension system (16) can include (i) a first boom (380) that is coupled to the mounting base (20) and the pedestal assembly (14), the first boom (380) being pivotable coupled to at least one of the mounting base (20) and the pedestal assembly (14), and (ii) a first resilient assembly (382) that is coupled between the mounting base (20) and at least one of the first boom (380) and the pedestal assembly (14). The first resilient assembly (382) can function similar to a zero length spring over an operational range of the resilient assembly (382). With this design, the components of the precision fabrication apparatus (12) are better protected by the suspension system (16) during a seismic disturbance. This reduces the likelihood of damage and misalignment of the components of the precision fabrication apparatus (12) during the seismic disturbance.

31 Claims, 34 Drawing Sheets

U.S. PATENT DOCUMENTS

| | | | | |
|---|---|---|---|---|
| 5,370,352 | A * | 12/1994 | Platus | 248/619 |
| 6,517,060 | B1 * | 2/2003 | Kemeny | 267/136 |
| 6,870,600 | B2 * | 3/2005 | Hazelton | 355/53 |
| 7,087,906 | B2 * | 8/2006 | Hazelton | 250/440.11 |
| 7,568,565 | B2 * | 8/2009 | McFarland et al. | 188/380 |
| 8,061,677 | B2 * | 11/2011 | Johnson et al. | 248/550 |
| 2006/0277843 | A1 * | 12/2006 | Livingston et al. | 52/110 |
| 2007/0030462 | A1 | 2/2007 | Yuan et al. | |

OTHER PUBLICATIONS

Minus K. Technology, a negative stiffness low frequency vibration isolation system,Nano-K® vibration, http://www.minusk.com/content/technology/how-it-works.html, © Minus K Technology, Inc., Vibration Isolation System, Applicants believe the technology in this document is prior art.

Takahashi, Nikon Corporation, Report on Measures for Improving S206D's Quake Resistance and Result of Operation Check, to: Miyagi Oki Electric, Apr. 26, 2004 Report to Miyagioki Electric.

EJ Chin et al., AIGO High Performance Compact Vibration Isolation System, Journal of Physics;Conference Series 32 (2006),pp. 111-116, School of Physics, The University of Western Australia, Nedlands, WA 6907 Australia, © 2006 IPO Publishing Ltd.,http://www.iop.org/EJ/article/1742-6596/32/1/018/jpconf6_32_018.pdf?request-id=7759518f-171f-4caf-92ee-133767fbbe17.

Mitsubishi, Seismic Isolation Floor, Examples of the Application of Three Dimensional Seismic Isolation Floor Utilizing Earthquake Early Warning (EEW), MHI's Seismic Isolation Systems, sales brochure, Mitsubishi Heavy Industries, http://www/mhi.co,jp/machine/index.htm, Copyright © 1994-2009, Mitsubishi Heavy Industries, Ltd.

Platus, David L., Negative-Stiffness-Mechanism Vibration Isolation Systems, Minus K. Technolgy, Inc., SPIE vol. 3786, Jul. 1999, Part of SPIE Conference on Current Developments in Vibration Control for Optomechanical Systems, Denver, CO.

* cited by examiner

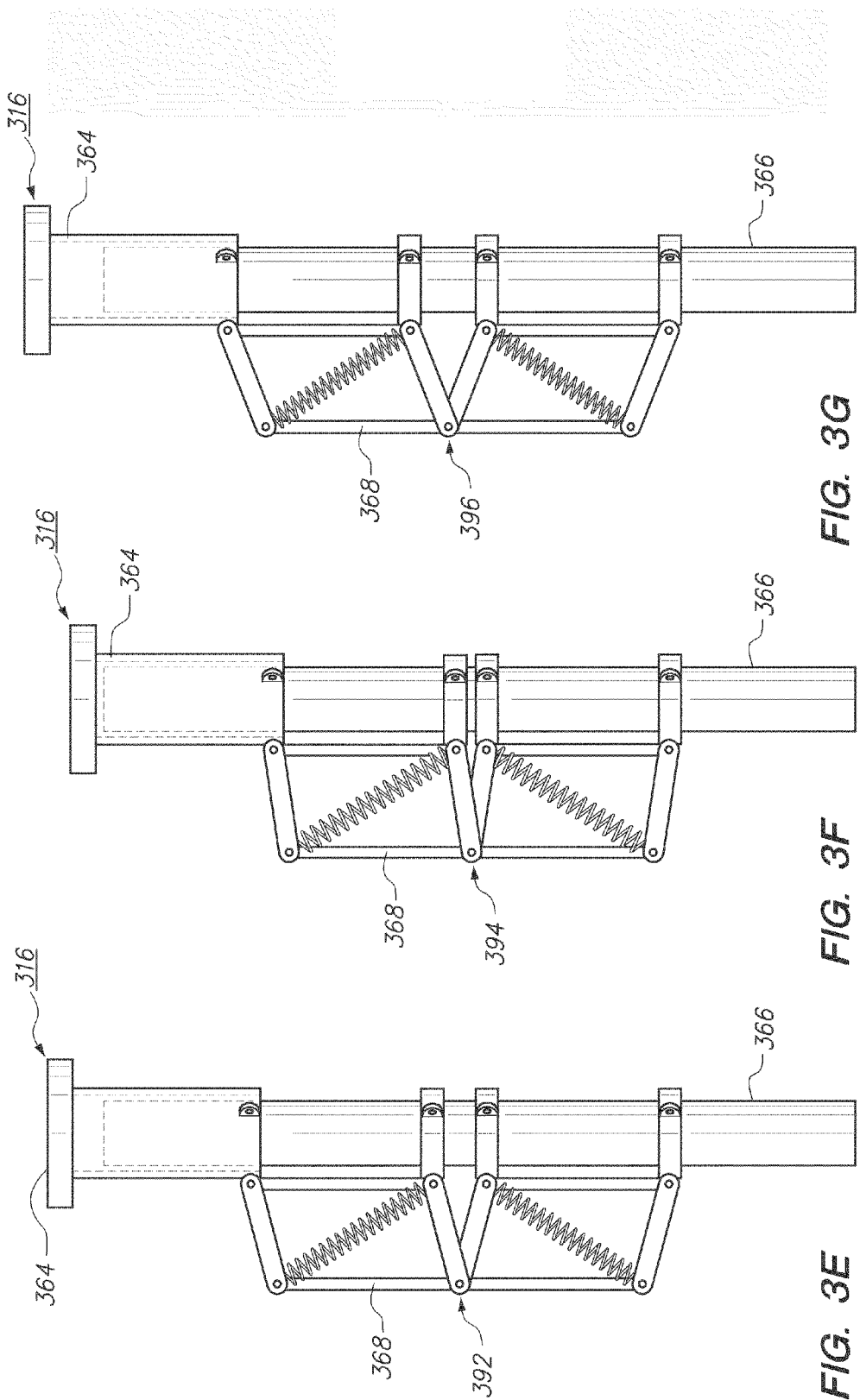

SYSTEM FOR ISOLATING AN EXPOSURE APPARATUS

RELATED INVENTIONS

This application claims priority on (i) U.S. Provisional Application Ser. No. 61/094,182, filed Sep. 4, 2008 and entitled "MECHANISM FOR ACHIEVING PERFECTLY LINEAR NEGATIVE STIFFNESS WITH OR WITHOUT AN INDEPENDENT PRE-LOAD FORCE"; (ii) U.S. Provisional Application Ser. No. 61/098,009, filed Sep. 18, 2008 and entitled "UNIFIED PEDESTAL BOX SUSPENSION"; (iii) U.S. Provisional Application Ser. No. 61/098,016, filed Sep. 18, 2008 and entitled "QUICK RELEASE MECHANISM FOR PEDESTAL"; (iv) U.S. Provisional Application Ser. No. 61/098,029, filed Sep. 18, 2008 and entitled "EARTHQUAKE ATTENUATION USING MODULAR LACOSTE SUSPENSION BASED MONOPODS"; (v) U.S. Provisional Application Ser. No. 61/098,039, filed Sep. 18, 2008 entitled "EARTHQUAKE ATTENUATION USING LACOSTE SUSPENSION BASED ON AIR SPRINGS"; (vi) U.S. Provisional Application Ser. No. 61/098,047 filed Sep. 18, 2008 entitled "EARTHQUAKE ATTENUATION USING LACOSTE SUSPENSION"; (vii) U.S. Provisional Application Ser. No. 61/098,057, filed Sep. 18, 2008 and entitled "COMBINED LACOSTE AND GARDEN GATE MECHANISM FOR COMBINED VERTICAL AND HORIZONTAL EARTHQUAKE ATTENUATION"; (viii) U.S. Provisional Application Ser. No. 61/098,061, filed Sep. 18, 2008 and entitled "MULTIPLE INDEPENDENTLY SUSPENDED PEDESTALS"; (ix) U.S. Provisional Application Ser. No. 61/098,050, filed on Sep. 18, 2008 and entitled "EARTHQUAKE ATTENUATION USING QUICK BURNING PROPELLANT CHARGE", and (x) U.S. Provisional Application Ser. No. 61/234,734, filed Aug. 18, 2009 and entitled "SYSTEM FOR ISOLATING AN EXPOSURE APPARATUS". As far as permitted, the contents of U.S. Provisional Application Ser. Nos. 61/094,182; 61/098,009; 61/098,016; 61/098,029; 61/098,039; 61/098,047; 61/098,057; 61/098,061, 61/098,050, and 61/234,734 are incorporated herein by reference.

BACKGROUND

Exposure apparatuses for semiconductor processing are commonly used to transfer images from a reticle onto a semiconductor wafer during semiconductor processing. A typical exposure apparatus includes (i) an illumination system having an illumination source and an illumination optical assembly, (i) a reticle stage assembly that positions a reticle, (iii) a projection optical assembly, and (iv) a wafer stage assembly that positions a semiconductor wafer. With this design, the illumination system illuminates the reticle to transfer images to the wafer. The proper alignment and functioning of these components is necessary to generate high density wafers.

Unfortunately, the alignment of the components of the exposure apparatus can be changed and the equipment damaged during an earthquake.

SUMMARY

The present invention is directed to a precision assembly for fabricating a substrate. In one embodiment, the precision assembly includes a precision fabrication apparatus, a pedestal assembly and a suspension system. The precision fabrication apparatus is adapted for fabricating the substrate. The pedestal assembly supports at least a portion of the fabrication apparatus. The suspension system inhibits the transfer of motion between the mounting base and the pedestal assembly. In one embodiment, the suspension system includes (i) a first boom that is coupled to the mounting base and the pedestal assembly, the first boom being pivotable coupled to at least one of the mounting base and the pedestal assembly, and (ii) a first resilient assembly that is coupled between the mounting base and at least one of the first boom and the pedestal assembly.

As provided herein, the first resilient assembly can function similar to a zero length spring over an operational range of the resilient assembly. For example, the first resilient assembly can be a zero length spring. Alternatively, the first resilient assembly can include a piston cylinder and a piston that is movable relative to the piston cylinder.

In one embodiment, the suspension system also includes (i) a second boom that is coupled to the mounting base and the pedestal assembly, the second boom being pivotable coupled to at least one of the mounting base and the pedestal assembly, and (ii) a second resilient assembly that is coupled between the mounting base and at least one of the second boom and the pedestal assembly. In this embodiment, each resilient member can function similar to a zero length spring over an operation range.

In another embodiment, the suspension system has a negative stiffness. In this embodiment, the suspension system can include a movable mount that movable couples the first resilient assembly to the mounting base, a boom connector that pivotable connects the boom to the mounting base, and a mount resilient assembly that maintains the movable mount spaced apart from the boom connector.

Alternatively, the suspension system can have substantially zero stiffness. As used herein, the term zero stiffness mechanism shall mean a mechanism that exerts a constant force regardless of its position or motion.

The present invention is also directed to an isolation system that includes (i) a pedestal assembly on which a first object is mounted; and (ii) a suspension assembly that couples the pedestal assembly to the second object, the suspension assembly supporting the pedestal with a substantially zero stiffness. In this embodiment, the suspension assembly can include a positive stiffness resilient mechanism and a negative stiffness resilient mechanism.

The present invention also directed to a suspension that includes a first mount, a second mount, a first subassembly and a second subassembly. The first mount is secured to the first object and the second mount that is secured to the second object. The first subassembly and the second subassembly inhibit movement of the first mount from being transferred to the second mount. The first subassembly can include a first boom that pivotable cantilevers from the first mount, and a first resilient member that is coupled between the first mount and the first boom. Somewhat similarly, the second subassembly includes a second boom that pivotable cantilevers from one of the mounts, and a second resilient member that is coupled between one of the mounts and the second boom. The use of multiple systems with shared mounts allows for a compact, zero stiffness, modular, monopod suspension that can easily be incorporated into many different precision manufacturing apparatuses, including exposure apparatuses.

In one embodiment, the second boom is pivotable connected to the first mount, and the second resilient member is coupled between the first mount and the second boom. In this embodiment, the first and second subassemblies are LaCoste type systems arranged in parallel. In another embodiment, (i) the second boom is pivotable connected to the second mount, (ii) the second resilient member is coupled between the second mount and the second boom, a distal end of the first boom is mechanically coupled to a distal end of the second boom with a first boom connector. In this embodiment, the first and second subassemblies are LaCoste type systems arranged in series.

Moreover, the present invention is directed to a mechanism for inhibiting the transfer of motion between a first object and a second object. In one embodiment, the suspension includes a first mount, a first support, and a first suspension assembly. The first mount is secured to the first object and the first support is secured to the second object. The first suspension assembly couples the first mount to the first support and the first suspension assembly inhibits the transfer of motion along the first axis and along the second axis. In certain embodiments, the first suspension assembly defines a first LaCoste type system and a first garden gate type assembly that are arranged in series.

As used herein, the term "LaCoste type system" shall mean a suspension system that has approximately zero stiffness and exerts a substantially constant force regardless of the motion.

Further, as used herein, the term "garden gate type assembly" shall mean a system that hingeable pivots similar to a gate.

In one embodiment, the first LaCoste type system is secured to the first mount, and the first garden gate type assembly extends between and hingeable connects the first LaCoste type system and the first support.

The present invention is also directed to a resilient mechanism that includes a boom connector, a boom, a movable mount, and a boom first resilient assembly. The boom connector is fixedly secured to the first object. The boom pivotable cantilevers from the boom connector, and a boom distal end of the boom is coupled to the second object. The movable mount is movable relative to the boom connector and the first object. The boom first resilient assembly is coupled between the movable mount and the boom. With this design, the resilient mechanism has a negative stiffness that is perfectly linear over the entire range of motion, and the resilient mechanism can be used for seismic isolation of large amplitude disturbances.

As used herein, the term "negative stiffness" means a position dependent force characteristic where: the force is zero at a position zero, the magnitude of the force increases linearly with distance away from position zero, and the direction of the force, when not at position zero, point away from position zero.

In certain embodiments, the negative stiffness resilient mechanism can be utilized as part of a suspension system that includes one or more positive stiffness suspensions to isolate a precision fabrication apparatus. In this design, the negative stiffness resilient mechanisms counteract the positive stiffness of the one or more positive stiffness suspensions and reduce the overall stiffness of a suspension system.

The negative stiffness resilient mechanism can be useful in any other application where positive stiffness inherent to the system should be reduced or taken out while still maintaining the same constant force. Thus, the resilient mechanism can be used in any application where a constant force is required over a large range of motion but stiffness inherent to the system needs to be reduced or cancelled out by negative stiffness.

In one embodiment, the boom first resilient assembly functions substantially similar to a zero-length spring over an operational range of the boom first resilient assembly. Further, the resilient mechanism can include a mount resilient assembly that maintains the movable mount spaced apart from the boom connector. Moreover, the movable mount is movable relative to the boom connector along a movement axis.

As provided herein, the resilient mechanism can also include a boom second resilient assembly that is connected between the first object and the boom. In this embodiment, each boom resilient assembly can function substantially similar to a zero-length spring over an operational range. Further, in this embodiment, (i) the boom pivots about a pivot axis, (ii) the boom first resilient assembly urges the boom to pivot about the pivot axis in a first rotational direction, and (iii) the boom second resilient assembly urges the boom to pivot about the pivot axis in a second rotational direction that is opposite from the first rotational direction.

Moreover, in certain embodiments, a stiffness of the mount resilient assembly, a stiffness of the boom first resilient assembly, and a stiffness of the boom second resilient assembly can be selected so that the resilient mechanism has a preload force (i) of approximately zero, (ii) that is positive, or (iii) that is negative. Stated in another fashion, in addition to providing negative stiffness, in certain embodiments, the resilient mechanism can be designed to provide a preset constant preload force that can be adjusted to be positive, negative, or zero.

As used herein, the term a positive preload force means a substantially constant force along a first direction that is independent of the position of the mechanism and that is in addition to the position dependent force of the negative stiffness, the term a negative preload force means a substantially constant force along a second direction opposite the first direction that is independent of the position of the mechanism and that is in addition to the position dependent force of the negative stiffness, and a zero preload force means there is approximately no other force other than the position dependent force of the negative stiffness exerted.

The present invention is further directed a precision assembly that includes a precision manufacturing apparatus for manufacturing the substrate, a pedestal assembly that supports at least a portion of the manufacturing apparatus, and a isolation system that inhibits the transfer of motion between a mounting base and the pedestal assembly. As provided herein, the pedestal assembly includes a first pedestal and a spaced apart second pedestal. In one embodiment, the precision manufacturing apparatus includes at least one first component that is secured to the first pedestal and at least one second component that is secured to the second pedestal. The isolation system includes (i) a first isolation assembly that is coupled between the mounting base and the first pedestal, the first isolation assembly inhibiting the transfer of motion between the mounting base and the first pedestal, and (ii) a second isolation assembly that is coupled between the mounting base and the second pedestal, the second isolation assembly inhibiting the transfer of motion between the mounting base and the second pedestal. With this arrangement, the isolation system inhibits the transfer of vibration between the pedestals during normal operation of the precision manufacturing apparatus.

In certain embodiments, a stiffness of one or both of the isolation assemblies is tuned so that a first mode of vibration of the first pedestal is approximately equal to a first mode of vibration of the second pedestal. Additionally, or alternatively, the precision assembly can include a pedestal synchronization system that causes the first pedestal to move approximately together with the second pedestal during a seismic disturbance. This arrangement inhibits the pedestals and the components of the pedestals from knocking into each other during the seismic disturbance. Further, this arrangement inhibits any physical connections between the components on the pedestals from being strained or severed during the seismic disturbance. Moreover, this reduces the likelihood of damage and misalignment of the components of the precision manufacturing apparatus caused by relative movement of these components during the seismic disturbance.

In one embodiment, the pedestal synchronization system includes a pedestal lock assembly that selectively locks the first pedestal to the second pedestal prior to the seismic disturbance. Additionally, or alternatively, the pedestal synchronization system can include a pedestal mover assembly that causes the first pedestal to move approximately together with (track and follow) the second pedestal during the seismic event. For example, the pedestal mover assembly can include one or more movers that are coupled directly between the pedestals, and/or one or more movers that are coupled directly between one of the pedestals and the mounting base.

Additionally, the precision assembly can include a pedestal measurement system that provides positional information regarding the position of at least one of the pedestals, and a pedestal control system that controls the pedestal mover assembly to adjust the position of one or both of the pedestals based on the positional information.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIGS. 3E-3G are side views of a portion of the suspension of FIG. 3A in alternative positions;

DESCRIPTION

Figure 1:
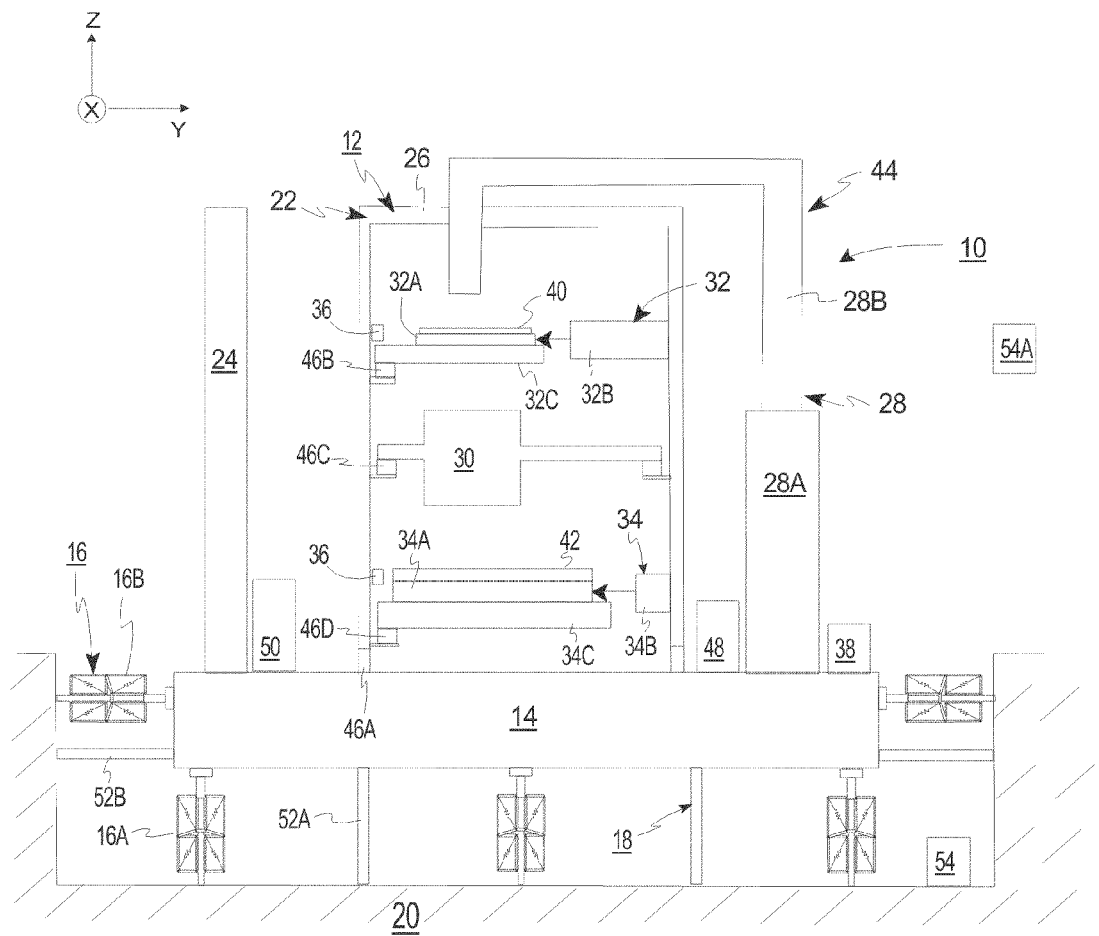
FIG. 1 is a simplified schematic illustration of one embodiment of a precision assembly having features of the present invention.

FIG. 1 is a schematic illustration of a precision assembly 10 having features of the present invention that includes a precision manufacturing apparatus 12, a pedestal 14 (sometimes referred to as a platform) that retains the components of the precision manufacturing apparatus 12, and a suspension system 16. As an overview, in certain embodiments, the precision assembly 10 includes one or more components that are uniquely designed to protect and/or isolate the precision assembly 10 during a seismic disturbance. For example, in the embodiment illustrated in FIG. 1, the suspension system 16 includes one or more LaCoste type suspensions 16A, 16B that support and isolate the pedestal 14 and the precision manufacturing apparatus 12 during a seismic disturbance. The LaCoste type suspensions 16A, 16B can be designed to have approximately zero stiffness and exert a substantially constant force on the pedestal 14 regardless of the motions of the pedestal 14. As a result thereof, the components of the precision manufacturing apparatus 12 are better protected during the seismic disturbance. This reduces the likelihood of damage and misalignment of the components of the precision manufacturing apparatus 12 during the seismic disturbance.

In one embodiment, the precision manufacturing apparatus 12 also includes one or more locking assemblies 18 (illustrated as boxes in FIG. 1) that selectively lock the pedestal 14 to a mounting base 20 when a seismic disturbance is not occurring. With this design, the locking assembly 18 fixedly retains the precision manufacturing apparatus 12 during normal operation of the precision manufacturing apparatus 12, and the locking assembly 18 can quickly release the precision manufacturing apparatus 12 so that the suspension system 16 can inhibit the transfer of vibration from the mounting base 20 to the precision manufacturing apparatus 12 to protect the precision manufacturing apparatus 12. Suitable non-exclusive examples of locking assemblies 18 are described in more detail below.

A number of Figures include an orientation system that illustrates an X axis, a Y axis that is orthogonal to the X axis and a Z axis that is orthogonal to the X and Y axes. It should be noted that any of these axes can also be referred to as the first, second, and/or third axes.

The mounting base 20 can be the ground, a base, a floor of a building, or some other supporting structure.

The design of the precision manufacturing apparatus 12 can be varied to achieve the desired manufacturing process. For example, the precision manufacturing apparatus 12 can be used for manufacturing wafers, precision components, and/or liquid crystal displays, circuit boards, and other substrates to be patterned for applications including MEMS applications. In one non-exclusive embodiment, the precision manufacturing apparatus 12 can include an exposure apparatus 22 and a transfer mechanism 24. Alternatively, for example, the precision manufacturing apparatus 12 can be an optical table. The design of each of these components can be varied pursuant to the teachings provided herein.

In one embodiment, the exposure apparatus 22 includes an apparatus frame 26, an illumination system 28 (irradiation apparatus), a projection optical assembly 30, a reticle stage assembly 32, a wafer stage assembly 34, a measurement system 36, and a lithographic control system 38. With this design, the exposure apparatus 22 is particularly useful as a lithographic device that transfers a pattern (not shown) of an integrated circuit from a reticle 40 onto a semiconductor wafer 42. However, the use of the exposure apparatus 22 provided herein is not limited to a photolithography system for semiconductor manufacturing. The exposure apparatus 22, for example, can be used as an LCD photolithography system that exposes a liquid crystal display device pattern onto a rectangular glass plate or a photolithography system for manufacturing a thin film magnetic head. Moreover, the suspensions 16A, 16B disclosed herein can be used to isolate other types of precision equipment.

The apparatus frame 26 is rigid and secures many of the components of the exposure apparatus 22 to the pedestal 14.

The illumination system 28 includes an illumination source 28A and an illumination optical assembly 28B. The illumination source 28A emits a beam (irradiation) that exposes selectively different portions of the reticle 40 and exposes the wafer 42. In FIG. 1, the illumination source 28A is illustrated as being secured to the pedestal next to the apparatus frame 26.

The illumination source 28A can be a g-line source (436 nm), an i-line source (365 nm), a KrF excimer laser (248 nm), an ArF excimer laser (193 nm) or a $F_2$ laser (157 nm). Alternatively, for example, the illumination source 28A can generate beams such as an extreme ultraviolet, x-ray, electron, or ion beams.

The illumination optical assembly 28B guides the beam from the illumination source 28A to either (i) above the reticle 40 for a partly transparent reticle 40, or (ii) below the reticle 40 for a reflective reticle 40.

The projection optical assembly 30 projects and/or focuses the light from the reticle 40 to the wafer 42. Depending upon the design of the exposure apparatus 22, the projection optical assembly 30 can magnify or reduce the image illuminated on the reticle 40. It could also be a 1x system.

The reticle stage assembly 32 holds and positions the reticle 40 relative to the projection optical assembly 30 and the wafer 42. The reticle stage assembly 32 can include a reticle stage 32A that retains the reticle 40, a reticle stage mover 32B that moves the reticle 40 with one or more degrees of movement, and a reticle stage base 32C that supports the reticle stage 32A.

Somewhat similarly, the wafer stage assembly 34 holds and positions the wafer 42 with respect to the projected image of the illuminated portions of the reticle 40. The wafer stage assembly 34 can include a wafer stage 34A that retains the wafer 42, a wafer stage mover 34B that moves the wafer 32 with one or more degrees of movement, and a wafer stage base 34C that supports the wafer stage 34A.

The apparatus measurement system 36 monitors movement of the reticle 40 and the wafer 42 relative to the optical assembly 30 or some other reference. For example, the apparatus measurement system 36 can utilize multiple laser interferometers, encoders, and/or other measuring devices.

The lithography control system 38 is electrically connected to the reticle stage assembly 32, the wafer stage assembly 34, and the measurement system 36. The lithography control system 38 receives information from the measurement system 22 and controls the stage mover assemblies 32, 34 to precisely position the reticle 40 and the wafer 42. The lithography control system 38 can include one or more processors and circuits.

Additionally, the exposure apparatus 22 can include one or more isolation devices for isolating various components from other components. For example, the exposure apparatus 22 include (i) one or more frame isolators 46A that isolate the apparatus frame 26 from the first pedestal level 14A, (ii) one or more reticle stage isolators 46B that isolate the reticle stage assembly 32 from the apparatus frame 26, (iii) one or more wafer stage isolators 46C that isolate the wafer stage assembly 34 from the apparatus frame 26, and/or (iv) one or more lens isolators 46D that isolate the projection optical assembly 30 from the apparatus frame 26. For example, one or more of the frame suspensions 46A, the stage suspensions 46B, 46C, and the lens suspensions 46D can be an active vibration suspension system commonly referred to as an AVIS suspension system. Further, the AVIS system can be designed to incorporate the LaCoste type suspensions 16A or the negative stiffness mechanism 2321 illustrated in FIG. 23 below.

Moreover, the exposure apparatus 22 can include one or more fluid sources 48 (only one is illustrated in FIG. 1 as a box), and one or more temperature control systems 50 (only one is illustrated in FIG. 1 as a box). As a non-exclusive example, the fluid source 48 can provide pressurized fluid to create fluid bearings that support (i) the reticle stage 32A relative to the reticle stage base 32C, and (ii) the wafer stage 34A relative to the wafer stage base 34C. Further, as a non-exclusive example, the temperature control system 50 can provide cooling fluid to reticle stage mover 32C and the wafer stage mover 34C to control the temperature of these components.

The transfer mechanism 24 can be used to load and unload reticles 40 and/or wafers 42. The transfer mechanism 24 can include one or more robotic arms.

The pedestal 14 supports the one or more precision components that are to be protected from the seismic disturbance. The size, shape, and design of the pedestal 14 can be varied to suit the components that it is supporting. In FIG. 1, the pedestal 14 supports the exposure apparatus 22 and the transfer mechanism 24. In this embodiment, the pedestal 14, the exposure apparatus 22, and the transfer mechanism 24 are collectively referred to herein as a suspended assembly 44. The pedestal 14 is rigid, and non-exclusive examples of suitable materials for the pedestal 14 include steel, cement, epoxy granite, polymer concrete, or cast iron.

The suspension system 16 inhibits vibration from a first object (e.g. the mounting base 20) from being transferred to a second object (e.g. the suspended assembly 44). Thus, in FIG. 1, the suspension system 16 isolates the pedestal 14 and the suspended assembly 44 during a seismic disturbance to protect the components of the suspended assembly 44. Stated in another fashion, the suspension system 16 inhibits vibration from the mounting base 20 from being transferred to the suspended assembly 44 during the earthquake. As a result thereof, the suspension system 16 reduces the accelerations and motions of suspended assembly 44 during the earthquake.

In certain embodiments, in order to attenuate vertical motions of an earthquake, the weight of the suspended assembly 44 must be suspended or floated so that the mounting base 20 can move relative to the suspended assembly 44. In one embodiment, the suspension system 16 is relatively soft and the suspended assembly 44 is relatively heavy. As a result thereof, the suspended assembly 44 will have a relatively low resonance frequency. Reducing the stiffness of the suspension system 16 reduces the forces that are transferred to the suspended assembly 44, and hence reduces the acceleration and motions of the suspended assembly 44 during an earthquake. In one embodiment, the suspension system 16 can be designed to have approximately zero stiffness, and to exert a constant vertical force equal to the weight of the suspended assembly 44 regardless of the motions of the suspended assembly 44.

When the suspended assembly 44 sits upon such a zero-stiffness suspension system 16, then it is subject to large motions when people in the clean room walk upon or otherwise disturb the pedestal 14. With this arrangement, without the use of the locking assembly 18, if someone walked on the pedestal 14, the suspended assembly 44 can move and become excited. This can reduce the accuracy of the features of the images being transferred to the wafer 42.

The design of the suspension system 16 can be varied to achieve the desired level of resonance frequency of the suspended assembly 44 and the desired directions in which the motion is attenuated. In one embodiment, the suspension system 16 includes (i) one or more spaced apart vertical suspensions 16A that inhibit movement of the mounting base 20 along the Z axis, about the X axis, and about the Y axis from being transferred to the pedestal 14 and the suspended assembly 44, and (ii) one or more spaced apart horizontal suspensions 16B that inhibit movement of the mounting base 20 along the X and Y axes, and about the Z axis from being transferred to the pedestal 14 and the suspended assembly 44. With this design, the suspension system 16 attenuates vibration with six degrees of freedom.

Alternatively, for example, the suspension system 16 can be designed to attenuate vibration with only three degrees of freedom.

It should be noted that in certain embodiments, the suspensions 16A, 16B must have a relatively long stroke to inhibit the transfer of vibration from the first object to the second object during an earthquake. As non-exclusive examples, the suspensions disclosed herein can have a stroke of at least approximately 10, 15, 30, or 50 centimeters. Suitable suspensions 16A, 16B are described in more detail below.

The locking assembly 18 inhibits and prevents unwanted large motions of the suspended assembly 44 relative to the mounting base 20 during normal operations of the precision manufacturing apparatus 12. Further, the locking assembly 18 holds onto the pedestal 14 and the suspended assembly 44 very rigidly and with very high stiffness, and subsequently releases the suspended assembly 44 prior to or during the seismic disturbance. In one embodiment, the locking assembly 18 includes (i) one or more spaced apart vertical locks 52A (illustrated as boxes) that cooperate to selectively inhibit movement of the suspended assembly 44 along the Z axis, about the X axis, and about the Y axis relative to the mounting base 20, (ii) one or more spaced apart horizontal locks 52B (illustrated as boxes) that cooperate to inhibit movement of the suspended assembly 44 along the X axis, along the Y axis and about the Z axis relative to the mounting base 20, and (iii) a control system 54 that controls the operation of the locks 52A, 52B. With this design, when activated, the locking assembly 18 inhibits movement of the suspended assembly 44 with six degrees of freedom.

The lock control system 54 is electrically connected and controls the locks 52A, 52B to selectively lock and unlock the pedestal 14 to the mounting base 20. The lock control system 54 can include one or more processors and circuits.

In one embodiment, the control system 54 is in electrical communication with a notification system 54A (illustrated as a box) that provides an early warning notification signal that a seismic disturbance is about to disturb the mounting base 20. Upon receipt of the early warning notification signal, the lock control system 54 can cause the locks 52A, 52B to unlock and release the pedestal 14 and the suspended assembly 44 prior to the seismic disturbance reaching the mounting base 20.

The design of the notification system 54A can vary. For example, the notification system 54A can include one or more spaced apart seismic sensors (not shown) that are at a radius of approximately five to ten kilometers around the perimeter of the precision apparatus 10 and that encircle the precision apparatus 10. Still alternatively, the notification system 54A can be a public institution that accesses one or more seismic sensors and that provides a notification signal that can be transferred to the lock control system 54.

In certain embodiments, a soft spring system (not shown in FIG. 1) can be used in parallel with the suspension system 16 to tune machine dynamics if a slight positive stiffness is desired.

Figure 2A:
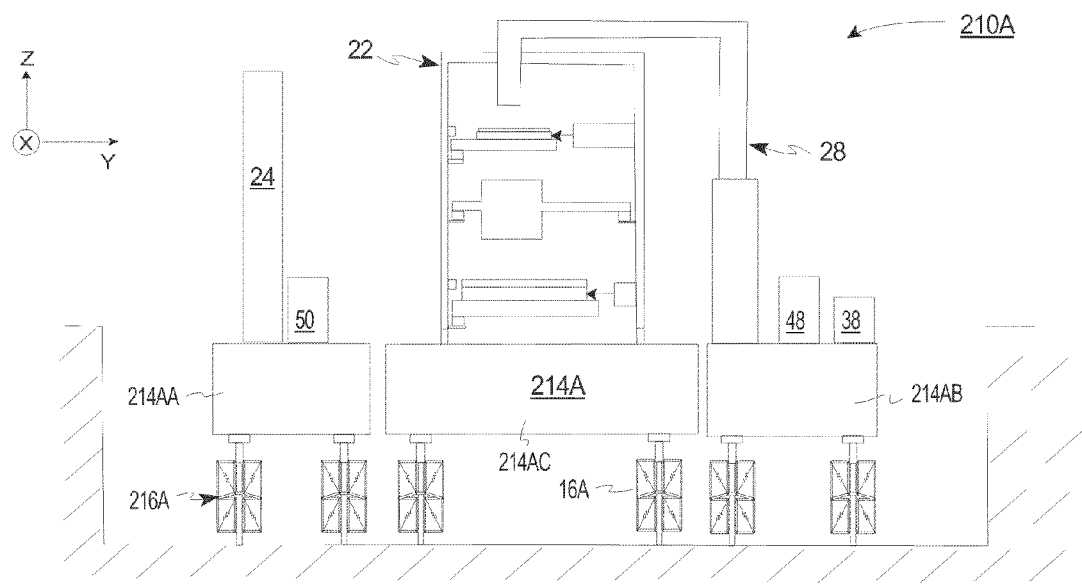
FIG. 2A is a simplified schematic illustration of another embodiment of a precision assembly having features of the present invention.

FIG. 2A is a schematic illustration of another embodiment of a precision assembly 210A that is somewhat similar to the precision assembly 10 illustrated in FIG. 1 and described above. However, in FIG. 2A, the pedestal 214A includes multiple pedestal sections, namely a first pedestal section 214AA, a second pedestal section 214AB, and a third pedestal section 214AC. In this embodiment, (i) the first pedestal section 214AA supports the transfer mechanism 24 and the temperature control system 50, (ii) the second pedestal section 214AB supports the fluid source 48, a portion of the illumination system 28, and the control system 38, and (iii) the third pedestal section 214AC supports the other components of the exposure apparatus 22. Alternatively, the pedestal 214A can be designed with more or fewer pedestal sections, and/or the arrangement of the components on the pedestal sections can be different than that illustrated in FIG. 2A.

Additionally, in FIG. 2A, the suspension system 216A includes separate suspensions 16A for each of the pedestal sections 214AA, 214AB, 214AC.

Figure 2B:
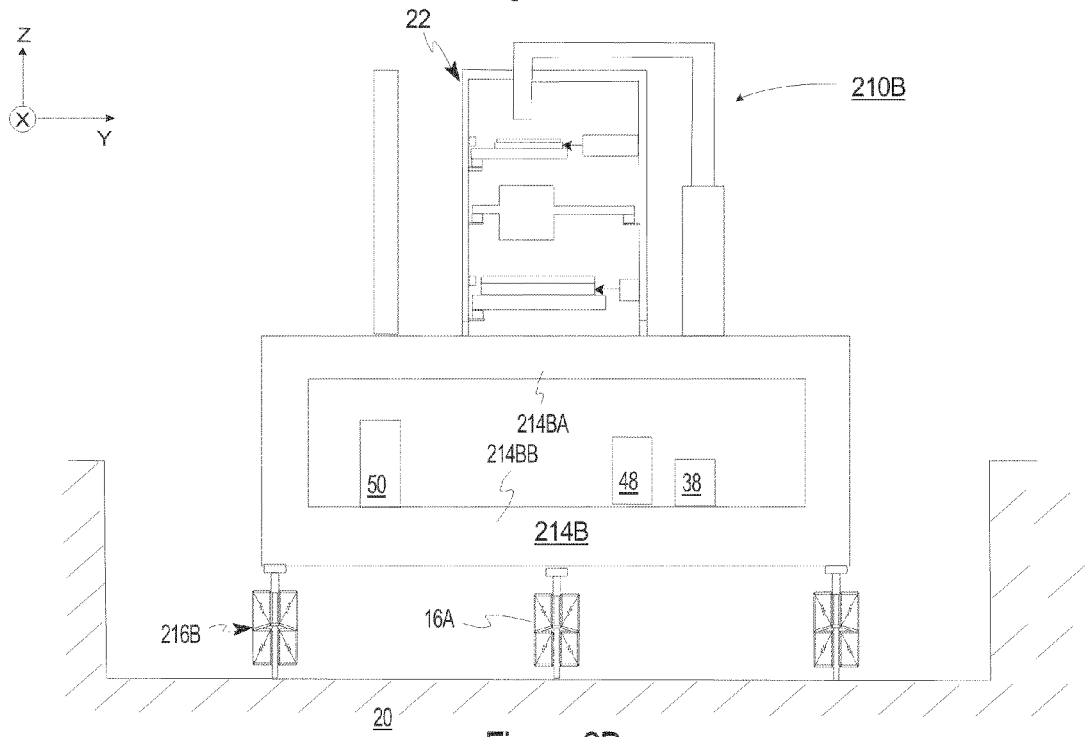
FIG. 2B is a simplified schematic illustration of yet another embodiment of a precision assembly having features of the present invention.

FIG. 2B is a schematic illustration of another embodiment of a precision assembly 210B that is somewhat similar to the precision assembly 10 illustrated in FIG. 1 and described above. However, FIG. 2B, the pedestal 214B includes multiple pedestal levels, namely an upper first pedestal level 214BA, and a lower second pedestal level 214BB that are rigidly connected together. In this embodiment, (i) the second pedestal level 214BB supports the temperature control system 50, the fluid source 48, and the control system 38, and (ii) the first pedestal level 214BA supports the other components of the exposure apparatus 22. Alternatively, the pedestal 214A can be designed with more pedestal levels, and/or the arrangement of the components on the pedestal levels can be different than that illustrated in FIG. 2B.

Additionally, in FIG. 2B, the suspension system 216B again includes a plurality of suspensions 16A that suspend the double level pedestal 214B.

In this embodiment, one or more conduits, e.g. wire and hoses (not shown) can extend through one or more apertures in the first pedestal level 214BA to allow for electrical and mechanical communication between the components secured to the first pedestal level 214BA and the components secured to the second pedestal level 214BB. Further, the components on the first pedestal level 214BA can be maintained in a clean room environment and the components on the second pedestal level 214BB can be in a relatively dirty environment.

As provided herein, because the pedestal levels 214BA, 214BB move concurrently during a seismic disturbance, this reduces the likelihood of damage and misalignment of the conduits during the seismic disturbance.

As provided herein, the suspensions inhibit the transfer of vibration between a first object and a second object. In FIGS. 1, 2A, and 2B, the first object is the suspended assembly 44 or a portion thereof, and the second object is the mounting base 20. Alternatively, the first object can be the mounting base 20 and the second object can be the suspended assembly 44. Still alternatively, the suspensions 16A disclosed herein can be used to inhibit the transfer of vibration between two other objects in a precision assembly 10.

Figures 3A, 3C:
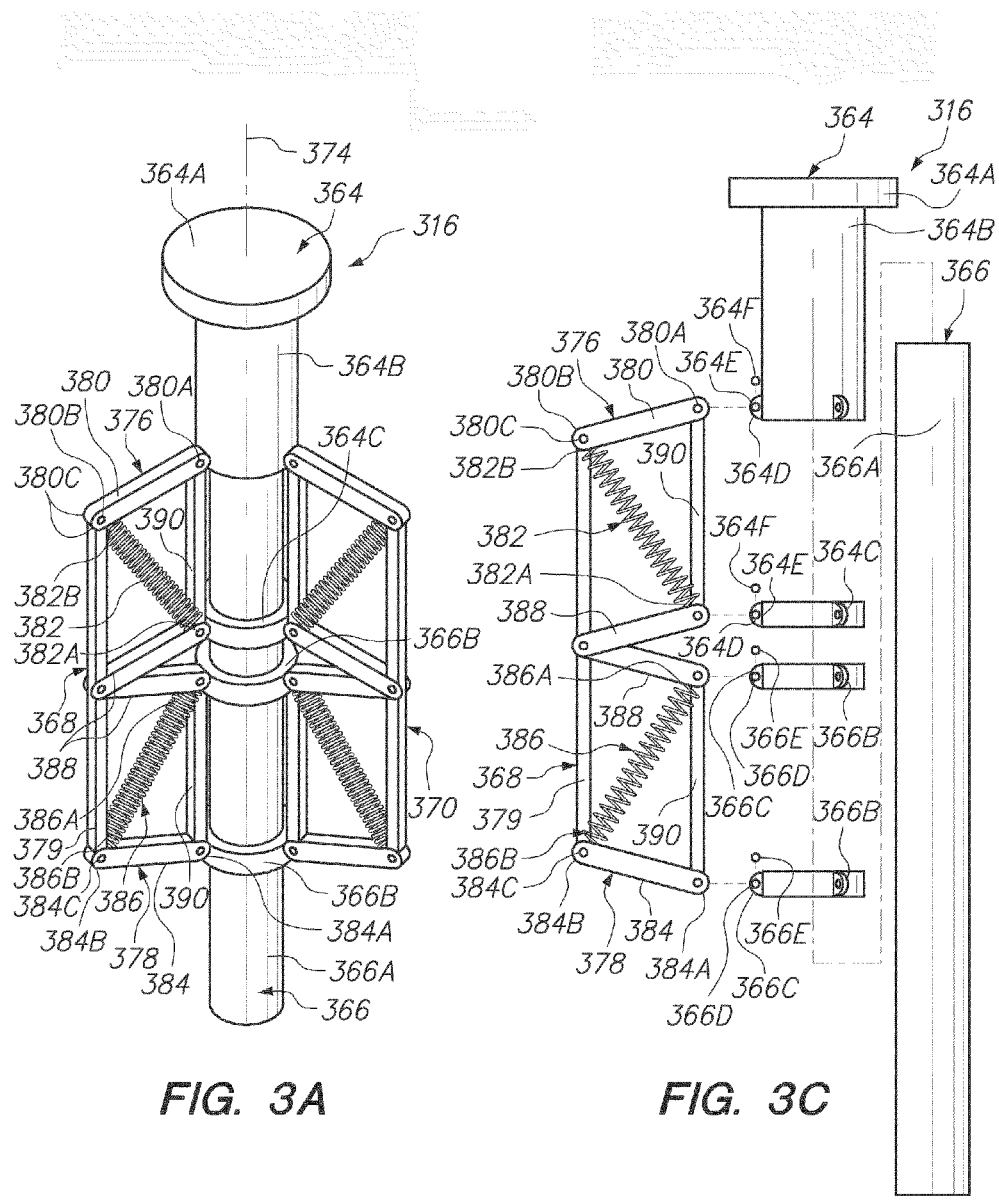
FIG. 3A is a perspective side view of a suspension having features of the present invention.
FIG. 3C is an exploded perspective view of a portion of the suspension of FIG. 3A.
Figure 3B:
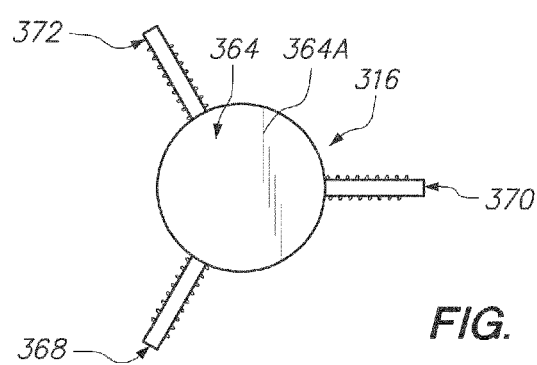
FIG. 3B is a top view of the suspension of FIG. 3A.
Figure 3D:
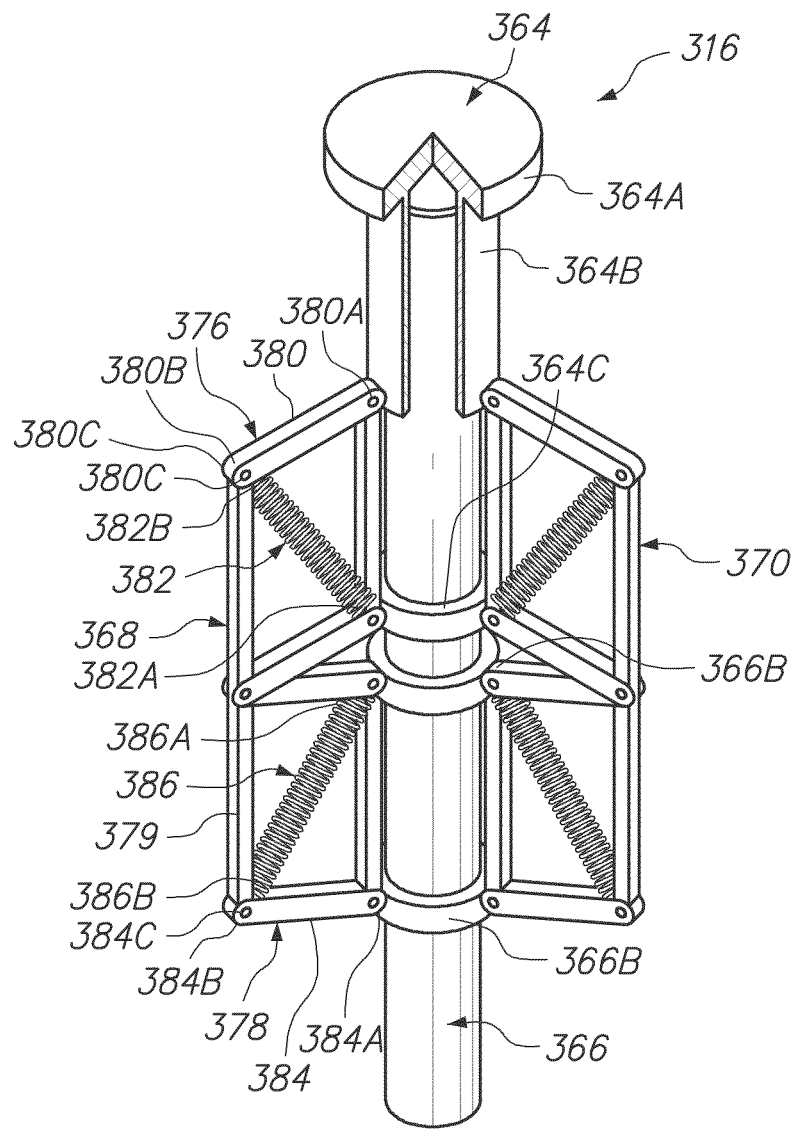
FIG. 3D is perspective view in partial cut-away of the suspension of FIG. 3A.

FIG. 3A is a perspective view, FIG. 3B is a top view, FIG. 3C is an exploded side view of a portion, and FIG. 3D is a perspective view, in partial cut-away of a suspension 296 that can be used in to inhibit the transfer of motion between objects in the precision assemblies 10, 210A, 210B illustrated in FIGS. 1, 2A, 2B or another type of precision assembly. In this embodiment, the suspension 296 includes a first mount 364, a second mount 366, a first resilient assembly 368, a second resilient assembly 1270, and a third resilient assembly 372. The design, shape, and size of these components can be varied to suit the design requirements of the rest of the precision assembly 10. For example, the suspension 296 can be designed to have more than or fewer than three resilient assemblies 368, 370, 372.

The first mount 364 is rigid and is fixed secured to the first object. In the embodiment illustrated in FIGS. 3A-3D, the first mount 364 includes an object contact 364A, a first guide 364B, and a second guide 364C that is spaced apart from the first guide 364B. In this embodiment, the object contact 364A is fixedly secured to the first object, the first guide 364B guides the motion of the first mount 364 relative to the second mount 366 along a movement axis 374, and the second guide 364C guides the motion of the first mount 364 relative to the second mount 366 along the movement axis 374. With this design, the first mount 364 fits over and is guided along the movement axis 374 by the second mount 366.

In one non-exclusive embodiment, (i) the object contact 364A is generally circular disk shaped, (ii) the first guide 364B is generally circular tube shaped, sized to fit over a portion of the second mount 366, and is fixedly secured to the object contact 364A, and (iii) the second guide 364C is also circular tube shaped and is sized to fit over a portion of the second mount 366. Alternatively, for example, the guides 364B, 364C can be rectangular tube shaped and/or the guides 364B, 364C can be combined into a single component. As provided herein, the guides 364B, 364C can include a plurality of spaced apart first mount supports 364D for pivotable connecting a portion of the resilient assemblies 368, 370, 372 to the first mount 364. In one embodiment, each of the first mount supports 364D is includes a flange having a support aperture 364E, and a pivot pin 364F that fits into the support aperture 364E and the resilient subassemblies 368, 370, 372.

Somewhat similarly, the second mount 366 is rigid and is fixed secured to the second object 262. In the embodiment illustrated in FIGS. 3A-3E, the second mount 366 guides the movement of the guides 364B, 364C of the first mount 364 relative to the second mount 366 along the movement axis 374. Thus, the second mount 366 has a shape that compliments the shape of the guides 364B, 364C. In one non-exclusive embodiment, the second mount 366 includes a generally cylindrical shaped beam 366A that fits within the tubular shaped guides 364B, 364C of the first mount 364. Alternatively, for example, the beam 366A can have a generally rectangular shaped cross-section or another shaped cross-sectional shape that compliments that of the guides 364B, 364C.

Additionally, the second mount 366 can include a pair of spaced apart attachment rings 366B that are fixedly secured to the beam 366A so that there is no relative movement between the rings 366B and the beam 366A, and each of the attachment rings 366B can include a plurality of spaced apart second mount supports 366C for pivotable connecting a portion of the resilient assemblies 368, 370, 372 to the second mount 366. In one embodiment, each of the second mount supports 366B is includes a flange having a support aperture 366C, and a pivot pin 366D that fits into the support aperture 366C and the resilient assemblies 368, 370, 372.

The resilient assemblies 368, 370, 372 flexible connect the mounts 364, 366 together, and the resilient assemblies 368, 370, 372 inhibit movement of the second mount 366 from being transferred to the first mount 364. In the embodiment illustrated in FIGS. 3A-3E, (i) each of the resilient assemblies 368, 370, 372 is similar in size, shape, and design, (ii) the resilient assemblies 368, 370, 372 are equally spaced (approximately 120 degrees between each) around the circumference of the mounts 364, 366, and (iii) the resilient assemblies 368, 370, 372 cantilever radially away from the mounts 364, 366. With this design, the resilient assemblies 368, 370, 372 are arranged in parallel to inhibit the transfer of motion between the mounts 364, 366. Alternatively, for example, one or more of the resilient assemblies 368, 370, 372 can be somewhat different in design and/or the spacing can be slightly offset.

In one embodiment, each of the resilient assemblies 368, 370, 372 includes a first subassembly 376, a second subassembly 378, and a boom connector 379 that are each aligned in a plane that is substantially parallel to the movement axis 374. In this embodiment, the first subassembly 376 can include (i) an upper first boom 380 that pivotable cantilevers from the first mount 364, and (ii) an upper first resilient member 382 that is coupled between the first mount 364 and the first boom 380. Further, the second subassembly 378 can include (i) a lower second boom 384 that pivotable cantilevers from the second mount 366, and (ii) a lower second resilient member 386 that is coupled between the second mount 366 and the second boom 384. Further the boom connector 379 physically and mechanically connects the first boom 380 to the second boom 384 so that the booms 380, 384 move concurrently. Thus, in this embodiment with the three resilient assemblies 368, 370, 372, there are a total of six subassemblies 376, 378, six booms 380, 384, six resilient members 382, 386 and three boom connectors 379.

It should be noted that the terms "first" and "second" are used for convenience to describe the subassemblies 376, 378, the booms 380, 384 and the resilient members 382, 386 of the resilient subassemblies 368, 370, 372. However, the subassemblies 376, 378, the booms 380, 384 and the resilient members 382, 386 of any of the resilient assemblies 368, 370, 372 can alternatively be referred to as a "third", "fourth", "fifth" or "sixth" subassembly, boom or resilient member. For example, the subassemblies, booms and resilient members of the first resilient assembly 368 can be referred to as the "first" and "second" subassemblies, booms and resilient members, while the booms and resilient members of the second resilient subassembly 1270 can be referred to as the "third" and "fourth" subassemblies, booms and resilient members, and the subassemblies, booms and resilient members of the third resilient subassembly 372 can be referred to as the "fifth" and "six" subassemblies, booms and resilient members.

The first boom 380 is a rigid beam that includes (i) a boom proximal end 380A that is pivotably connected to the first guide 364B of the first mount 364 with the pivot pin 364F that extends through boom apertures near the boom proximal end 380A, and (ii) a boom distal end 380B that is pivotably connected to the first resilient member 382 and the boom connector 379 with a pin 380C that extends through boom apertures (not shown) located near the boom distal end 380B. The first resilient member 382 includes (i) a member proximal end 382A that is secured to the second guide 364C of the first mount 364 with the pivot pin 364F, and a member distal end 382B that is connected to the boom distal end 380B with the pin 380C.

Somewhat similarly, the second boom 384 is a rigid beam that includes (i) a boom proximal end 384A that is pivotably connected to the lower attachment ring 366B of the second mount 366 with the pivot pin 366E that extends through boom apertures near the boom proximal end 384A, and (ii) a boom distal end 384B that is pivotably connected to the second resilient member 386 and the boom connector 379 with a pin 384C that extends through boom apertures 384C located near the boom distal end 384B. The second resilient member 386 includes (i) a member proximal end 386A that is secured to the upper attachment ring 366A of the second mount 366 with the pin 366E, and a member distal end 386B that is connected to the boom distal end 384B with the pin 384C.

The boom connector 379 mechanically physically connects the boom distal end 380B of the first boom 380 to the boom distal end 384B of the second boom 384 so that the distal ends of the booms 380, 384 move concurrently. Moreover, the boom connector 379 mechanically connects and couples (i) the first boom 380 to the second mount 366 and the second boom 384 to the first mount 364. In one embodiment, the boom connector 379 extends substantially parallel to the movement axis 374. In this embodiment, the boom connector 379 is a rigid beam that includes an upper end that is pivotable connected to the first boom 380 with the pin 380C and a distal end that is pivotable connected to the second boom 384 with the pin 384C.

In an alternative embodiment, the connectors disclosed herein can be a monolithic flexure.

In one embodiment, each resilient member 382, 386 functions and has characteristics similar to a zero length spring over an operational range of the respective resilient member 382, 386. For example, in one embodiment, each resilient member 382, 386 is a zero length spring. A zero-length spring is a spring that exerts a force that is proportional to its length. In other words, the amount by which it has been stretched is its entire length. Such a spring would exert zero force if it were able to relax to zero-length. In practice, often zero-length springs are springs that are preloaded such that their coils touch when there is no force exerted on them and a finite force is required to begin to move the coils apart. The amount of preload is calibrated to shift the force-displacement curve so that it has a virtual crossing at the origin and exerts a force equal to the spring length. A zero length can be made by combining a spring with negative length (in which the coils press together when the spring is relaxed) with an extra length of inelastic material. The size of the zero length spring can be varied to achieve the force requirements of the system.

In another embodiment, one or both of the resilient members 382, 386 can be a fluid type piston assembly.

As used herein, the term "operational range" means the range required to isolate the suspended assembly 44 and accommodate the amplitude of the vibrations from a seismic excitation such as an earthquake. In alternative, non-exclusive embodiments, the operational range can be approximately one, two, five, ten, fifteen, twenty, or thirty centimeters.

Additionally, each of the subassemblies 376, 378 can include a rigid stabilization beam 388 and a rigid mount support beam 390. In this embodiment, the stabilization beam 388 is pivotable connected between one of the mounts 364, 366 and the boom connector 379 and provides another connection between the respective mount 364, 366 and the boom connector 379. With this design, the stabilization beam 388 maintains the boom connector 379 in the proper orientation.

Further, the rigid mount support beam 390 of the first subassembly 376 extends between and fixedly connects the first guide 364B to the second guide 364C, and the rigid mount support beam 390 of the second subassembly 378 extends between and fixedly connects the second mount supports 366C together.

In certain embodiments, for each of the subassemblies 376, 378, the stabilization beam 388, the mount support beam 390, the boom 380, 384 and one half of the boom connector 379 cooperate to form a generally rectangular shaped, four bar linkage. Further, the resilient member 382, 386 extends diagonally across the rectangular shape.

In one embodiment, each of the subassemblies 376, 378 defines a LaCoste type system, and thus each of the resilient assemblies 368, 370, 372 defines two LaCoste type suspension system that operate in series to inhibit the transfer of motion between the mounts 364, 366. Stated in another fashion, the suspension 296 in this embodiment is a monopod that defines six LaCoste type suspensions that provide approximately zero-stiffness. Thus, multiple monopod suspensions 296, each including a plurality of LaCoste type subassemblies 376, 378 can be utilized to concurrently support the suspended assembly 44 (illustrated in FIG. 1). The LaCoste based monopod suspensions 296 provide the required vertical force to support the load without adding any stiffness and does so in a practical compact module that is easy to incorporate into the construction of a platform, a pedestal, or a clean room floor. Stated in another fashion, the suspension 296 illustrated in FIGS. 3A-3D will have zero stiffness and will exert a constant vertical force equal to the weight of the attenuated pedestal 14 regardless of the motions of the pedestal 14.

In the embodiment illustrated in FIGS. 3A, 3C, and 3D, the second subassembly 378 is a mirror image of the first subassembly 376. The mirrored LaCoste type suspensions can be used to take out parasitic horizontal motion. Stated in another fashion, the subassemblies 376, 378 are mounted in series in a radially outward and then radially inward stage. This is done to cancel out the parasitic motion of the LaCoste suspensions in the radial direction.

It should be noted that each monopod suspension 296 is a modular component that can be placed underneath the suspended assembly 44. Further, it should be noted that the number of suspensions 296 in the suspension systems 16, 216A, 216B (illustrated in FIGS. 1, 2A, 2B) required to support the suspended assembly 44 (illustrated in FIG. 1) will depend upon the characteristics of the suspended assembly 44 and the characteristics of the suspensions 296. For heavier suspended assemblies 44, a larger number of monopod suspensions 296 can be used, or alternatively the height of the pivots of the booms 380, 384 can be changed to change its exerted vertical force. In alternative, non-exclusive embodiments, the suspension system 16, 216A, 216B can include approximately 10, 20, 30, or 50 spaced apart suspensions 296.

FIGS. 3E-3G are side views of a portion of the suspension 296 of FIG. 3A in alternative positions. More specifically, FIG. 3E illustrates the suspension 296 in a first position 392, FIG. 3F illustrates the suspension 296 in a second position 394 that is retracted from the first position 392, and FIG. 3G illustrates the suspension 296 in a third position 396 that is expanded from the first position 392. These Figures illustrate how the mounts 364, 366 can move relative to each other and the first resilient assembly 368 moves to inhibit the transfer of vibration. It should be noted that any of the positions 392, 394, 396 can be considered the neutral position.

Figure 3H:
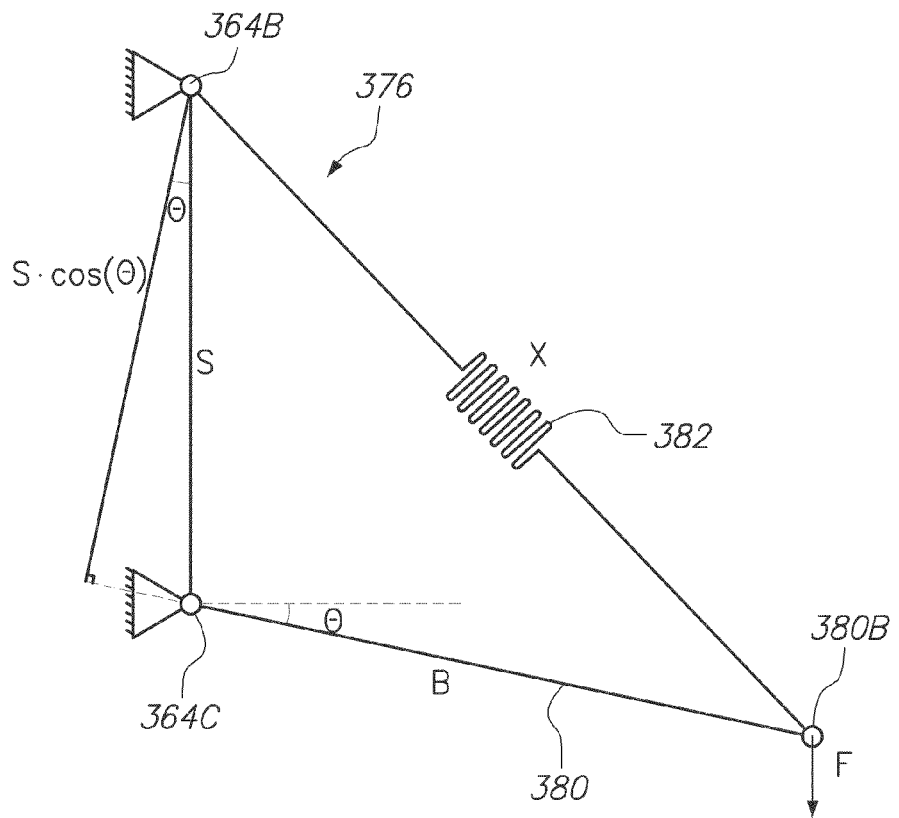
FIG. 3H is a simplified schematic view of a LaCoste type suspension.

FIG. 3H is a simplified schematic view of a LaCoste type system that is functionally equivalent the first subassembly 376 and the second subassembly 378 described above. In this Figure, the components are labeled as the first subassembly 376. Further, in this Figure, (i) x represents a length of the resilient member 382 (i.e. the zero-length spring); (ii) s represents a vertical separation distance of the anchor points (e.g. the distance between the first guide 364B and the second guide 364C) for the boom 380 and the resilient member 382; (iii) F is the force on the boom distal end 380B; (iv) B represents the length of the boom 380; (v) k is the spring constant for the resilient member 382; and (v) θ is the angle of the boom 380 relative to a horizontal axis.

Equation 1 represents the sum of moments about the boom anchor 364C:

$$F \cdot B\cos(\theta) = kx \cdot \left(\frac{s\cos(\theta)}{x}\right) \cdot B \quad \text{Equation 1}$$

Using algebra, Equation 1 can be simplified to result in Equation 2:

$$F = ks \quad \text{Equation 2}$$

In this design, separation distance s between the anchor points 364B, 364C is fixed but can be adjusted for different loads. The force F is independent of the vertical position of the load hence zero-stiffness.

Figure 4:
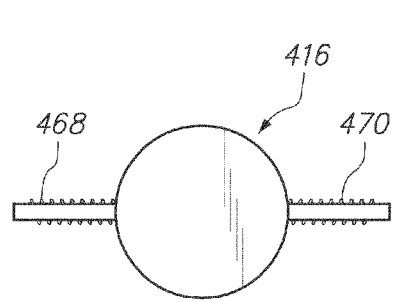
FIG. 4 is a top view of another embodiment of a suspension having features of the present invention.

FIG. 4 is a top view of another embodiment of a suspension 416 that is similar to the suspension 296 illustrated in FIGS. 3A-3D and described above. However, in this embodiment, the suspension 416 includes only two equally spaced (symmetrically oriented) resilient assemblies 468, 470. These resilient assemblies 468, 470 are similar to the resilient assemblies 368, 370, 372 illustrated in FIGS. 3A-3D and described above. Thus, in this embodiment, each resilient assembly 468, 470 includes two subassemblies 376, 378 (not shown in FIG. 4).

Figure 5:
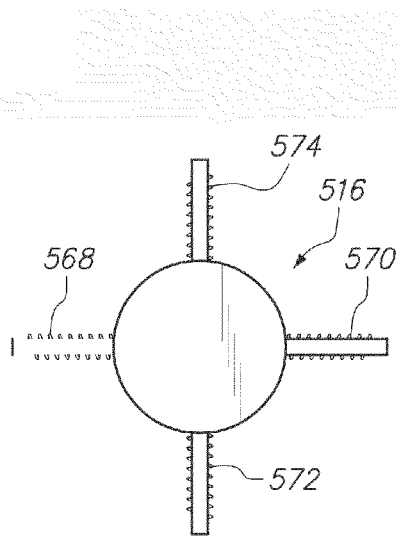
FIG. 5 is a top view of yet another embodiment of a suspension having features of the present invention.

FIG. 5 is a top view of another embodiment of a suspension 516 that is similar to the suspension 296 illustrated in FIGS. 3A-3D and described above. However, in this embodiment, the suspension 516 includes four equally spaced (symmetrically oriented) resilient assemblies 568, 570, 572, 574. These resilient assemblies 568, 570, 572, 574 are similar to the resilient assemblies 368, 370, 372 illustrated in FIGS. 3A-3D and described above. Thus, in this embodiment, each resilient assembly 568, 570, 572, 574 includes two subassemblies 376, 378 (not shown in FIG. 5).

Figure 6:
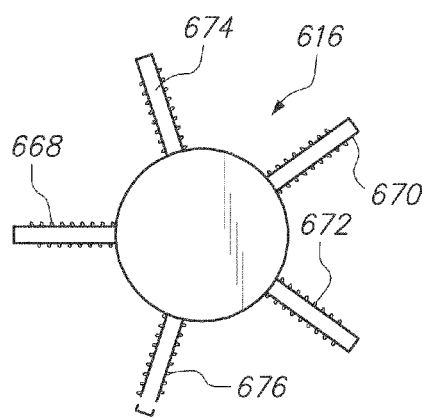
FIG. 6 is a top view of still another embodiment of a suspension having features of the present invention.

FIG. 6 is a top view of another embodiment of a suspension 616 that is similar to the suspension 296 illustrated in FIGS. 3A-3D and described above. However, in this embodiment, the suspension 616 includes five equally spaced (symmetrically oriented) resilient assemblies 668, 670, 672, 674, 676. These resilient assemblies 668, 670, 672, 674, 676 are similar to the resilient assemblies 368, 370, 372 illustrated in FIGS. 3A-3D and described above. Thus, in this embodiment, each resilient assembly 668, 670, 672, 674, 676 includes two subassemblies 376, 378 (not shown in FIG. 6).

Figure 7:
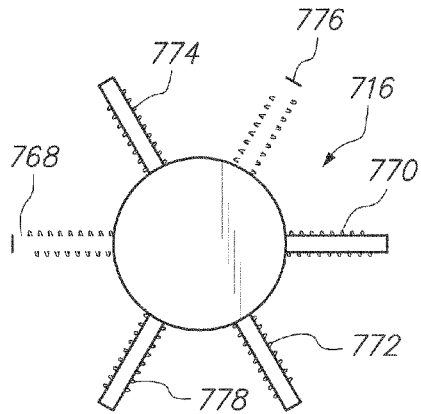
FIG. 7 is a top view of another embodiment of a suspension having features of the present invention.

FIG. 7 is a top view of another embodiment of a suspension 716 that is similar to the suspension 296 illustrated in FIGS. 3A-3D and described above. However, in this embodiment, the suspension 716 includes six equally spaced (symmetrically oriented) resilient assemblies 768, 770, 772, 774, 776, 778. These resilient assemblies 768, 770, 772, 774, 776, 778 are similar to the resilient assemblies 368, 370, 372 illustrated in FIGS. 3A-3D and described above. Thus, in this embodiment, each resilient assembly 768, 770, 772, 774, 776, 778 includes two subassemblies 376, 378 (not shown in FIG. 7).

Figure 8:
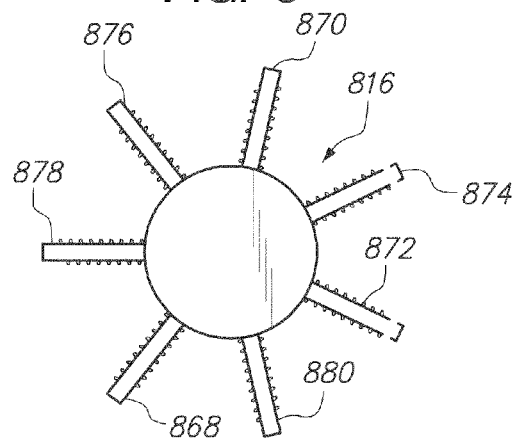
FIG. 8 is a top view of yet another embodiment of a suspension having features of the present invention.

FIG. 8 is a top view of another embodiment of a suspension 816 that is similar to the suspension 296 illustrated in FIGS. 3A-3D and described above. However, in this embodiment, the suspension 816 includes seven equally spaced (symmetrically oriented) resilient assemblies 868, 870, 872, 874, 876, 878, 880. These resilient assemblies 868, 870, 872, 874, 876, 878, 880 are similar to the resilient assemblies 368, 370, 372 illustrated in FIGS. 3A-3D and described above. Thus, in this embodiment, each resilient assembly 868, 870, 872, 874, 876, 878, 880 includes two subassemblies 376, 378 (not shown in FIG. 8).

Figure 9:
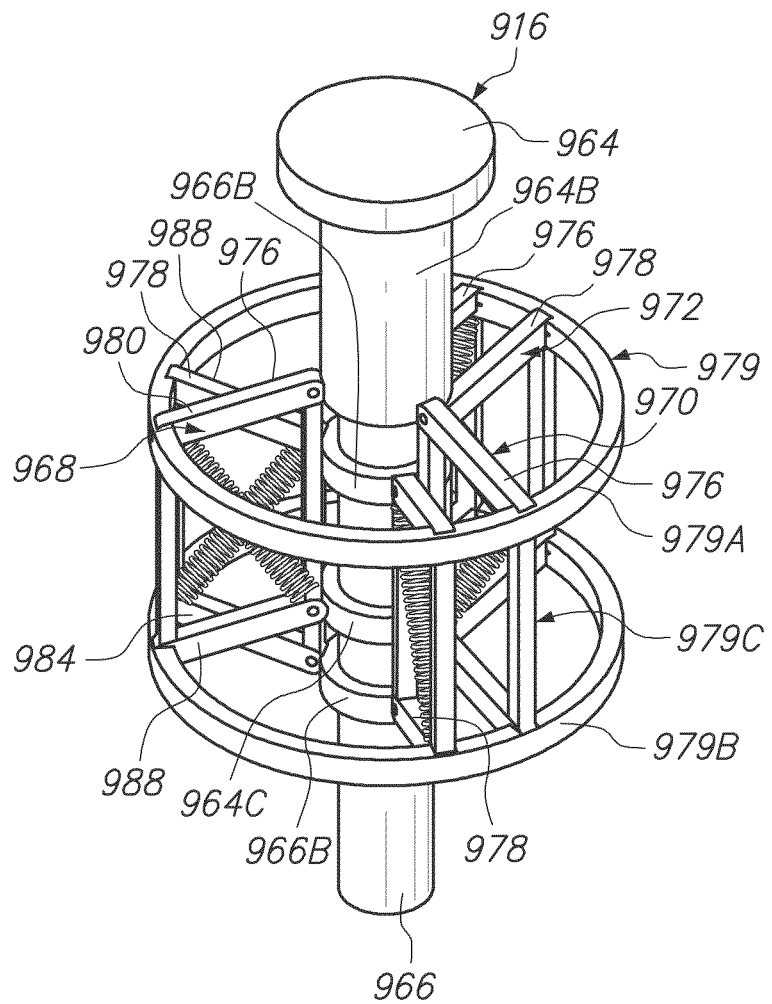
FIG. 9 is a perspective view of still another embodiment of a suspension having features of the present invention.

FIG. 9 is a perspective view of still another embodiment of a suspension 916 that includes three spaced apart resilient assemblies 968, 970, 972 that is similar to the suspension 296 illustrated in FIGS. 3A-3D and described above. More specifically, in this embodiment, each of the resilient assemblies 968, 970, 972 also includes two subassemblies 976, 978 that operate in series. However, in this embodiment, the subassemblies 976, 978 are positioned substantially side-by-side (next to each other) instead of being vertically stacked. In this embodiment, the mirrored LaCoste subassemblies 976, 978 are placed in parallel to save space and reduce the stack height of the substantially constant force monopod suspensions 916.

In this embodiment, the first subassemblies 976 are again attached to the first guide 964B and the second guide 964C of the first mount 964, and the second subassemblies 978 are again attached to the attachment rings 966B of the second mount 966. Further, in this embodiment, the boom connector 979 again connects the subassemblies 976, 978 together. As a result thereof, the subassemblies 976, 978 inhibit the transfer of motion between the mounts 964, 966.

In FIG. 9, the boom connector 979 includes a pair of spaced apart annular shaped, connector rings 979A, 979B and a plurality of connector beams 979C. More specifically, in this embodiment, (i) the upper connector ring 979A mechanically connects the first booms 980 of the first subassemblies 976 and the stabilization beams 988 of the second subassemblies 978 together, (ii) the lower connector ring 979B mechanically connects the second booms 984 of the second subassemblies 978 and the stabilization beams 988 of the first subassemblies 976 together, and (iii) the connector beams 979C mechanically connect the connector rings 979A, 979B together. In this embodiment, the rings 979A, 979B cooperate to (i) connect the stabilation beams 988 of first assemblies 976 in series to the stabilization beams 988 of the second assemblies 978 and (ii) connect the booms 980 of the first assemblies 976 in series to the booms 980 of the second assemblies 978.

In this embodiment, the series sets of suspensions can consist of radially outward and radially inward pairs but need not be in multiple of pairs. For example, three LaCoste subassemblies 976 can be mounted in series in a radially outward stage, and then three LaCoste subassemblies 978 can be mounted in series to the first series in a radially inward stage. Radially outward and radially inward series suspension pairs can be a preferred configuration as the kinematics insures that all LaCoste subassemblies 976, 978 stretch the same amount.

In all of the previous embodiments, the LaCoste subassemblies are fixed on the outside of the mounts, extend radially outward in one stage, and extend radially inward in the second stage. In an alternate embodiment, the LaCoste subassemblies can be fixed on the inside of tubular mounts, extend radially inward from the mounts, and then extend outward in the second stage.

Figure 10:
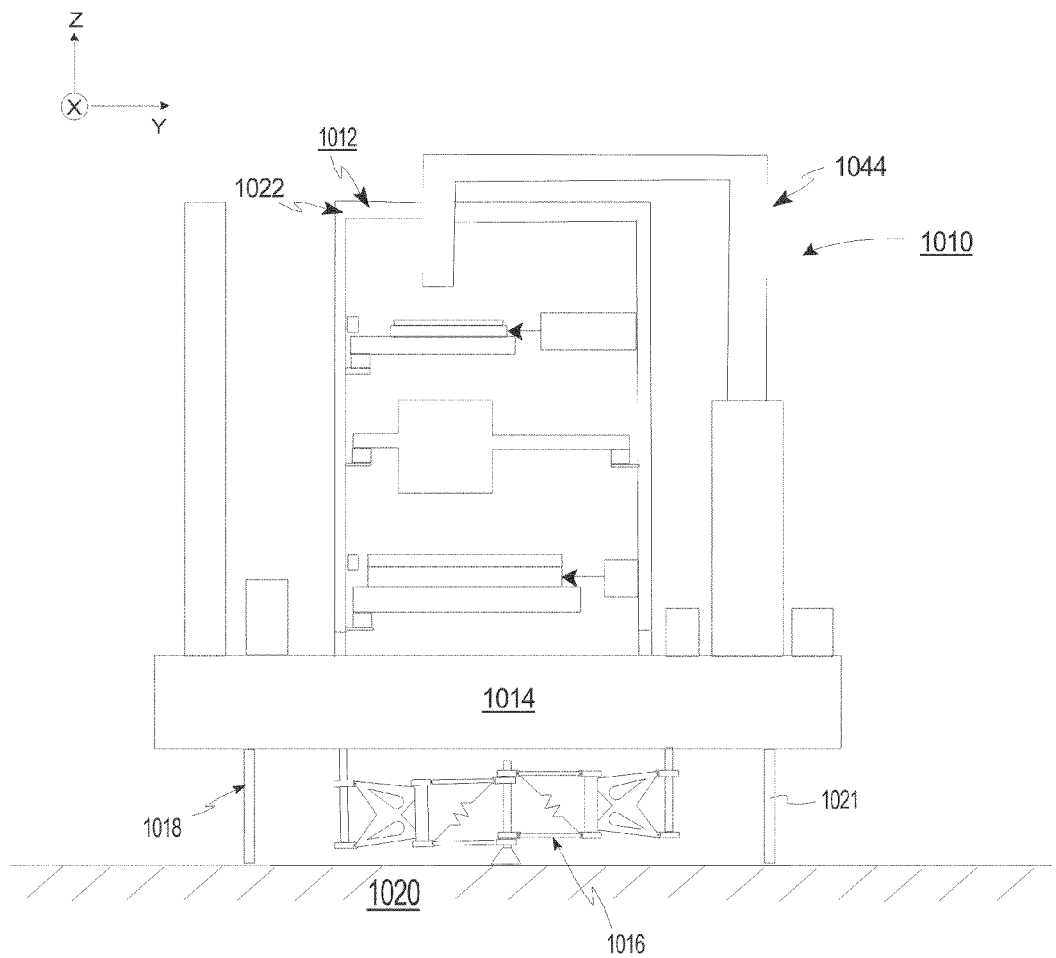
FIG. 10 is a simplified schematic illustration of a precision assembly having features of the present invention.

FIG. 10 is a schematic illustration of another embodiment of a precision assembly 1010 that includes a precision manufacturing apparatus 1012, a pedestal 1014 that retains the components of the precision manufacturing apparatus 1012, and a mechanism (also sometimes referred to as a "suspension") 1016 that supports the pedestal 1014 and the precision manufacturing apparatus 1012. In this embodiment, the precision manufacturing apparatus 1012 is an exposure apparatus 1022 that similar exposure apparatus 10 illustrated in FIG. 1 and described above. Moreover, the pedestal 1014 is similar in design to the pedestal 14 illustrated in FIG. 1 and described above.

In this embodiment, the mechanism 1016 includes a one or more combination LaCoste type systems and garden gate mechanisms that support and isolate the pedestal 1014 and the precision manufacturing apparatus 1012 during a seismic disturbance. The mechanism 1016 can be designed to have approximately zero stiffness along a first axis, along a second axis, and along a third axis, and exert a substantially constant force on the pedestal 1014 regardless of the motions of the pedestal 1014. Stated in another fashion, the mechanism 1016 provides earthquake attenuation in the vertical direction and both horizontal directions, and attenuation is achieved in all three degrees of translational freedom. As a result thereof, the components of the precision manufacturing apparatus 1012 are better protected by the mechanism 1016 during the seismic disturbance. This reduces the likelihood of damage and misalignment of the components of the precision manufacturing apparatus 1012 during the seismic disturbance.

Additionally, the precision manufacturing apparatus 1012 can also include one or more locking assemblies 1018 (only one is illustrated as a box) that selectively lock the pedestal 1014 to a mounting base 1020 when a seismic disturbance is not occurring. With this design, the locking assembly 1018 fixedly retains the precision manufacturing apparatus 12 during normal operation of the precision manufacturing apparatus 12, and the locking assembly 18 can quickly release the precision manufacturing apparatus 12 so that the mechanism 16 can inhibit the transfer of vibration from the mounting base 20 to the precision manufacturing apparatus 12 to protect the precision manufacturing apparatus 12.

Further, the precision manufacturing apparatus 1012 can optionally include a mover assembly 1021 (illustrated as a box) having one or more actuators that can be used to selectively reset the position of the pedestal 1014 relative to the mounting base 1020 after a seismic disturbance.

In this embodiment, the pedestal 1014, and the exposure apparatus 1022 are collectively referred to herein as a suspended assembly 1044.

The mechanism 1016 isolates the suspended assembly 1044 during a seismic disturbance to protect the components of the suspended assembly 1044. Stated in another fashion, the mechanism 1016 inhibits vibration from the mounting base 1020 from being transferred to the suspended assembly 1044 during the earthquake. Thus, the mechanism 1016 reduces the accelerations and motions of suspended assembly 1044 during the earthquake.

In certain embodiments, in order to attenuate vertical motions of an earthquake, the weight of the suspended assembly 1044 must be suspended or floated so that the mounting base 1020 can move relative to the suspended assembly 1044. In one embodiment, the mechanism 1016 is relatively soft and the suspended assembly 1044 is relatively heavy. As a result thereof, the suspended assembly 1044 will have a relatively low resonance frequency. In one embodiment, the mechanism 1016 can be designed to have approximately zero stiffness, and to exert a constant vertical force equal to the weight of the suspended assembly 1044 regardless of the motions of the suspended assembly 1044.

In FIG. 10, the mechanism 1016 inhibits movement of the mounting base 1020 along the Z axis, along the X axis, and along the Y axis from being transferred to the pedestal 1014 and the suspended assembly 1044. With this design, the mechanism 16 attenuates vibration with three degrees of freedom. Suitable mechanisms 16 are described in more detail below.

In certain embodiments, a soft spring system (not shown in FIG. 10) can be used in parallel with the mechanism 1016 to tune machine dynamics if a slight positive stiffness is desired.

It should be noted that the mechanisms 1016 can be used in other assembly designs. For example, the mechanisms 1016 can be used in a multiple pedestal 214A arrangement (as illustrated in FIG. 2A) instead of the suspensions 16A, or a unified multiple level, unified pedestal 214B arrangement (as illustrated in FIG. 2B) instead of the suspensions 16A.

Figure 11:
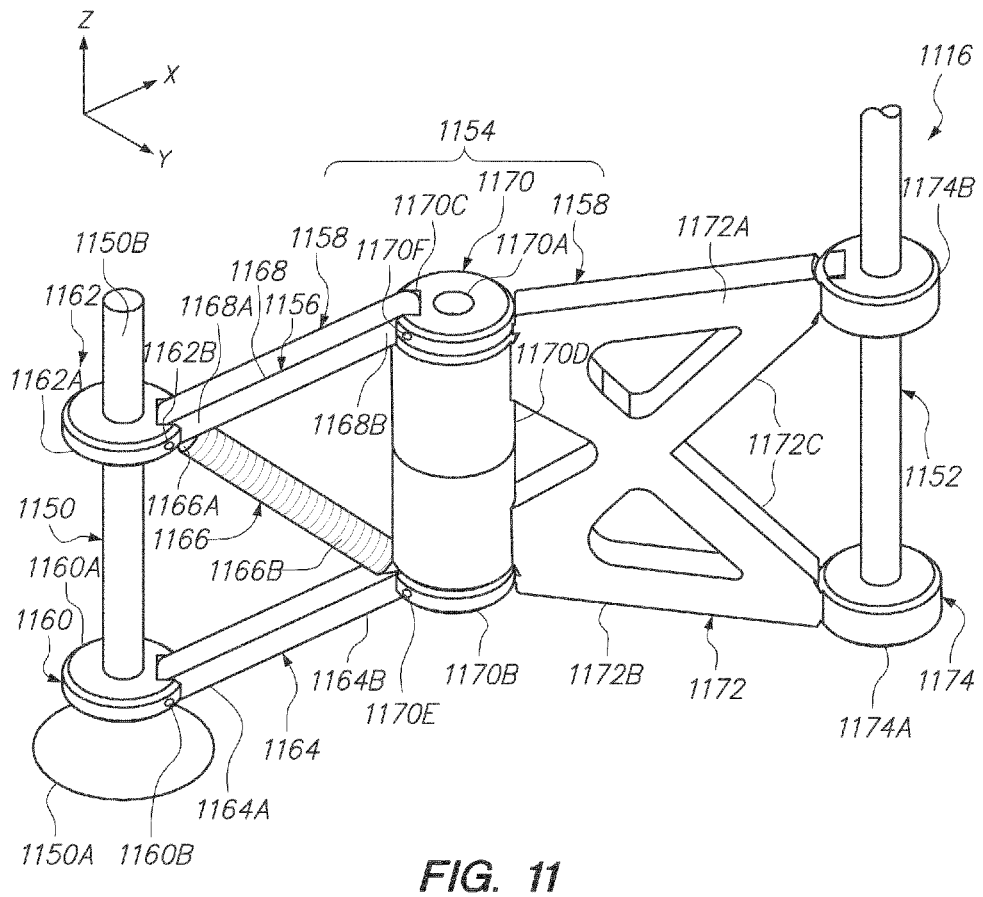
FIG. 11 is a perspective view of a mechanism including a suspension assembly, a mount and a support having features of the present invention.

FIG. 11 is a perspective view of one embodiment of a unit 1116 that can be used as a mechanism 1016 (illustrated in FIG. 10) or portion thereof. In this embodiment, the unit 1116 includes a mount 1150, a support 1152, and a suspension assembly 1154 that cooperate to inhibit the transfer of motion between objects in the precision assemblies 1010, 210A, 210B illustrated in FIGS. 10, 2A, 2B or another type of precision assembly. The design, shape, and size of these components can be varied to suit the design requirements of the rest of the precision assembly 1010.

The mount 1150 is rigid and is fixed secured to the first object (e.g. the mounting base 1020 illustrated in FIG. 10). In FIG. 11, the mount 1150 includes a mount base 1150A that is fixedly secured to the first object, and a mount beam 1150B that extends and cantilevers upward along the Z axis away from the mount base 1150A. For example, the mount base 1150A can be generally disk shaped, and the mount beam 1150 can be generally cylindrical beam shaped. Alternatively, these components can have a different configuration than that illustrated in FIG. 11.

The support 1152 is rigid and includes a distal end that is fixed secured to the second object (e.g. the pedestal 1014 illustrated in FIG. 10). In FIG. 11, the support 1152 is generally cylindrical beam shaped. Alternatively, the support 1152 can have a different configuration than that illustrated in FIG. 11.

The suspension assembly 1154 extends between the mount 1150 and the support 1152, and the suspension assembly 1154 defines at least one LaCoste type system 1156 and at least one garden gate type assembly 1158 that are connected in series. In the embodiment illustrated in FIG. 11, the suspension assembly 1154 defines a single LaCoste type system 1156, and a pair of garden gate type assemblies 1158. In this embodiment, (i) the LaCoste type system 1156 has approximately zero stiffness along a first axis (e.g. up and down along the Z axis in FIG. 11) and exerts an approximately constant vertical force on the pedestal, and (ii) the garden gate type assembly 1158 has approximately zero stiffness along a second axis (e.g. along the X axis in FIG. 11), and along a third axis (e.g. along the Y axis in FIG. 11), and allows unrestricted relative horizontal motion between the pedestal 1014 and the mounting base 1020. Further, the LaCoste type system 1156 and one of the garden gate type assemblies 1158 are connected in series so that the garden gate type assemblies 1158 transmits the vertical force of the LaCoste type system 1156 to the pedestal 1014.

In FIG. 11, the suspension assembly 1154 includes (i) a boom attacher 1160, (ii) a beam attacher 1162 that is spaced apart and positioned above the boom attacher 1160, (iii) a suspension boom 1164, (iv) a resilient assembly 1166, (v) a stabilization beam 1168, (vi) a connector assembly 1170, (vii) a gate frame 1172, and (viii) a gate attacher 1174. Alternatively, the suspension assembly 1154 can designed with more or fewer components than are illustrated in FIG. 11.

The boom attacher 1160 pivotable attaches the suspension boom 1164 to the mount 1150 and the beam attacher 1162 pivotable attaches the stabilization beam 1168 to the mount 1150. In this embodiment, (i) the boom attacher 1160 includes a generally tubular shaped attachment ring 1160A that encircles the mount beam 1150B, and a pin 1160B that extends through an aperture (not shown) in the ring 1160A and the boom 1164 to mechanically and pivotable connect the boom 1164 to the mount beam 1150B; and (ii) the beam attacher 1162 includes a generally tubular shaped attachment ring 1162A that encircles the mount beam 1150B, and a pin 1162B that extends through an aperture (not shown) in the ring 1162A and the beam 1168 to mechanically and pivotable connect the stabilization beam 1168 to the mount beam 1150B. With this design, (i) the boom attacher 1160 connects the boom 1164 to the mount 1150 while allowing the boom 1164 to pivot about the X axis relative to the mount 1150 and cantilever away from the mount 1150, and (ii) the beam attacher 1162 connects the beam 1168 to the mount 1150 while allowing the beam 1168 to pivot about the X axis relative to the mount 1150 and cantilever away from the mount 1150.

It should be noted that the attachment rings 1160A, 1162A are shaped to complement the same of the mount beam 1150B. In FIG. 11, the mount beam 1150B is generally cylindrical shaped, and each attachment ring 1160A, 1162A is generally circular tube shaped.

Additionally, the boom attacher 1160 and the beam attacher 1162 can each be rotatable attached to the mount 1150. With this design, the attachers 1160, 1162, the boom 1164 and the beam 1168 can rotate about the Z axis relative to the mount 1150. As a result thereof, the boom 1164 and the beam 1168 can function as a garden gate type assembly 1158.

The suspension boom 1164 is a rigid beam that pivotably cantilevers away from the mount 1150, and the suspension boom 1164 includes (i) a boom proximal end 1164A that is pivotably connected to the boom attacher 1160, and (ii) a boom distal end 1164B that is pivotably connected to the connector assembly 1170 and the resilient assembly 1166.

The resilient assembly 1166 flexible connects to the boom 1164 and inhibits movement of the mount 1150 from being transferred to the support 1152. In FIG. 11, the resilient assembly 1166 is a resilient member that includes a member proximal end 1166A that is secured to the beam attacher 1162 with the pin 1162B, and a member distal end 1166B that is connected to the boom distal end 1164B.

In one embodiment, the resilient member 1166 functions and has characteristics similar to a zero length spring over an operational range of the respective resilient member. For example, in one embodiment, the resilient member 1166 is a zero length spring. A zero-length spring is a spring that exerts a force that is proportional to its length. In other words, the amount by which it has been stretched is its entire length. Such a spring would exert zero force if it were able to relax to zero-length. In practice, often zero-length springs are springs that are preloaded such that their coils touch when there is no force exerted on them and a finite force is required to begin to move the coils apart. The amount of preload is calibrated to shift the force-displacement curve so that it has a virtual crossing at the origin and exerts a force equal to the spring length. A zero length can be made by combining a spring with negative length (in which the coils press together when the spring is relaxed) with an extra length of inelastic material. The size of the zero length spring can be varied to achieve the force requirements of the system.

In another embodiment, the resilient member can be a fluid type piston assembly (not shown).

As used herein, the term "operational range" means the range required to isolate the suspended assembly 1044 (illustrated in FIG. 10) and accommodate the amplitude of the vibrations from a seismic excitation such as an earthquake. In alternative, non-exclusive embodiments, the operational range can be approximately one, two, five, ten, fifteen, twenty, or thirty centimeters.

The stabilization beam 1168 is a rigid beam that pivotably cantilevers away from the mount 1150, extends between the mount 1150 and the connector assembly 1170, and provides another connection between the mount 1150 and the connector assembly 1170. With this design, the stabilization beam 1168 maintains the connector assembly 1170 in the proper orientation. In FIG. 11, the stabilization beam 1168 includes (i) a beam proximal end 1168A that is pivotably connected to the beam attacher 1162, and (ii) a beam distal end 1168B that is pivotably connected to the connector assembly 1170.

In certain embodiments, the mount 1150, the suspension boom 1164, the connector assembly 1170, and the stabilization beam 1168 cooperate to form a generally rectangular shaped, four tar linkage. Further, the resilient member 1166 extends diagonally across the rectangular shape.

The connector assembly 1170 hingeable (about the Z axis) connects the boom 1164 and the beam 1168 to the gate frame 1172. In one embodiment, the connector assembly 1170 includes a connector beam 1170A, a boom connector 1170B, a beam connector 1170C, and a gate connector 1170D that is positioned between the boom connector 1170B and the beam connector 1170C. In this embodiment, (i) the connector beam 1170A is a cylindrical rod, (ii) the boom connector 1170B is fixedly attached to the bottom of the connector beam 1170A, (iii) the beam connector 1170C is fixedly attached to the top of the connector beam 1170B, and (iv) the gate connector 1170D is a tube that is positioned over the connector beam 1170A and that rotates relative to the connector beam 1170A about the Z axis.

Further, the boom connector 1170B includes a boom pin 1170E that pivotable connects boom 1164 to the connector assembly 1170 and a beam pin 1170F that pivotable connects the beam 1168 to the connector assembly 1170. With this design, the connector assembly 1170 can move up and down along the Z axis relative to the mount 1150. Moreover, the gate connector 1170D is fixedly secured to the gate frame 1172 to allow the gate frame 1172 to pivot about the Z axis relative to the LaCoste type system 1156.

The gate frame 1172 is rigid and extends between the connector assembly 1170 and the support 1152 and mechanically connects the LaCoste type system 1156 to the support 1152. In one non-exclusive embodiment, the gate frame 1172 includes a top member 1172A, a bottom member 1172B, and a pair of cross members 1172C that extend diagonally between the top member 1172A and the bottom member 1172B. In this embodiment, a proximal end of the members 1172A-1172C is fixedly secured to the gate connector 1170D, and a distal end of the members 1172A-1172C is fixedly secured to the gate attacher 1174.

The gate attacher 1174 pivotable attaches the distal end of the gate frame 1172 to the support 1152. In one embodiment, the gate attacher 1174 includes a lower attachment ring 1174A and a spaced apart upper attachment ring 1174B that are fixedly secured to the distal end of the gate frame 1172 and that encircle the support 1152. With this design, the gate attacher 1174 allows the gate frame 1172 to rotate about the Z axis relative to the support 1152.

It should be noted that it is possible to reverse the order of the LaCoste type system 1156 and the garden gate type assembly 1158.

Figure 12:
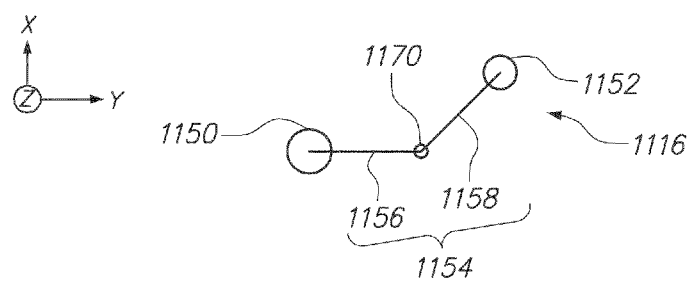
FIG. 12 is a simplified top view of the mechanism of FIG. 11.

FIG. 12 is a simplified top view of the unit 1116 including the mount 1150, the support 1152, and the suspension assembly 1154 including the LaCoste type system 1156, the garden gate type assembly 1158, and the connector assembly 1170. In this embodiment, (i) the suspension assembly 1154 pivots about the Z axis relative to the mount 1150, (ii) the LaCoste type system 1156 and the garden gate type assembly 1158 pivot relative to each other about the Z axis, and (iii) the suspension assembly 1154 pivots about the Z axis relative to the support 1152.

Figure 13A:
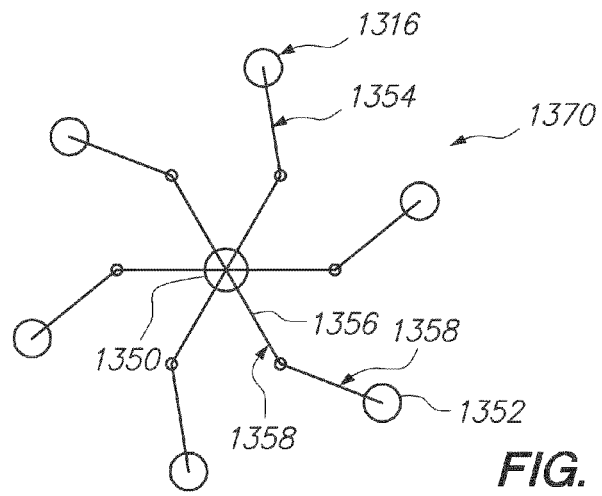
FIG. 13A is a simplified top view of a mechanism including a plurality of suspension assemblies.

FIG. 13A is a simplified top illustration of a plurality of units 1296 that have been combined to form a mechanism 1370 that is referred to herein as a cell. In this embodiment, each unit 1296 includes a suspension assembly 1354 having one LaCoste type system 1356 and two garden gate assemblies 1358, and each cell 1370 includes a plurality of units 1296 that have been interconnected to each other. Stated in another fashion, each cell 1370 includes a plurality of suspension assemblies 1354 with a shared mount 1350 that allows for a compact, zero stiffness, modular, mechanism that can easily be incorporated into many different precision assemblies 1010 (illustrated in FIG. 10). Alternatively, the cell 1370 could be designed to share a common support 1352.

In the embodiment illustrated in FIG. 13A, the cell 1370 includes (i) a single, common mount 1350; (ii) six, equally spaced apart (symmetrically oriented), suspension assemblies 1354 that cantilever away from the common mount 1350; and (iii) six separate supports 1352. Thus, the cell 1370 in. FIG. 13A includes six LaCoste type systems 1356 and twelve garden gate type assemblies 1358. This embodiment can be referred to as the hexagonal cell 1370. In this embodiment, the common mount 1350 can be connected to the first object (not shown in FIG. 13A), the plurality of spaced apart supports 1352 can be connected to the second object (not shown in FIG. 13A), and each of suspension assemblies 1354 connects one of the supports 1352 to the common mount 1350. Moreover, with this design, the multiple suspension assemblies 1354 act in parallel.

Additionally, in this embodiment, the mount 1350, each support 1352, and each suspension assembly 1354 can be similar in design to corresponding components described above and illustrated in FIG. 11.

It should be noted that (i) for embodiments with multiple mounts 1350 (see FIG. 14A), any of the mounts 1350 can be referred to as the "first", "second", "third", "fourth", "fifth", or "sixth" mount 1350; (ii) for embodiments with multiple supports 1352, any of the supports 1352 can be referred to as the "first", "second", "third", "fourth", "fifth", or "sixth" support 1352; (iii) for embodiments with multiple suspension assemblies 1354, any of the suspension assemblies 1354 can be referred to as the "first", "second", "third", "fourth", "fifth", or "sixth" suspension assembly 1354; (iv) for embodiments with multiple LaCoste type systems 1356, any of the LaCoste type systems 1356 can be referred to as the "first", "second", "third", "fourth", "fifth", or "sixth" LaCoste type system 1356; and/or (v) for embodiments with multiple garden gate type assemblies 1358, any of the garden gate type assemblies 1358 can be referred to as the "first", "second", "third", "fourth", "fifth", "sixth" . . . or "twelfth" garden gate type assembly 1358.

Figure 13B:
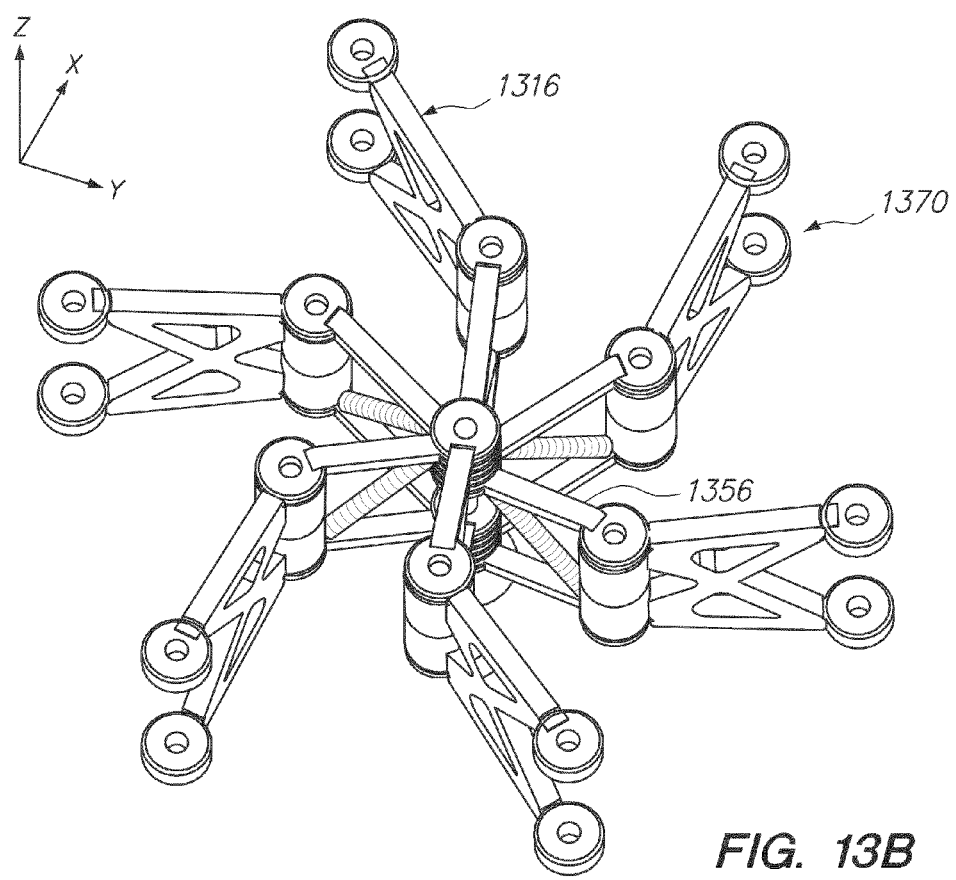
FIG. 13B is a perspective view of the mechanism of FIG. 13A.
Figure 13C:
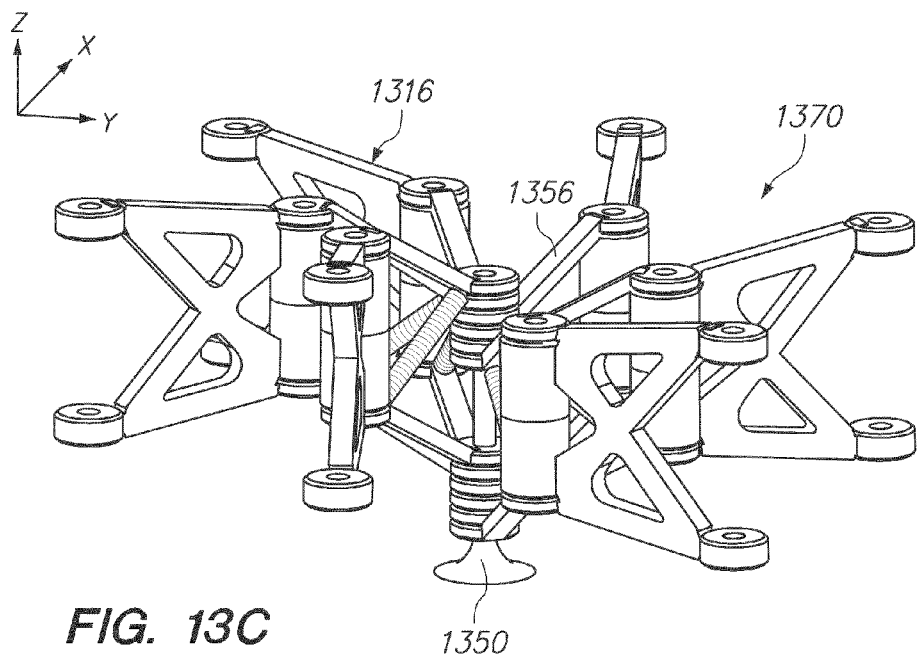
FIG. 13C is another perspective view of the mechanism of FIG. 13A.

FIGS. 13B and 13C are alternative perspective views of the hexagonal cell 1370 of FIG. 13A without the supports 1352 (illustrated in FIG. 13A). These Figures illustrate that the six LaCoste type systems 1356 of the six units 1296 are vertically stacked and offset from each other along the Z axis so that they do not interfere with each other as each of the units 1296 rotates about the Z axis relative to the common mount 1350.

Figure 14A:
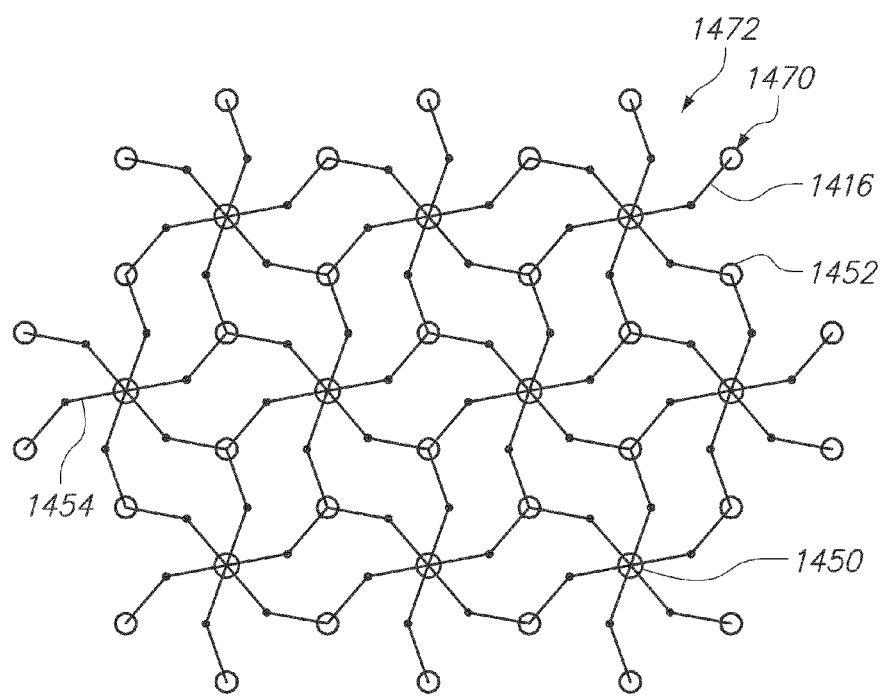
FIG. 14A is a simplified top view of another embodiment of a mechanism having features of the present invention.

FIG. 14A is a simplified top illustration of a plurality of cells 1470 that have been combined to form a mechanism 1472 that is referred to herein as a lattice. In this embodiment, each cell 1470 is a hexagonal cell (as illustrated in FIG. 13A) that includes six units 1416, and the plurality of cells 1470 have been interconnected to each other to form the lattice 1472. Stated in another fashion, each lattice 1472 includes a plurality of cells 1470 with shared support(s) 1452 that allow for a compact, zero stiffness, modular, mechanism that can easily be incorporated into many different precision assemblies 1010 (illustrated in FIG. 10). In this embodiment, the hexagonal cells 1470 are combined in the lattice 1472 that can be used underneath the pedestal 1014 (illustrated in FIG. 10).

In the non-exclusive embodiment illustrated in FIG. 14A, the lattice 1472 includes ten interconnected cells 1470. Alternatively, the lattice 1472 can be designed with greater than or fewer than ten interconnected cells 1470.

In this embodiment, the mount 1450 of each cell 1470 can be connected to the first object (not shown in FIG. 14A), the plurality of spaced apart supports 1452 can be connected to the second object (not shown in FIG. 14A), and each of suspension assemblies 1454 connects one of the supports 1452 to one of the mounts 1450. Moreover, with this design, the multiple suspension assemblies 1454 again act in parallel.

In this embodiment, the lattice 1472 is a perfect matching lattice. A perfect matching lattice 1472 means that all connections to the supports 1452 from all adjacent cells 1470 can be combined onto one support 1452. Thus, each support 1452 positioned away from the perimeter of the lattice 1472 is connected to at least two cells 1470. Stated in another fashion, in a perfect matching lattice, there are no supports 1452 in the middle of the lattice 1472 that is are connected to fewer than two cells 1470.

Additionally, in this embodiment, the mount 1450, each support 1452, and each suspension assembly 1454 can be similar in design to corresponding components described above and illustrated in FIG. 11.

It should be noted that the size, shape, number of cells 1470 of the lattice 1472 can be adjusted to fit under the footprint of the pedestal 1014 (illustrated in FIG. 10) and/or to suit the suspension requirements of the pedestal 1014. Usually, heavier loads many require a larger number of units 1416 and bigger lattices 1472. Depending on the load point concentrations, it may not be necessary for the pedestal 14 to completely contain the footprint of the lattice 1472.

Figure 14B:
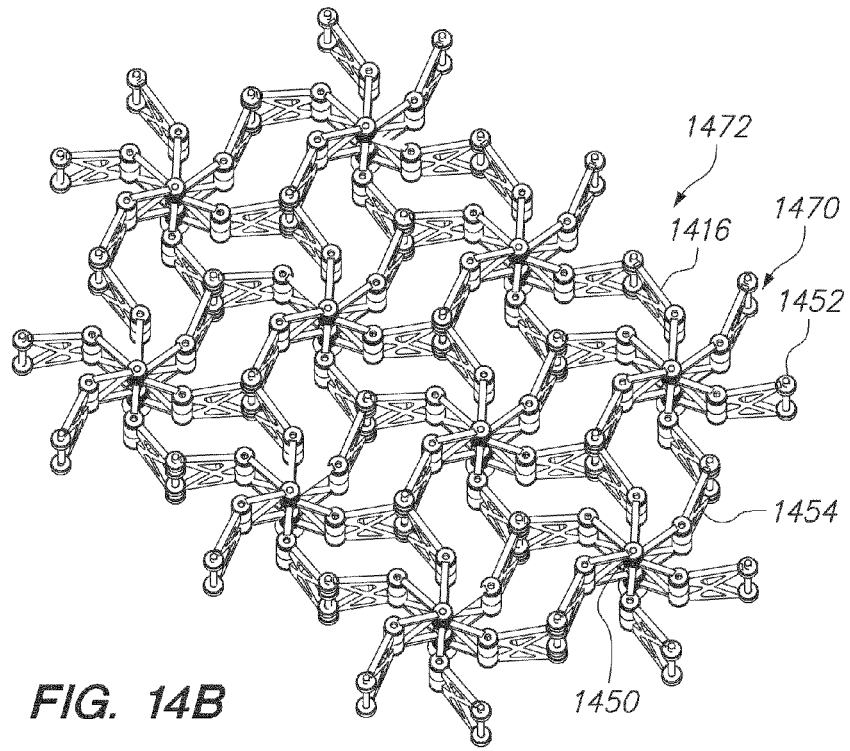
FIG. 14B is a perspective view of a portion of the mechanism of FIG. 14A.
Figure 14C:
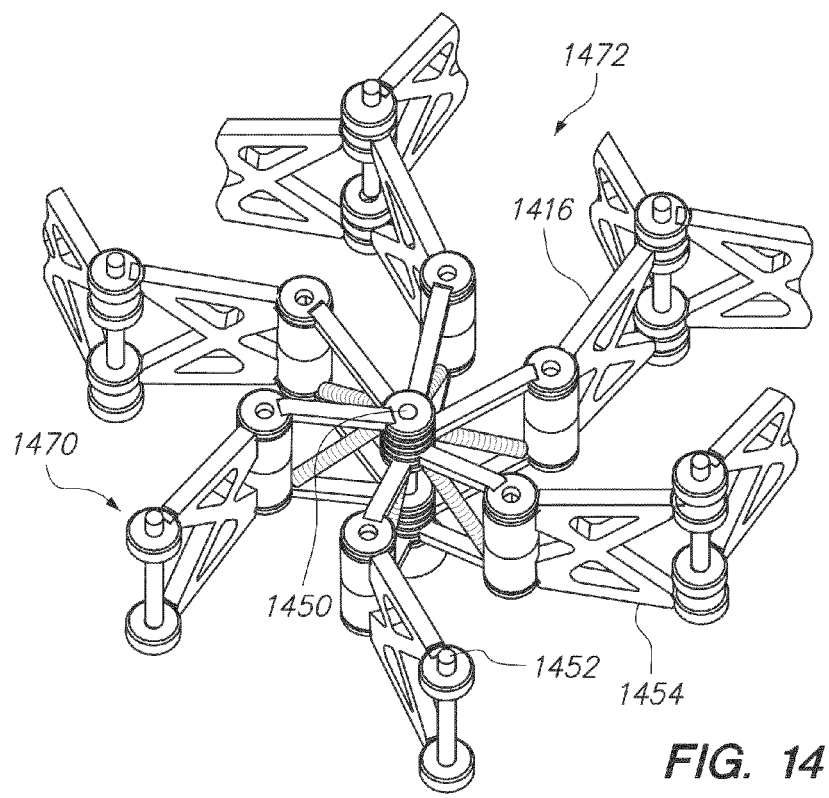
FIG. 14C is another perspective view of a portion of the mechanism of FIG. 14A.

FIGS. 14B and 14C are alternative perspective views of the lattice 1472 of FIG. 14A, or a portion thereof. It should be noted that the stacking of the cells 1470 is done in such away that even at the lattice level, none of the suspension assemblies 1454 interfere with each other. More specifically, the suspension assemblies 1454 are connected to the mounts 1450 and the supports 1452 in a vertically stacked and offset along the Z axis fashion so that the suspension assemblies 1454 do not interfere with each other during movement of the lattice 1472.

It should also be noted that in this embodiment, each support 1452 has not more than three suspension assemblies 1454 connecting to it.

Figure 15A:
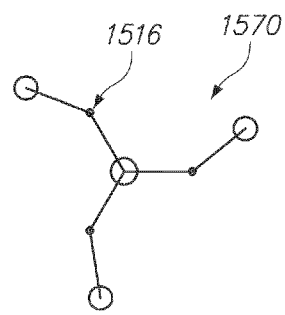
FIG. 15A is a simplified top view of a cell having a plurality of suspension assemblies.

As provided herein, other cell and lattice configurations are also possible. For example, FIG. 15A is a simplified top illustration of a cell 1570 having three units 1516 that are interconnected together to form a triangular cell 1570. In this embodiment, each of the units 1516 is similar to the unit 1116 described above and illustrated in FIG. 11.

Figure 15B:
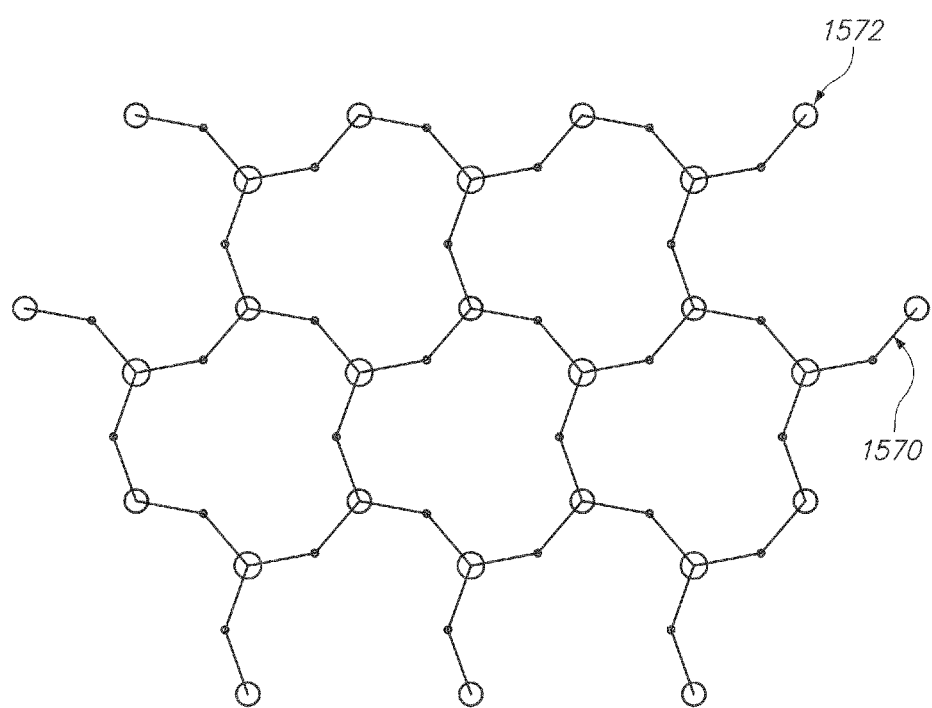
FIG. 15B is a simplified top view of a lattice that includes a plurality of cells of FIG. 15A.

FIG. 15B is a simplified top illustration of a lattice 1572 that includes a plurality of the triangular cells 1570 that are interconnected to form the lattice 1572.

Figure 16A:
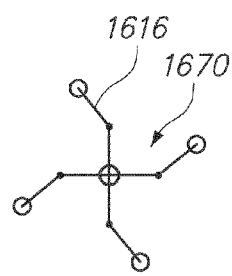
FIG. 16A is a simplified top view of yet another embodiment of a cell having a plurality of units.

FIG. 16A is a simplified top illustration of a cell 1670 having four units 1616 that are interconnected together to form a four cell 1670. In this embodiment, each of the units 1616 is similar to the unit 1116 described above and illustrated in FIG. 11.

Figure 16B:
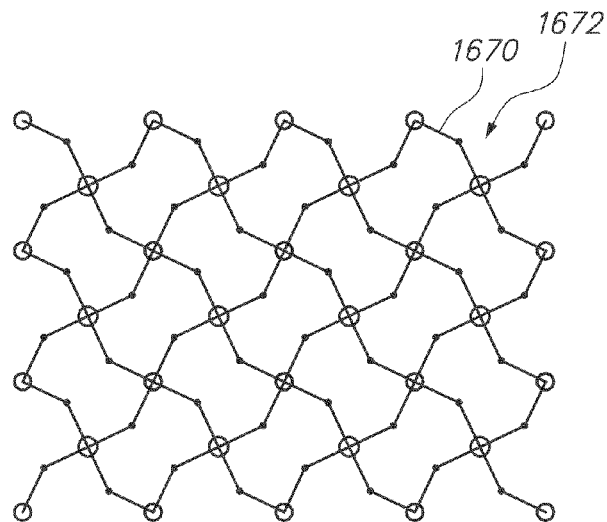
FIG. 16B is a simplified top view of a lattice that includes a plurality of cells of FIG. 16A.

FIG. 16B is a simplified top illustration of a lattice 1672 that includes a plurality of the four cells 1670 that are interconnected to form the lattice 1672. In this embodiment, the lattice 1672 is a perfect matching lattice.

Figure 17A:
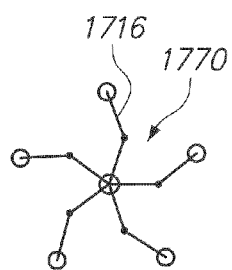
FIG. 17A is a simplified top view of still another embodiment of a cell having a plurality of units.

FIG. 17A is a simplified top illustration of a cell 1770 having five units 1716 that are interconnected together to form a pentagonal cell 1770. In this embodiment, each of the units 1716 is similar to the unit 1116 described above and illustrated in FIG. 11.

Figure 17B:
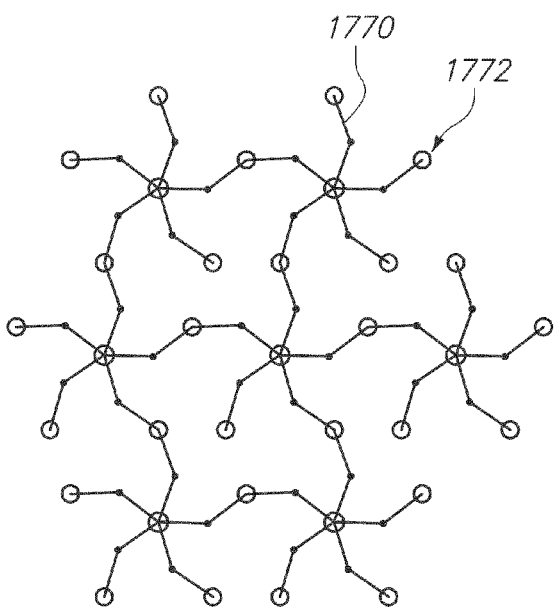
FIG. 17B is a simplified top view of a lattice that includes a plurality of cells of FIG. 17A.

FIG. 17B is a simplified top illustration of a lattice 1772 that includes a plurality of the pentagonal cells 1770 that are interconnected to form the lattice 1772. In this embodiment, the lattice 1772 is not a perfect matching lattice. In this embodiment, not all of the connections to the load of adjacent cells 1770 can be combined on to a single connecting support. However, as long as the load can be balanced among the multiple suspensions a perfect matching lattice is not necessary.

Figure 18:
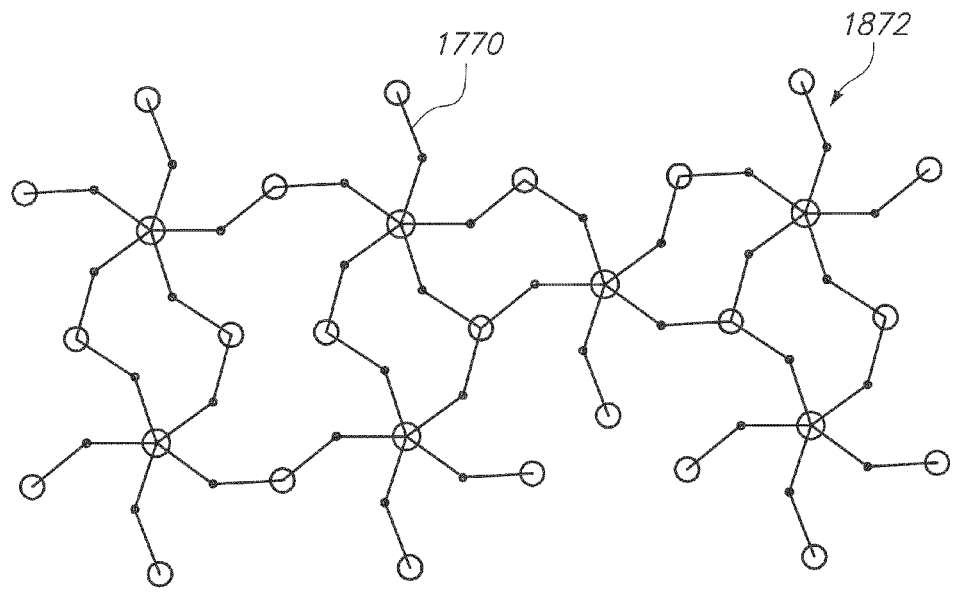
FIG. 18 is a simplified top view of another lattice that includes a plurality of cells of FIG. 17A.

FIG. 18 is a simplified top illustration of a lattice 1872 that includes a plurality of the pentagonal cells 1770 that are interconnected to form the lattice 1872. In this embodiment, the lattice 1872 is not a perfect matching lattice.

Figure 19:
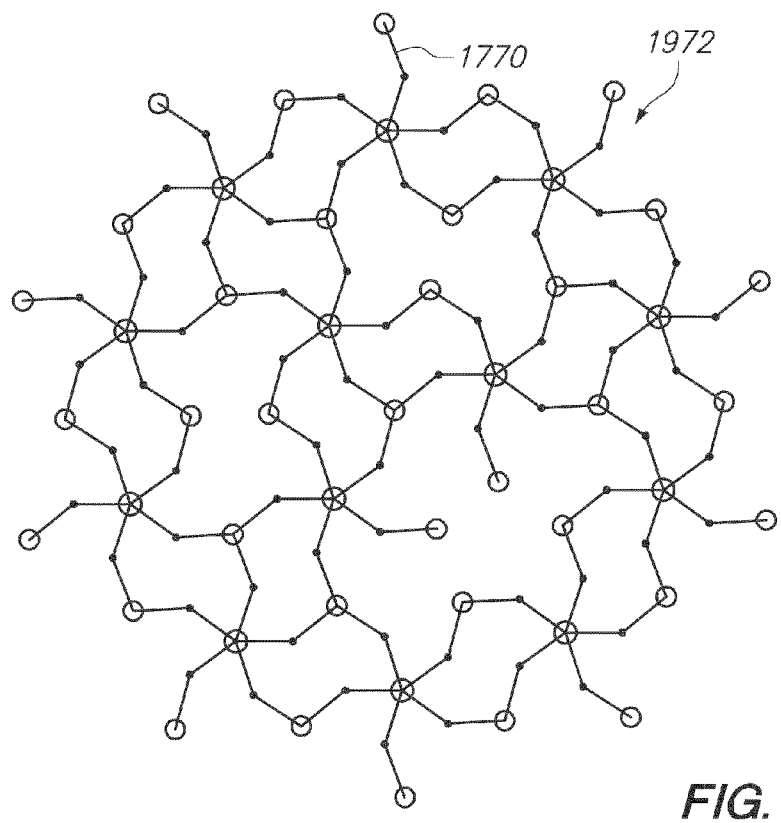
FIG. 19 is a simplified top view of yet another lattice that includes a plurality of cells of FIG. 17A.

FIG. 19 is a simplified top illustration of a lattice 1972 that includes a plurality of the pentagonal cells 1770 that are interconnected to form the lattice 1972. In this embodiment, the lattice 1972 is not a perfect matching lattice. Further, in this embodiment, the lattice 1972 consists of a circular pattern of the pentagonal cells 870.

Figure 20A:
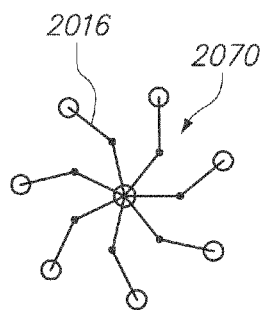
FIG. 20A is a simplified top view of still another embodiment of a cell having a plurality of suspension assemblies.

Other cells arrangements consisting of different number of units are possible. For example, FIG. 20A is a simplified top illustration of a cell 2070 having seven units 2016 that are interconnected together to form a seven cell 2070. In this embodiment, each of the units 2016 is similar to the unit 1116 described above and illustrated in FIG. 11.

Figure 20B:
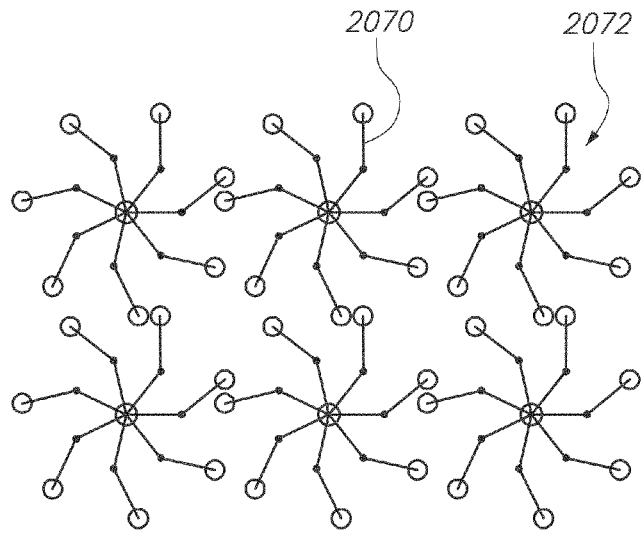
FIG. 20B is a simplified top view of a lattice that includes a plurality of cells of FIG. 20A.

FIG. 20B is a simplified top illustration of a lattice 2072 that includes a plurality of the seven cells 2070 that are interconnected to form the lattice 2072. In this embodiment, the lattice 2072 is not a perfect matching lattice.

Figure 21A:
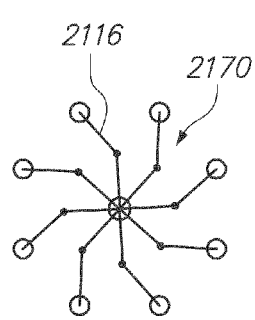
FIG. 21A is a simplified top view of still another embodiment of a cell having a plurality of suspension assemblies.

FIG. 21A is a simplified top illustration of a cell 2170 having eight units 2116 that are interconnected together to form an eight cell 2170. In this embodiment, each of the units 2116 is similar to the unit 1116 described above and illustrated in FIG. 11.

Figure 21B:
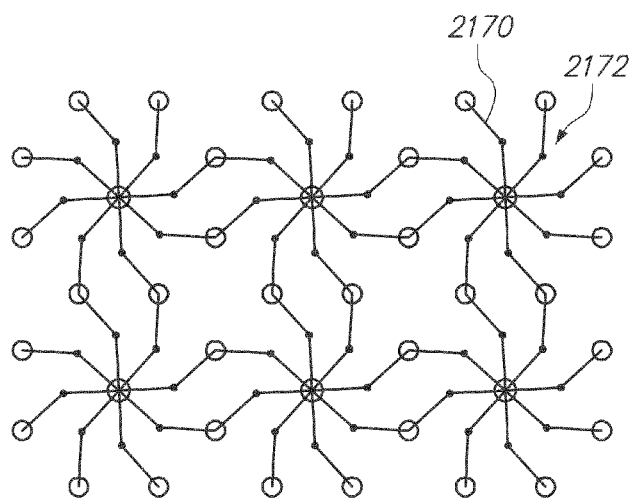
FIG. 21B is a simplified top view of a lattice that includes a plurality of cells of FIG. 21A.

FIG. 21B is a simplified top illustration of a lattice 2172 that includes a plurality of the eight cells 2170 that are interconnected to form the lattice 2172. In this embodiment, the lattice 2172 is not a perfect matching lattice.

In certain embodiments, the perfect matching lattices may be a more stable suspension against pitch and roll of the pedestal. For heavier pedestals, a larger number of units can be used, or alternatively the height of the pivots of each of the LaCoste type suspensions can be changed to change its exerted vertical force.

Figure 22A:
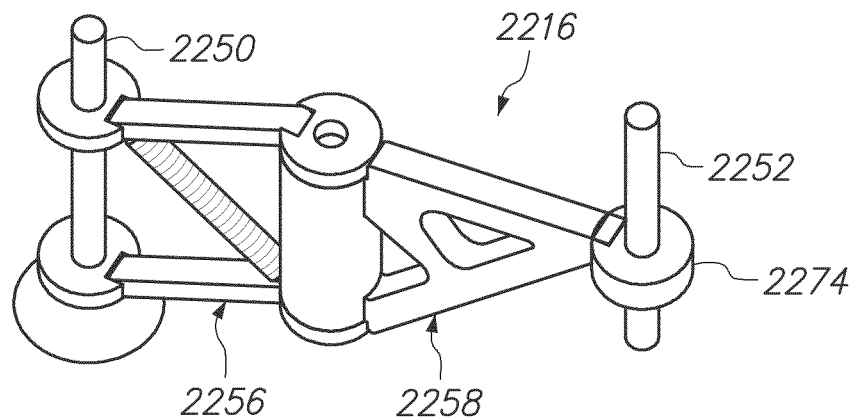
FIG. 22A is a perspective view of another embodiment of a mechanism having features of the present invention.

FIG. 22A is a perspective view of another embodiment of a unit 2216 that can be used as a mechanism 1016 (illustrated in FIG. 10) or portion thereof. In this embodiment, the unit 2216 includes a mount 2250, a support 2252, and a suspension assembly 2254 that cooperate to inhibit the transfer of motion between objects. In this embodiment, the mount 2250 and the support 2252 are similar to the corresponding components described above and illustrated in FIG. 11. Further, the suspension assembly 2254 extends between the mount 2250 and the support 2252, and the suspension assembly 2254 defines at least one LaCoste type system 2256 and at least one garden gate type assembly 2258 that are connected in series. The suspension assembly 2254 is somewhat similar to the corresponding component described above, except that the gate attacher 2274 includes only one attachment ring 2274 that pivotable attaches the suspension assembly 2254 to the support 2252.

Figure 22B:
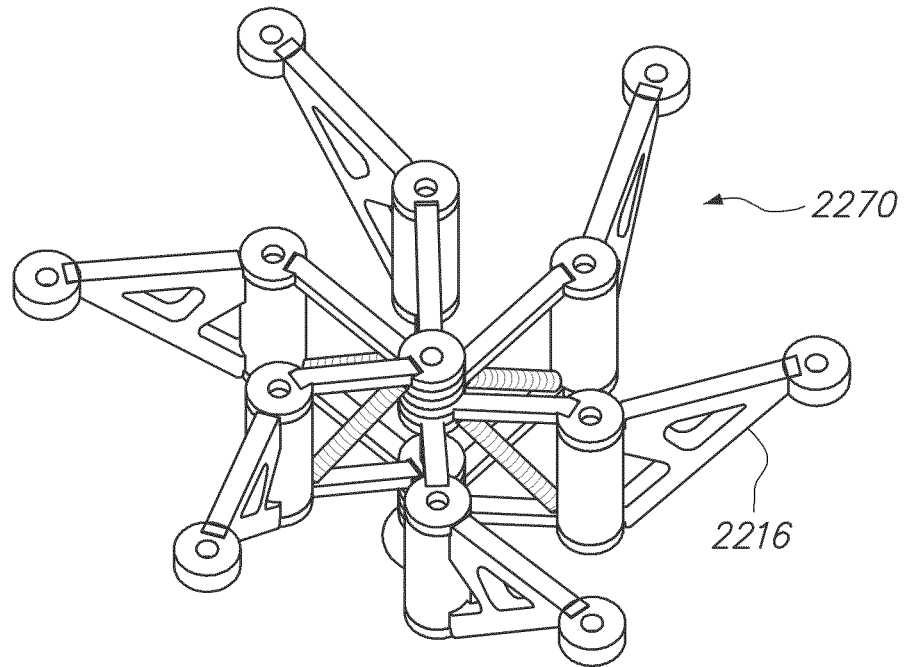
FIG. 22B is a perspective view of a cell having a plurality of units from FIG. 22A.

FIG. 22B is a simplified top perspective view of a cell 2270 having six units 2216 (from FIG. 22A) that are interconnected together to form a six cell 2270.

Figure 22C:
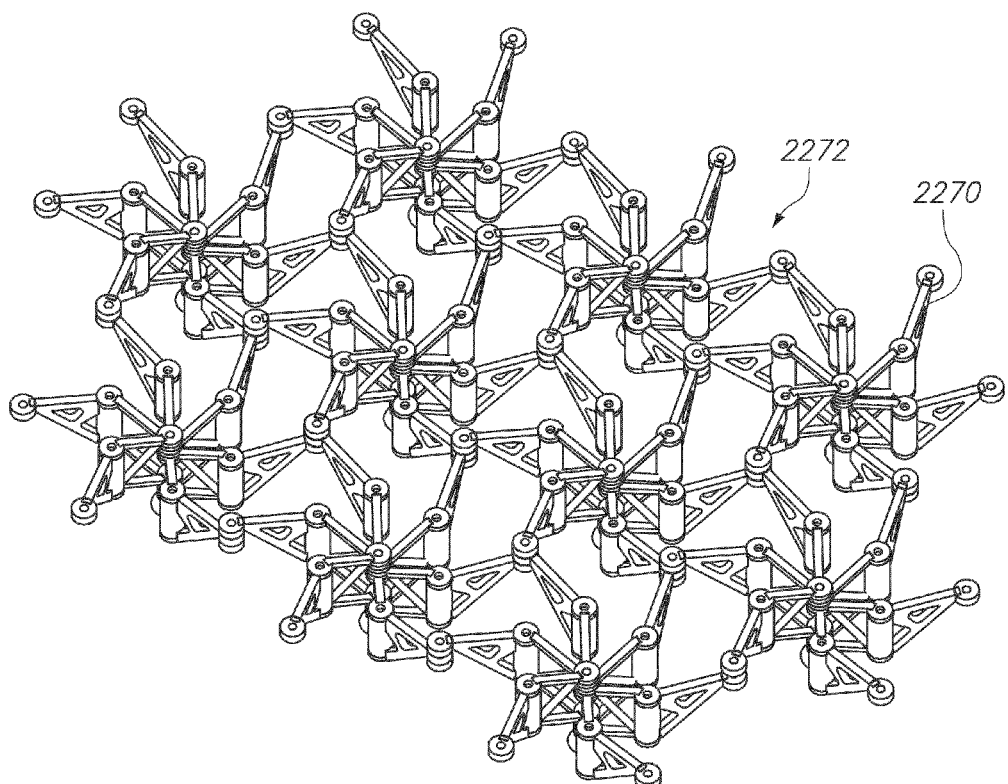
FIG. 22C is a perspective of a lattice that includes a plurality of cells of FIG. 22B.

FIG. 22C is a simplified top perspective view of a lattice 2272 that includes a plurality of the six cells 2270 that are interconnected to form the lattice 2272. In this embodiment, the lattice 2272 is a perfect matching lattice.

With the designs provided herein, multiple LaCoste type systems and multiple garden gate type assemblies can be utilized to concurrently support the suspended assembly 1044 (illustrated in FIG. 10).

Figure 23:
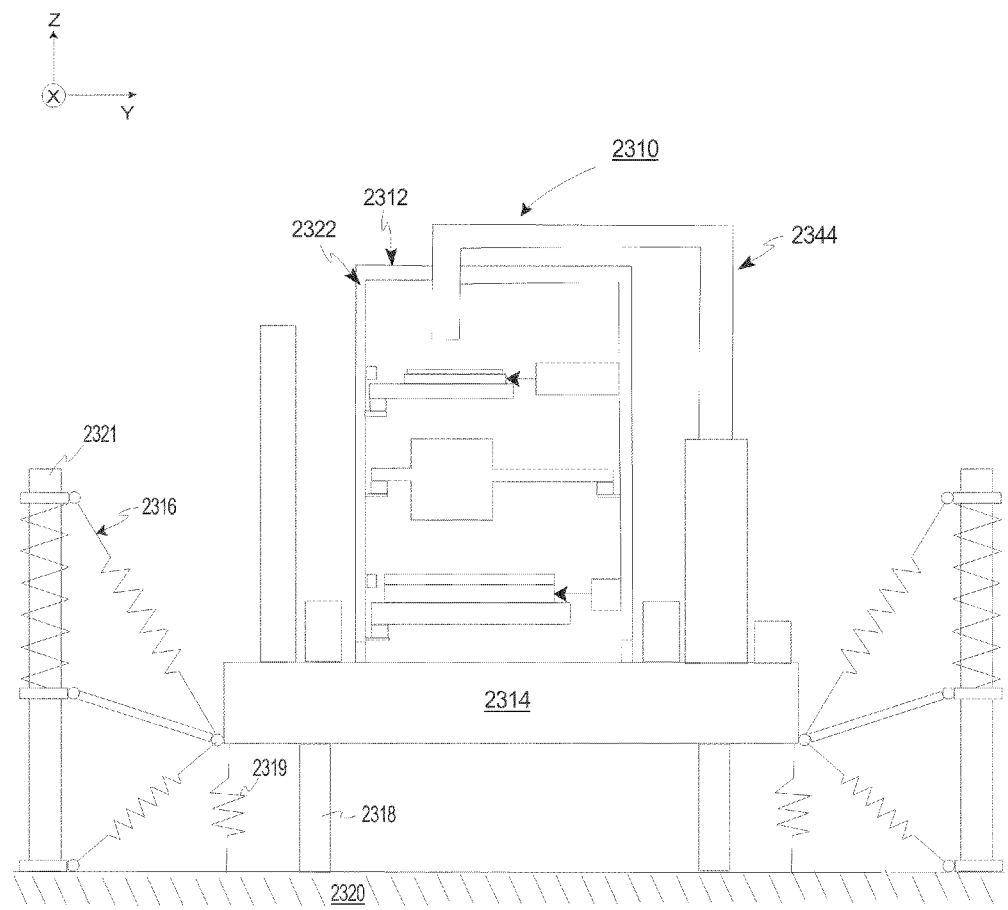
FIG. 23 is a simplified schematic illustration of a precision assembly having features of the present invention.

FIG. 23 is a schematic illustration of a precision assembly 2310 that includes a precision fabrication apparatus 2312, a pedestal 2314 that retains the components of the precision fabrication apparatus 2312, and a suspension system 2316. As an overview, in certain embodiments, the suspension system 2316 includes one or more resilient mechanisms 2321 that have negative stiffness, and one or more positive stiffness suspensions 2319 that cooperate to support the pedestal 2314 relative to a mounting base 2320, and isolate the pedestal 2314 and the precision fabrication apparatus 2312 during a seismic disturbance.

With this design, the negative stiffness resilient mechanisms 2321 are utilized to counteract the stiffness of the positive stiffness suspension 2319 and reduce the overall stiffness of the suspension system 2316. The negative stiffness of this mechanism 2321 can be used in parallel with the existing suspensions 2319 to reduce the stiffness of the suspension system 2316 without compromising the load carrying capability of these structures.

Alternatively, for example, the system can be designed without the positive stiffness suspensions 2319. In this design, the negative stiffness suspensions system 2316 can be used to counteract positive stiffness caused by the stiffness of cables and hoses of the precision assembly 2310.

As provided herein, the negative stiffness of the resilient mechanism 2321 can be used to reduce the resonance frequency of the suspension system 2316 and improve the performance of the suspension system 2316. Stated in another fashion, the negative stiffness mechanisms 2321 can be added to an existing suspension system 2316 to reduce the stiffness of the suspension system 2316 to approach approximately zero stiffness and exert a substantially constant force on the pedestal 2314 regardless of the motions of the pedestal 2314. As a result thereof, the components of the precision fabrication apparatus 2312 are better protected by the suspension system 2316 during the seismic disturbance. This reduces the likelihood of damage and misalignment of the components of the precision fabrication apparatus 2312 during the seismic disturbance.

In FIG. 23, the precision fabrication apparatus 2312 is an exposure apparatus 2322 that is similar to the exposure apparatus 10 illustrated in FIG. 1 and described above. Moreover, the pedestal 2314 is similar in design to the pedestal 14 illustrated in FIG. 1 and described above. In this embodiment, the pedestal 2314, and the exposure apparatus 2322 are collectively referred to herein as a suspended assembly 2344.

In certain embodiments, a soft spring system (not shown in FIG. 23) can be used in parallel with the suspension system 2316 to tune machine dynamics if a slight positive stiffness is desired.

It should be noted that the resilient mechanisms 2321 can be used in other assembly designs. For example, the mechanisms 2321 can be used in a multiple pedestal 214A arrangement (as illustrated in FIG. 2A), or in a unified multiple level, unified pedestal 214B arrangement (as illustrated in FIG. 2B).

Further, as provided herein, the negative stiffness resilient mechanisms 2321 can be useful in any application where positive stiffness inherent to the system must be reduced or taken out while still maintaining the same substantially constant force. Basically, the present invention can be used in any application where a substantially constant force is required over a large range of motion but stiffness inherent to the system needs to be cancelled out or reduced by negative stiffness. For example, the resilient mechanisms 2321 can be used to enable vibration sensitive instruments and equipment to perform at unprecedented levels. For example, the resilient mechanisms 2321 can be used to isolate microscopes, microhardness testers and other vibration-sensitive instruments and equipment.

In addition to providing negative stiffness, in certain embodiments, the resilient mechanisms 2321 can be designed to provide a preset constant preload force that can be adjusted to be positive, negative, or zero. Further, in certain embodiments, the negative stiffness is perfectly linear over the entire range of motion, and can be used for seismic isolation of large amplitude disturbances.

In one embodiment, the precision assembly 2310 also includes one or more locking assemblies 2318 (illustrated as boxes) that selectively lock the pedestal 2314 to the mounting base 2320 when a seismic disturbance is not occurring. With this design, the locking assembly 2318 fixedly retains the precision fabrication apparatus 2312 during normal operation of the precision fabrication apparatus 2312, and the locking assembly 2318 can quickly release the precision fabrication apparatus 2312 so that the suspension system 2316 can inhibit the transfer of vibration from the mounting base 2320 to the precision fabrication apparatus 2312 to protect the precision fabrication apparatus 2312.

The suspension system 2316 again isolates the pedestal 2314 and the suspended assembly 2344 during a seismic disturbance to protect the components of the suspended assembly 2344. In FIG. 23, the suspension system 2316 inhibits movement of the mounting base 2320 along the Z axis from being transferred to the pedestal 2314 and the suspended assembly 2344. With this design, the suspension system 2316 attenuates vibration with one degree of freedom. Alternatively, for example, the suspension system 2316 can be designed to attenuate vibration with more than one, e.g. three or six degrees of freedom.

In FIG. 23, the suspension system 2316 includes one or more resilient mechanisms 2321 that have negative stiffness, and one or more positive stiffness suspensions 2319 that are arranged in parallel and that cooperate to support the pedestal 2314 relative to the mounting base 2320, and isolate the pedestal 2314 and the precision fabrication apparatus 2312 during a seismic disturbance.

The positive stiffness suspensions 2319 can be a resilient spring, a fluid piston, a resilient member, a vibration isolation system (e.g. an AVIS system), or another type of isolator. In FIG. 23, the resilient mechanism 2321 with negative stiffness is illustrated spaced apart from the positive stiffness suspension 2319. Alternatively, for example, the negative stiffness mechanism 2321 and the positive stiffness suspension 2319 can be in close proximity to each other. For example, a AVIS system can be designed that incorporates both the negative stiffness mechanism 2321 and the positive stiffness suspension 2319.

Further, positive stiffness of the system can be caused by cable and hoses connecting to the components of the fabrication apparatus 2312, or any other component on suspended assembly 2344.

Figure 24:
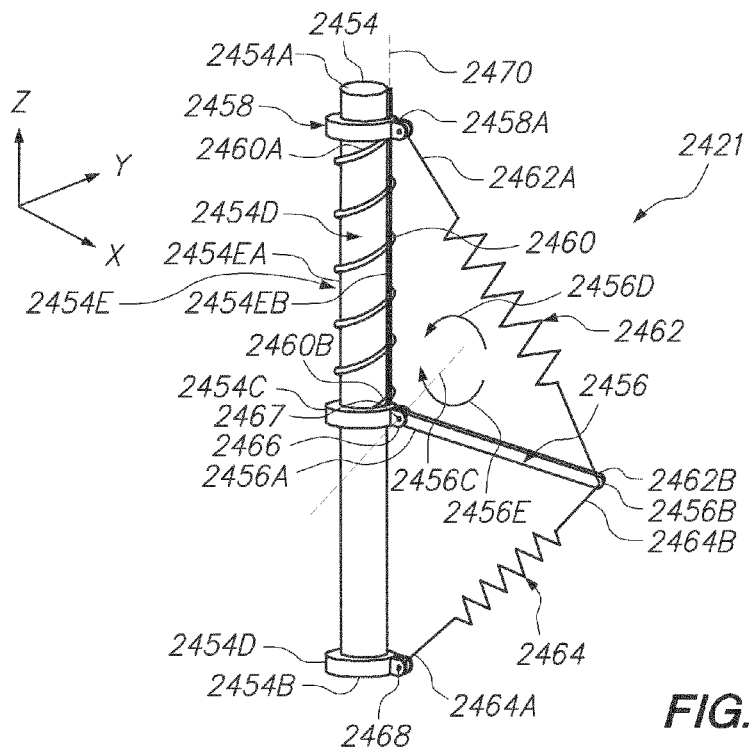
FIG. 24 is a perspective view of one embodiment of a resilient mechanism having features of the present invention.

FIG. 24 is a perspective view of one embodiment of a resilient mechanism 2421 that can be used in the suspension systems 16, 216, 296, illustrated in FIGS. 1, 2, 3, or to isolate another type of system. For example, the resilient mechanism 2421 can be used to inhibit the transfer of motion between a first object (not shown in FIG. 24) and a second object (not shown in FIG. 24). In certain embodiments, in addition to providing negative stiffness, the resilient mechanism 2421 can provide a preset constant preload force that can alternatively be adjusted to be positive, negative, or zero.

As provided herein, the negative stiffness of the resilient mechanism 2421 can be used to reduce the resonance frequency of seismic isolators, hence improving their performance. The resilient mechanism 2421 has linear negative stiffness, and can be used for seismic isolation of large amplitude disturbances. The negative stiffness of the resilient mechanism 2421 can also be used to cancel out the positive stiffness of bellows used for pressure control and other fluid applications. Simultaneously, a preset preload force of the resilient mechanism 2421 can be used with the bellows to maintain a preset pressure. The negative stiffness of this mechanism 2421 can also be used in parallel with existing support structures to reduce their stiffness and reduce the resonance frequency of the supported load without compromising the load carrying capability of these structures.

The size, shape, and design of the resilient mechanism 2421 can be varied to achieve the design requirements of the mechanism 2421. In one embodiment, the resilient mechanism 2421 includes a mechanism frame 2454, a boom 2456, a movable mount 2458, a mount resilient assembly 2460, a boom first resilient assembly 2462, and a boom second resilient assembly 2464.

The mechanism frame 2454 supports the components of the resilient mechanism 2421. Further, the mechanism frame 2454 can be referred to as the first object. For example, the mechanism frame 2454 can be a rigid beam that is fixedly secured to the mounting base 2320. In one non-exclusive embodiment, the beam is straight, solid, generally cylindrical shaped rod that includes an upper distal end 2454A that extends away from the mounting base 2320, a lower proximal end 2454B that is secured to the mounting base 2320, a boom connector 2454C, a fixed mount 2454D, and a guide region 2454E.

In FIG. 24, (i) the boom connector 2454C is a tubular shaped ring that is fixedly connected to the rod intermediate the distal end 2454A and the proximal end 2454B, and (ii) the fixed mount 2454D is a tubular shaped ring that is fixedly connected to the rod near proximal end 2454B. Moreover, in this embodiment, the boom connector 2454C additionally includes a pair of spaced apart pivot flanges 2466 that cantilever away from the rod and that receive a pin 2467 for pivotable securing the boom 2456 to the boom connector 2454C. Somewhat similarly, the fixed mount 2454D includes a pair of spaced apart mount flanges 2468 that cantilever away from the rod for securing a proximal end 2464A of the boom second resilient 2464 to the mechanism frame 2454.

In an alternative embodiment, the boom connector 2454C can be a monolithic flexure that pivotable secures the boom 2456 to the boom connector 2454C. In this embodiment, the flexure 2454C will have some stiffness. Depending upon the stiffness of the flexure 2454C, and the design of the rest of the components of the resilient mechanism 2421, the resulting mechanism 2421 can be designed to have (i) a negative stiffness if the stiffness of the flexure 2454C is small (the stiffness of the flexure 2454C is less than the negative stiffness generated by the rest of the mechanism 2421), (ii) approximately zero stiffness if the stiffness of the flexure 2454C is approximately equal to the negative stiffness generated by the rest of the mechanism 2421, or (iii) a positive stiffness if the stiffness of the flexure 2454C is greater than the negative stiffness generated by the rest of the mechanism 2421.

The guide region 2454E guides the movement of the movable mount 2458 along a movement axis 2470. The design of the guide region 2454E can be varied according to the design of the movable mount 2458. For example, in FIG. 24, the guide region 2454E includes a generally cylindrical region 2454EA and a rectangular shaped guide rail 2454EB that extends along the movement axis 2470. In this embodiment, the movable mount 2458 slides along the cylindrical area 2454EA and the guide rail 2454EB inhibits the movable mount 2458 from rotating about the axis 2470 (or z axis). Alternatively, for example, the movable mount 2458 can include one or more rollers 2680 (Illustrated in FIG. 26A), and the guide region 2454E can include one or more tracks 2682 (illustrated in FIG. 26A) that guide the one or more rollers 2680.

In one embodiment, the boom 2456 is a rigid beam that includes (i) a boom proximal end 2456A that is pivotable connected to and hinged from the mechanism frame 2454, and (ii) a boom distal end 2456B that is pivotable connected to the pedestal 2294 (illustrated in FIG. 23) or another object. With this design, the boom 2456 pivots about a boom pivot axis 2456C.

The movable mount 2458 moves relative to the boom connector 2454C along the movement axis 2470 (e.g. up and down along the Z axis in FIG. 24). In one embodiment, the movable mount 2458 is a tubular shaped ring that encircles and slides along the cylindrical region 2454EA. Further, the movable mount 2458 can include a slot 2458A that receives the guide rail 2454EB to inhibit rotation of the movable mount 2458. Alternatively, for example, the movable mount 2458 can include one or more rollers 2680 (Illustrated in FIG. 26A).

The mount resilient assembly 2460 urges the movable mount 2458 away from the boom connector 2454C along the movement axis 2470 and the mount resilient assembly 2460 allows the movable mount 2458 to move relative to the boom connector 2454C and the boom 2456 along the movement axis 2470. In one non-exclusive embodiment, the mount resilient assembly 2460 is a conventional spring that encircles the guide region 2454E and that is positioned directly between the movable mount 2458 and the boom connector 2454C. In this embodiment, a proximal end 4260A of the spring is in direct physical contact with the movable mount 2458, and the distal end 2460B of the spring is in direct physical contact with boom connector 2454C. Alternatively, mount resilient assembly 2460 can be another type of resilient assembly.

It should be noted that the characteristics of the resilient mechanism 2421 can be tuned by changing the characteristics of the mount resilient assembly 2460. For example, as explained in more detail below, a spring constant $k_v$ of the mount resilient assembly 2460 can be selected so that the resilient mechanism 2421 has a preset constant preload force that is positive, negative, or zero. It should also be noted that there are other ways to change the preload, such as by changing $k_1$ or $k_2$.

The boom first resilient assembly 2462 has a proximal end 2462A that is secured to the movable mount 2458 and a distal end 2462B that is secured to the boom distal end 2456B. With this design, the boom first resilient assembly 2462 extends diagonally between the movable mount 2458 and the boom 2456. Further, with this design, the mount resilient assembly 2460, the boom first resilient assembly 2462 and the boom 2456 cooperate to have a generally triangular shape.

In certain embodiments, the boom 2456 is maintained in a substantially horizontal orientation when the suspended assembly 2344 is being suspended in the neutral position. Alternatively, the boom 2456 can be maintained at an angle relative to horizontal when the suspended assembly 2344 is being suspended in the neutral position.

In one embodiment, the boom first resilient assembly 2462 functions and has characteristics similar to a zero length spring over an operational range of boom first resilient assembly 2462. For example, in one embodiment, the boom first resilient assembly 2462 is a zero length spring. The size of the zero length spring can be varied to achieve the force requirements of the system.

In another embodiment, the boom first resilient assembly 2462 can be a fluid type piston assembly (not shown) that is designed to approximately behave like a zero length spring.

The boom second resilient assembly 2464 has a proximal end 2464A that is secured to the fixed mount 2454D and a distal end 2464B that is secured to the boom distal end 2456B. With this design, the boom second resilient assembly 2464 extends diagonally between the fixed mount 2454D and the boom 2456. Further, with this design, a portion of the mechanism frame 2454 (between the boom connector 2454C and the fixed mount 2454D), the boom second resilient assembly 2462 and the boom 2456 cooperate to have a generally triangular shape.

In one embodiment, the boom second resilient assembly 2464 functions and is similar in design to the boom first resilient assembly 2462 described above. For example, in one embodiment, the boom second resilient assembly 2464 is a zero length spring.

With the present design, the boom first resilient assembly 2462 urges the boom 2456 to pivot about the boom pivot axis 2456C in a first rotational direction 2456D, and the boom second resilient assembly 2464 urges the boom 2456 to pivot about the boom pivot axis 2456C in a second rotational direction 4256E that is opposite the first rotational direction 2456D.

Further, as explained in more detail below, a spring constant $k_1$ of the boom first resilient assembly 4262 and/or a spring constant $k_2$ of the boom second resilient assembly 2464 can be selected so that the resilient mechanism 2421 has a preset constant preload force that is positive (upward along the z-axis in FIG. 24), negative (downward along the z-axis in FIG. 24), or zero.

It should be noted that the design modifications of the negative stiffness, resilient mechanism 2421 are possible. For example, the movable mount 2458 can be fixed while the boom connector 2454C slides along the guide region 2454E with the vertical spring positioned (i) between the movable mount 2458 and the boom connector 2454C with the spring in compression when the load is pointing down, or (ii) between the boom connector 2454C and the fixed mount 2454D with the spring in tension when the load is pointing down. Alternatively, the mechanism 2421 can be flipped upside down, with the top pivot fixes and the lower pivot sliding up and down, with the vertical spring between the lower pivot and the boom connector.

Figure 25A:
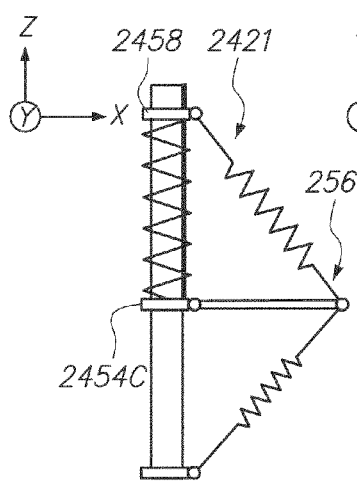
FIG. 25A is a side view of the resilient mechanism of FIG. 24 in a first position.
Figure 25B:
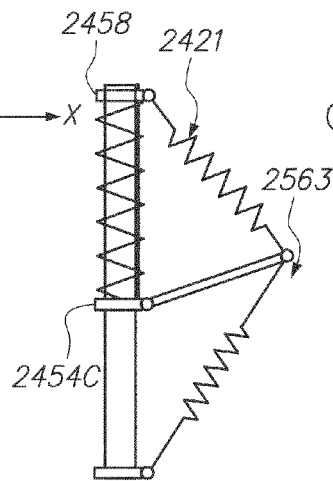
FIG. 25B is a side view of the resilient mechanism of FIG. 24 in a second position.
Figure 25C:
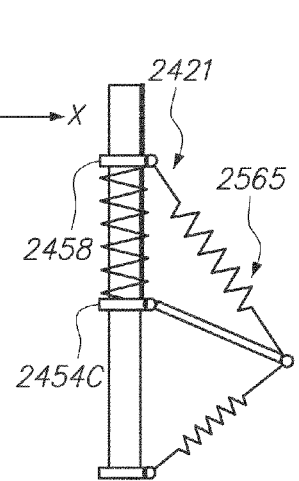
FIG. 25C is a side view of the resilient mechanism of FIG. 24 in a third position.

FIG. 25A is a simplified side view of the resilient mechanism 2421 in a neutral first position 2561, FIG. 25B is side view of the resilient mechanism 2421 in a retracted second position 2563, and FIG. 25C is another side view of the resilient mechanism 2421 in an extended third position 2565. It should be noted that any of these positions 2561, 2563, 2565 can be considered the neutral position. These Figures also illustrate how the movable mount 2458 moves relative to the boom connector 2454C.

FIGS. 26A-26F are simplified schematic diagrams of the resilient mechanism 2421 of FIG. 24. These diagrams are useful for explaining how a negative stiffness is achieved with this resilient mechanism 2421. In these examples, the movable mount 2458 includes a plurality of rollers 2680 that are guided by a track 2682.

Figure 26A:
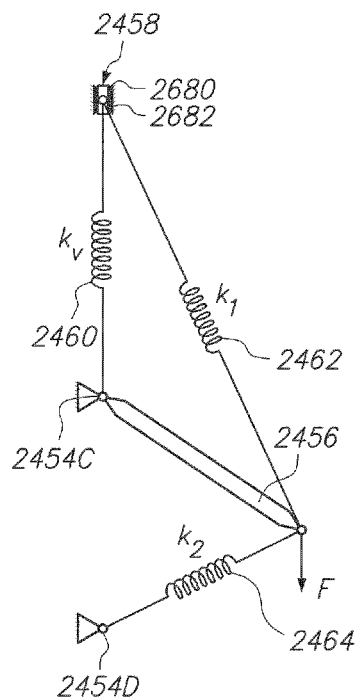
FIGS. 26A-26F are simplified schematic diagrams of the resilient mechanism of FIG. 24.
Figure 26B:
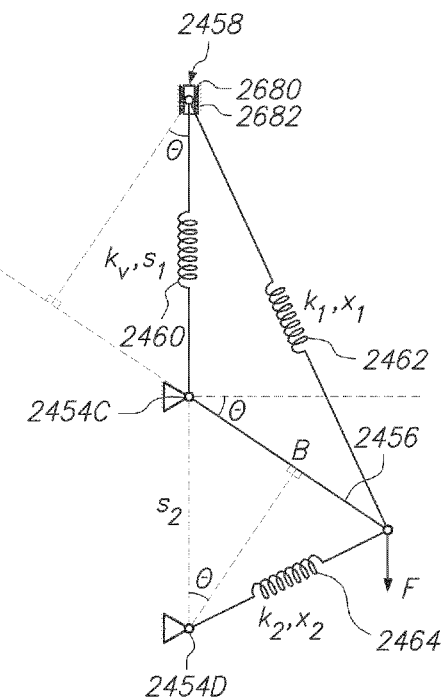

Referring initially to FIGS. 26A and 26B, the sum of moments about the boom connector 2454C can be expressed as follows:

$$F \cdot B\cos(\theta) = k_1 x_1 \cdot \left(\frac{s_1 \cos(\theta)}{x_1}\right) \cdot B - k_2 x_2 \cdot \left(\frac{s_2 \cos(\theta)}{x_2}\right) \cdot B \quad \text{Equation 3}$$

In the equations provided herein, (i) $s_1$ is the distance between the boom connector 2454C and the movable mount 2458, (ii) $s_2$ is the distance between the boom connector 2454C and the fixed mount 2454D, (iii) $x_1$ is the length of the boom first resilient assembly 2462, (iv) $x_2$ is the length of the boom second resilient assembly 2464, (v) $k_1$ is the spring constant for the boom first resilient assembly 2462, (vi) $k_2$ is the spring constant of the boom second resilient assembly 2464, (vii) $k_v$ is the spring constant of the mount resilient assembly 2460, (viii) B is the length of the boom 2456, (ix) $\theta$ is the angle of the boom 2456 relative to a horizontal axis, and (x) F is the force.

Further, the force F applied on the boom distal end 2456B can be expressed as follows:

$$F = k_1 s_1 - k_2 s_2 \quad \text{Equation 4}$$

It should be noted that the distance $s_1$ can vary because the movable mount 2458 moves up and down relative to the boom connector 2454C. Therefore, the force F is not constant. In fact $s_1$ can be written as a function of F as provided below:

$$s_1 = \frac{F + k_2 s_2}{k_1} \qquad \text{Equation 5}$$

Figure 26C:
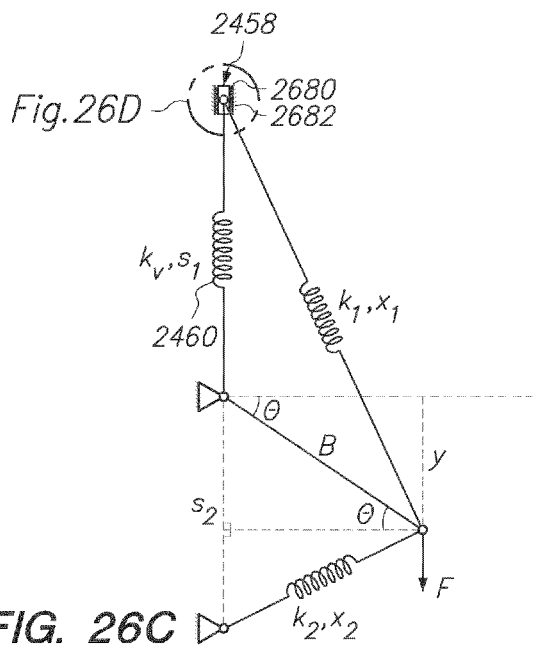
Figure 26D:
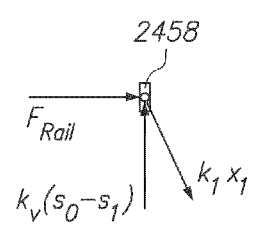

Referring to FIGS. 26C and 26D, the sum of forces in one direction (e.g. the vertical direction in the illustrated embodiment) at the movable mount 458 can be expressed as follows:

$$k_v(s_o - s_1) = k_1 x_1 \left(\frac{s_1 B \sin\theta}{x_1}\right) = k_1(s_1 + y) \qquad \text{Equation 6}$$

In this equation, $s_o$ is the unstretched length of the mount resilient assembly 460. Using Equation 5, Equation 6 can be rewritten as follows:

$$k_v\left(s_o - \frac{F + k_2 s_2}{k_1}\right) = k_1\left(\frac{F + k_2 s_2}{k_1} + y\right) \qquad \text{Equation 7}$$

Using algebra, Equation 7 can be expressed as follows:

$$F = \frac{k_1 k_v s_o}{k_1 + k_v} - k_2 s_2 - \frac{k_1^2 y}{k_1 + k_v} \qquad \text{Equation 8}$$

As provided herein, in the embodiment illustrated in FIG. 24, a stiffness (e.g. the spring constant $k_v$) of the mount resilient assembly 2460, a stiffness (e.g. the spring constant $k_1$) of the boom first resilient assembly 2462, and a stiffness (e.g. the spring constant $k_2$) of the boom second resilient assembly 2464 can be selected so that the resilient mechanism 2421 has a preload force (i) that is approximately zero, (ii) that is positive, or (iii) that is negative. Stated in another fashion, in addition to providing negative stiffness, in certain embodiments, the resilient mechanism 2421 can be designed to provide a preset constant preload force that can be adjusted to be positive, negative, or zero.

More specifically, to achieve a preload force that is zero, the resilient mechanism 2421 is designed as detailed in Equation 9

$$\frac{k_1 k_v s_o}{k_1 + k_v} = k_2 s_2 \qquad \text{Equation 9}$$

With this design, the force can be calculated as follows:

$$F = -\left(\frac{k_1^2}{k_1 + k_v}\right) y = k_{equivalent} \cdot y \qquad \text{Equation 10}$$

and $$k_{equivalent} = -\left(\frac{k_1^2}{k_1 + k_v}\right)$$

In this example, the resilient mechanism 2421 provides perfectly linear negative stiffness response in the vertical direction or along the z-axis in FIG. 24 through out its entire range of motion with zero preload force.

Alternatively, the resilient mechanism 2421 can be designed to provide a constant positive preload force combined with negative stiffness. This can be accomplished by designing the resilient mechanism 2421 so that:

$$\frac{k_1 k_v s_o}{k_1 + k_v} > k_2 s_2 \qquad \text{Equation 11}$$

Still alternatively, the resilient mechanism 2421 can be designed to provide a constant negative preload force combined with negative stiffness when:

$$\frac{k_1 k_v s_o}{k_1 + k_v} < k_2 s_2 \qquad \text{Equation 12}$$

It should be noted that the resilient mechanism 2421 should be designed to make sure that the mount resilient assembly 2460 does not bottom out ($s_1 > 0$) for a desired range of operation y of the resilient mechanism 2421.

The kinematics of $s_1$ as a function of the desired range of operation y can be expressed as follows:

$$k_v(s_o - s_1) = k_1(s_1 + y) \qquad \text{Equation 13}$$

Using algebra, this can be re-expressed as follows:

$$s_1 = \frac{k_v s_o - k_1 y}{(k_v + k_1)} \qquad \text{Equation 14}$$

Figure 26E:
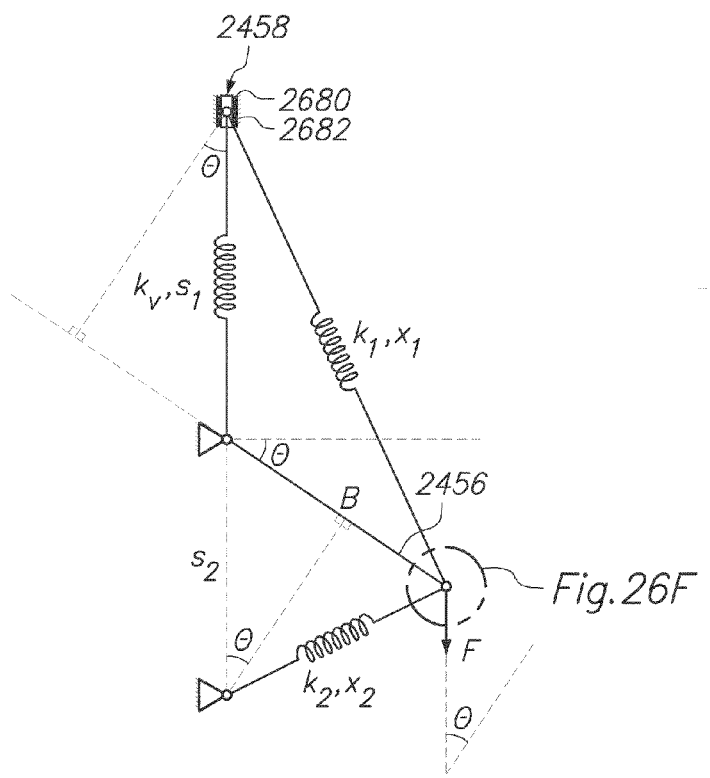
Figure 26F:
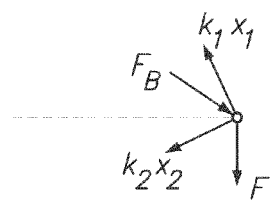

It should be noted that the force F on the boom 2456, along the boom $F_B$ is always constant and must be considered for large load applications to make sure the boom 2456 does not buckle, deform platically, or fracture. Referring to FIGS. 26E and 26F, the force on the boom $F_B$ can be calculated as provided below by taking the sum of forces along the boom 2456:

$$F_B = k_1 x_1 \left(\frac{B + s_1 \sin\theta}{x_1}\right) + k_2 x_2 \left(\frac{B - s_2 \sin\theta}{x_2}\right) - F \sin(\theta) \qquad \text{Equation 15}$$

Using Equation 4, Equation 15 can be expressed as follows:

$$F_B = k_1(B + s_1 \sin\theta) + k_2(B - s_2 \sin\theta) - k_1 s_1 \sin\theta + k_2 s_2 \sin\theta \qquad \text{Equation 16}$$

Equation 16 can be further simplified as follows:

$$F_B = (k_1 + k_2)B \qquad \text{Equation 17}$$

Figure 27:
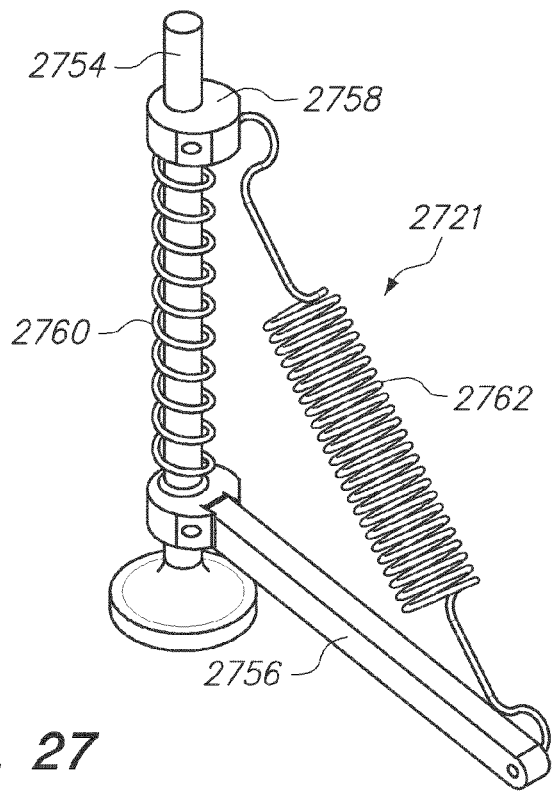
FIG. 27 is a perspective view of another embodiment of a resilient mechanism having features of the present invention

FIG. 27 is a perspective view of another embodiment of a negative stiffness resilient mechanism 2721 having features of the present invention. The resilient mechanism 2721 can be used to reduce the resonance frequency of seismic isolators, hence improving their performance. For example, the resilient mechanism 2721 can be used in the precision assembly 2310 (illustrated in FIG. 23) or another precision system.

In the embodiment illustrated in FIG. 27, the resilient mechanism 2721 includes a boom 2756, a movable mount 2758, a mount resilient assembly 2760, and a boom first resilient assembly 2762 that are similar in design to the corresponding components described above and illustrated in FIG. 24. However, in this embodiment, the mechanism frame 2754 does not include fixed mount 2454D and the resilient mechanism 2721 does not include a second resilient assembly 2464.

It should be noted that the resilient mechanism 2721 in FIG. 27 can only be used in applications wherein it is desired to provide a constant positive preload force combined with negative stiffness. As provided in Equation 18 below, for the resilient mechanism 2421 illustrated in FIG. 24, this can be accomplished by designing the resilient mechanism 2418 so that:

$$\frac{k_1 k_v s_o}{k_1 + k_v} > k_2 s_2 \qquad \text{Equation 18}$$

In the embodiment of FIG. 27, the mount second resilient assembly was eliminated. Thus, the spring constant $K_2$ of the mount second resilient assembly has a value of zero.

It should be noted that the resilient mechanisms 2421, 2721 disclosed herein can be used in other applications, such as, to cancel the stiffness of power cables, hoses, or other lines connected to payloads. Further, the linear and large range negative stiffness of the resilient mechanisms 2421, 2721 can also be used to improve the performance of vibration isolation mechanisms that use flexure guided motion. Some vibration isolation mechanisms for high precision applications employ flexures that add inherent stiffness and reduce isolation performance. The resilient mechanisms 2421, 2721 can be used to cancel the stiffness of the flexures and improve performance.

Figure 28:
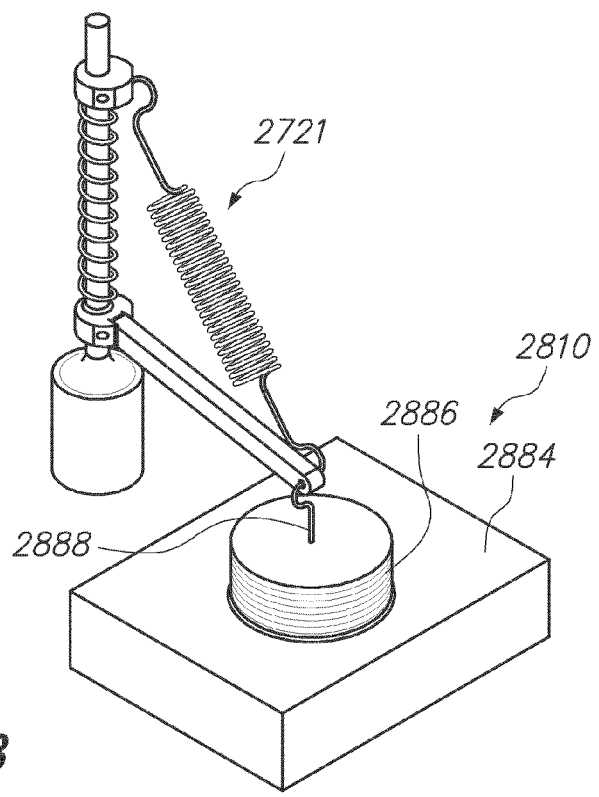
FIG. 28 is a simplified illustration of a precision assembly that includes the resilient mechanism of FIG. 27.

Further, the linear and large range negative stiffness of the resilient mechanisms 2421, 2721 can also be used for pressure control applications that employ bellows. FIG. 28 is a simplified perspective view of a precision assembly 2810 that includes an enclosed chamber 2884, a set of bellows 2886, and the resilient mechanism 2721 of FIG. 27. In this embodiment bellows 2886 is in fluid communication with the chamber 2884, and the bellows 2886 are mechanically connected to the resilient mechanism 2721 with a connector beam 2888. In this embodiment, the bellows 2886 are used to provide an area of expansion and contraction to control the pressure of a fluid (not shown) in the chamber 2884.

However, many bellows 2886, including metal bellows 2886 have an inherent stiffness that can adversely influence how the bellows 2886 moves and how the bellows 2886 controls the pressure in the chamber 2884. In this embodiment, the negative stiffness of the resilient mechanism 2721 can be used to cancel out the positive stiffness of bellows 2886 used for pressure control and other fluid applications. Thus, the resilient mechanism 2721 can be used to cancel out the inherent stiffness of the bellows 2886 to provide an ideal constant pressure source. Further, resilient mechanism 2721 can be designed so that it exerts a preset preload force in addition to negative stiffness on the bellows 2886 to maintain a preset pressure in the chamber 2884.

Stated in another fashion, in FIG. 28, the resilient mechanism 2721 is connected to the bellows 2886 to provide a constant pull force and negative stiffness on the bellows 2886 to cancel out the stiffness of the bellows 2886 and provide a constant negative pressure differential inside the chamber 2884 relative to the outside by pulling up on the bellows 2886. The substantially constant force and negative stiffness on the bellows 2886 results in a constant pressure differential relative to the outside. In another embodiment, a resilient mechanism 2421 of FIG. 24 can be used in similar fashion in combination with a similar bellows 2886 to exert a constant push force and negative stiffness on bellows 2886 and achieve a constant positive differential pressure relative to the outside in the pressure chamber 2884.

It should be noted that the zero stiffness and negative stiffness mechanisms described herein can be used in many other applications, including, but not limited to (i) pressure control applications such the leveling of a mask used for LCD exposure, (ii) cancelling out stiffness of bellows, (iii) an AVIS system, (iv) cancelling stiffness of tube and wires that connect to moving stages, (v) vibration isolation of other precision equipment, (vi) vibration isolation of optical tables and manufacturing equipment, (vii) mechanical trigger mechanism for fail safe applications, (viii) a vibration reduction system in a lens assembly (for improved performance and power savings) for a camera and video recording device, (e.g. perhaps a monolithic, flexure-based approximation can be used to hold a lens element), (ix) vibration isolation tripods or a tripod accessory mount for photographic equipment, (x) a counter weight application in tools, and/or (xi) to counter balance wafer cassettes elevators and other heavy equipment that needs to be moved electronically or manually to cancel positive stiffness for counterweight applications.

It should also noted that the negative stiffness mechanisms disclosed herein can be redesigned as a modular unit including a plurality of negative stiffness mechanisms on a common mount.

Figure 29:
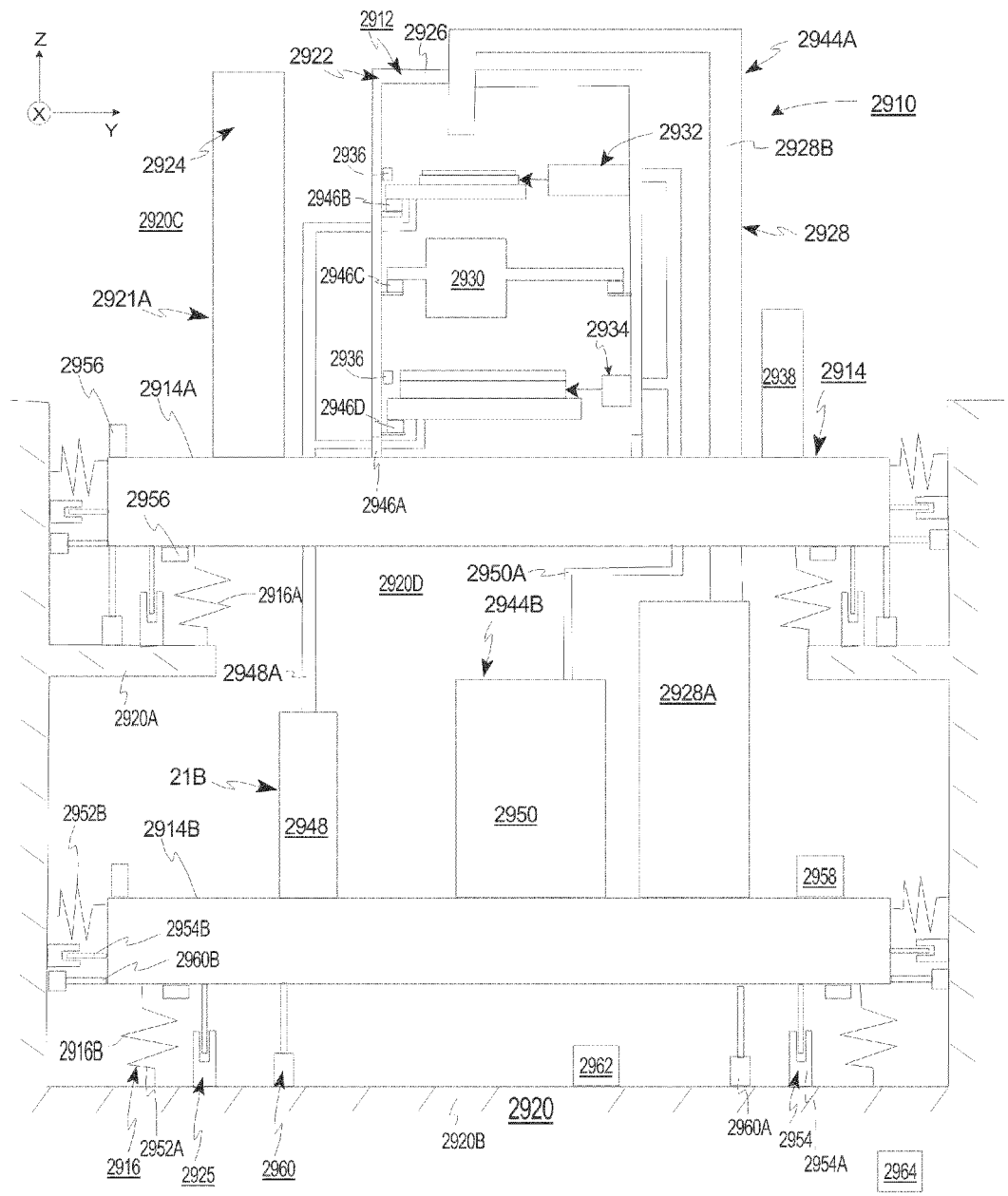
FIG. 29 is a simplified schematic illustration of a precision assembly having features of the present invention.

FIG. 29 is a schematic illustration of a precision assembly 2910 having features of the present invention that includes a precision manufacturing apparatus 2912, a pedestal assembly 2914 that retains the components of the precision manufacturing apparatus 2912, an isolation system 2916 (illustrated as boxes), and a pedestal synchronization system 2925. As an overview, in certain embodiments, the pedestal assembly 2914 includes multiple pedestals (e.g. a first pedestal 2914A and a second pedestal 2914B) that are independently suspended with the isolation system 2916 relative to a mounting base 2920. Further, the pedestal synchronization system 2925 causes the independent pedestals 2914A, 2914B to move concurrently during a seismic event, e.g. during a disturbance which exceeds a predetermined tolerance. As non-exclusive examples, the predetermined tolerance can be approximately 50 microns, 100 microns, 500 microns, or 1 millimeter.

With this arrangement, the isolation system 2916 can inhibit the transfer of vibration between the pedestals 2914A, 2914B during normal operation of the precision manufacturing apparatus 2912. Moreover, the pedestal synchronization system 2925 causes the pedestals 2914A, 2914B to move concurrently during a seismic event to prevent them from knocking into each other and to prevent any physical connections between the components on the pedestals 2914A, 2914B from being strained or severed. This reduces the likelihood of damage and misalignment of the components of the precision manufacturing apparatus 2912 caused by relative movement of these components during the seismic disturbance.

In one embodiment, the mounting base 2920 includes a first floor 2920A that can be the floor of a clean room 2920C that is maintained as a controlled environment for the manufacturing of precision components. For example, the clean room 2920C can be maintained at a very low level of environmental pollutants (such as dust and chemical particles). Further, the mounting base 2920 can include a second floor 2920B this is a non-clean room 2920D environment which contains a higher level of environmental pollutants than the clean room 2920C.

Further, as provided herein, first components 2921A of the precision manufacturing apparatus 2912 are secured to the first pedestal 2914A, while second components 2921B of the manufacturing apparatus 2912 are secured to the second pedestal 2914A. For example, in FIG. 29, the first components 2921A are relatively clean operating, while the second components 2921B are relatively dirty operating. In one embodiment, the relatively dirty operating components generate excessive dust, debris, heat, or noise that can adversely influence the controlled environment of the clean room 2920C. With the dirty components 2921B positioned outside the clean room 2920C, the clean room 2920C is easier to maintain and the higher quality products can be manufactured with the manufacturing apparatus 2912. In this embodiment, the top of the first pedestal 2914A is part of the clean room 2920C while the bottom of the first pedestal 2914A is part of the non-clean room 2920D.

It should be noted that the orientation of the floors 2920A, 2920B can be reversed. For example, the clean room 2920C can be positioned below the non-clean room 2920D that contains the dirty operating components 2921B.

The design of the precision manufacturing apparatus 2912 can be varied to achieve the desired manufacturing process. In one non-exclusive embodiment, the precision manufacturing apparatus 2912 can include an exposure apparatus 2922 and a transfer mechanism 2924 that are similar in design to the similarly named devices that are described above and illustrated in FIG. 1.

In this embodiment, the exposure apparatus 2922 can include one or more fluid sources 2948 (only one is illustrated in FIG. 29), one or more temperature control systems 2950 (only one is illustrated in FIG. 29), and/or other components that are necessary for the proper operation of the exposure apparatus 2922. Typically, these types of components generate dust, debris, and/or heat. In FIG. 29, the fluid source 2948 and the temperature control system 2950 are illustrated as being secured to the second pedestal 2914B below the apparatus frame 2926 and in the non-clean room 2920D.

As a non-exclusive example, the fluid source 2948 can provide pressurized fluid to create fluid bearings for the stage assemblies 2932, 2934. The fluid source 2948 can include one or more conduits 2948A that connect the fluid source 2948 in fluid communication with the stage assemblies 2932, 2934.

Further, as a non-exclusive example, the temperature control system 2950 can provide cooling fluid to the stage assemblies 2932, 2934. The temperature control system 2950 can include one or more temperature conduits 2950A that connect the temperature control system 2950 in fluid communication with the stage assemblies 2932, 2934.

In FIG. 29, the conduits 2948A, 2950A extend through one or more apertures (not shown in FIG. 29) in the first pedestal 2914A so that (i) the fluid conduit 2948A connects the fluid source 2948 (in the non-clean room 2920D) in fluid communication with the stage assemblies 2932, 2934 (in the clean room 2920C), and (ii) the temperature conduits 2950A connects the temperature control system 2950 (in the non-clean room 2920D) in fluid communication with the stage assemblies 2932, 2934 (in the clean room 20C).

As provided herein, with the pedestal synchronization system 2925, the pedestals 2914A, 2914B move concurrently during a seismic disturbance. This reduces the likelihood of damage and misalignment of the conduits 2948A, 2950A during the seismic disturbance. An outer perimeter of each of the conduits 2948A, 2950A can be sealed to the first pedestal 2914A to maintain the integrity of the clean room 2920C.

In FIG. 29, (i) the transfer mechanism 2924, the apparatus frame 2926, a portion of the illumination optical assembly 2928B, the projection optical assembly 2930, the reticle stage assembly 2932, the wafer stage assembly 2934, the measurement system 2936, and the lithographic control system 2938 are considered first components 2921A and are supported by and secured to the first pedestal 2914A, and (ii) the illumination source 2928A, the fluid source 2948, and the temperature control system 2950 are considered second components 2921B and are supported by and secured to the second pedestal 2914B. It should be noted that other components can be secured and supported by the first pedestal 2914A or the second pedestal 2914B.

Further, in this embodiment, (i) the first pedestal 2914A and the first components 2921A are collectively referred to herein as a first suspended assembly 2944A, and (ii) the second pedestal 2914B and the second level components 2921B are collectively referred to herein as a second suspended assembly 2944B It should be noted that the arrangement of components in FIG. 29 is just one non-exclusive example and that other arrangements of the components of the pedestals 2914A, 2914B can be utilized and/or more than two pedestals 2914A, 2914B can be utilized.

The size, shape, and design of each pedestal 2914A, 2914B can be varied to suit the components that it is supporting. In FIG. 29, the first pedestal 2914A can include a plurality of spaced apart pass-thru apertures (not shown) that allow for equipment, such as the illumination optical assembly 2928B and the conduits 2948A, 2950A to extend through the first pedestal 2914A to connect the second components 2921B to the first components 2921A.

The isolation system 2916 isolates the suspended assemblies 2944A, 2944B during a seismic disturbance to protect the components of the suspended assemblies 2944A, 2944B. In FIG. 29, the isolation system 2916 includes (i) a first isolation assembly 2916A that is coupled between the mounting base 2920 and the first pedestal 2914A, the first isolation assembly 2916A inhibiting the transfer of motion between the mounting base 2920 and the first pedestal 2914A, and (ii) a second isolation assembly 2916B that is coupled between the mounting base 2920 and the second pedestal 2914B, the second isolation assembly 2916B inhibiting the transfer of motion between the mounting base 2920 and the second pedestal 2914B. With this arrangement, the isolation system 2916 inhibits the transfer of vibration between the first components 2921A on the first pedestal 2914A and the second components 2921B on the second pedestal 2914B during normal operation of the precision manufacturing apparatus 2912.

Moreover, with this arrangement, because the pedestals 2914A, 2914B are separately suspended, each of the pedestals 2914A, 2914B and their respective components 2921A, 2921B can have different vibration characteristics. Stated in another fashion, each of the suspended assemblies 2944A, 2944B will have different vibration characteristics because they are separately suspended.

As provided herein, each of the isolations systems 2916A, 2916B can be designed and a stiffness tuned so that the first mode vibration characteristics of the first suspended assembly 2944A (including the first pedestal 2914A and the first components 2921A) are approximately equal to the first mode vibration characteristics of the second suspended assembly 2944B (including the second pedestal 2914B and the second components 2921B). Stated in another fashion, each of the isolations systems 2916A, 2916B can be designed and a stiffness tuned so that the first suspended assembly 2944A and the second suspended assembly 2944B have substantially similar resonance frequencies.

In one embodiment, the stiffness can be tuned by designing the right amount of stiffness into the springs based on the expected mass being supported and then using small adjustable springs to fine tune the resonance mode. The adjustable springs can be a blade springs where the length of the blade is varied by moving a roller underneath the blade to change the pivot point. Another method of changing stiffness is to use a regular spring with a scrolling anchor point the can rotate up and down the helix of the spring thus changing its length. It may also be possible to fine tune the resonance modes by adding some weights/masses to the systems that have a higher frequency.

Alternatively, with certain designs, tuning of the isolation systems 2916A, 2916B may not be necessary.

The design of the isolation assemblies 2916A, 2916B can be varied to achieve the desired level of resonance frequency of the suspended assemblies 2944A, 2944B and the desired directions in which the motion is attenuated. In certain embodiments, in order to attenuate vertical motions of an earthquake, the weight of the suspended assemblies 2944A, 2944B must be suspended or floated so that the mounting base 2920 can move relative to the suspended assemblies 2944A, 2944B.

In one embodiment, each of the isolation assemblies 2916A, 2916B includes (i) one or more spaced apart, vertically oriented, first isolators 2952A (only two are illustrated as springs) that inhibit movement of the mounting base 2920 along the Z axis, about the X axis, and about the Y axis from being transferred to the respective pedestal 2914A, 2914B, and (ii) one or more spaced apart, horizontally oriented, second isolators 2952B (only two are illustrated as springs) that inhibit movement of the mounting base 2920 along the X axis, along the Y axis, and about the Z axis from being transferred to the respective pedestal 2914A, 2914B. With this design, the isolation assemblies 2916A, 2916B attenuate vibration with six degrees of freedom. Alternatively, one or both of the isolation assemblies 2916A, 2916B can be designed to attenuate vibration with less than six degrees of freedom.

Suitable isolators 2952A, 29526 can include and incorporate one or fluid bellows, fluid pistons, springs, zero stiffness isolators (described above), negative stiffness isolators (described above), and/or actuators. It should be noted that although only two first isolators 2952A and only two second isolators 2952B are illustrated for each pedestal 2914A, 2914B, with certain designs, each pedestal 2914A, 2914B can be supported by a relatively large number of isolators 2952A, 2952B.

The pedestal synchronization system 2925 causes the pedestals 2914A, 2914B to move concurrently during a seismic event to inhibit/prevent them from knocking into each other and to prevent any physical connections (e.g. the illumination optical assembly 2928B, and the conduits 2948A, 2950A between the first components 2921A and the second components 2921B from being strained or severed. This reduces the likelihood of damage and misalignment of the components of the precision manufacturing apparatus 2912 caused by relative movement of these components during the seismic disturbance.

The design of the pedestal synchronization system 2925 can be varied according to the design of the pedestals 2914A, 2914B. As provided above, each of the isolations systems 2916A, 2916B can be designed and a tuned so that the first suspended assembly 2944A and the second suspended assembly 2944B have substantially similar resonance frequencies. However, these systems 2916A, 2916B can usually not be tuned perfectly. As a result thereof, the pedestal synchronization system 2925 can be required to ensure that the pedestals 2914A, 2914B move concurrently during a seismic event.

In FIG. 29, the pedestal synchronization system 2925 includes (i) a pedestal mover assembly 2954 (illustrated as a box) that selectively and independently moves the suspended assemblies 2944A, 2944B during a seismic event, (ii) a pedestal measurement system 2956 (illustrated as a box) that monitors the position of the pedestals 2914A, 2914B and/or another portion of the suspended assemblies 2944A, 2944B, and (iii) a pedestal control system 2958. With this design, during a seismic event, the pedestal measurement system 2956 can monitor the relative position of the pedestals 2914A, 2914B and/or another portion of the suspended assemblies 2944A, 2944B and provide positional information, and the pedestal mover assembly 2954 can move the pedestals 2914A, 2914B so that the suspended assemblies 2944A, 2944B move approximately concurrently.

In FIG. 29, for each pedestal 2914A, the pedestal mover assembly 2954 includes (i) one or more first movers 2954A (two are illustrated for each pedestal 2914A, 2914B) that extend between the mounting base 2920 and the respective pedestal 2914A, 2914B and that adjust the position of the respective pedestal 2914A, 2914B relative to the mounting base 2920 along the Z axis, about the X axis, and about the Y axis; and (ii) one or more second movers 2954B (two are illustrated for each pedestal 2914A, 2914B) that extend between the mounting base 2920 and the respective pedestal 2914A, 2914B and that adjust the position of the respective pedestal 2914A, 2914B relative to the mounting base 2920 along the X axis, along the Y axis, and about the Z axis.

For example, each mover can be a linear motor, a rotary actuator, a fluid actuator, or another type of actuator. The pedestal mover assembly 2954 can be electrically connected to and controlled by the pedestal control system 2958 or another type of controller.

The pedestal measurement system 2956 monitors movement of the pedestals 2914A, 2914B, and/or another portion of the suspended assemblies 2944A, 2944B relative to each other or the mounting base 2920. For example, the pedestal measurement system 2956 can utilize multiple laser interferometers, encoders, and/or other measuring devices.

The pedestal control system 2958 (or another controller) receives the positional information from the pedestal measurement system 56 and controls the pedestal mover assembly 2954 to precisely control the position of the pedestals 2914A, 2914B so that the pedestals 2914A, 2914B move together (follow each other) during the seismic event.

With the design discussed above, the pedestal synchronization system 2925 can control the relative positions of the pedestals 2914A, 2914B with six degrees of freedom. Alternatively, the pedestal synchronization system 2925 can be designed to control the relative positions of the pedestals 2914A, 2914B with less than six degrees of freedom.

As discussed above, in one embodiment, the isolation assemblies 2916A, 2916B are relatively soft and the suspended assemblies 2944A, 2944B are relatively heavy.

In certain embodiments, the precision assembly 2910 also includes a base clamp assembly 2960 (illustrated as boxes), and a clamp control system 2962 (illustrated as a box) to inhibit unwanted motion of the suspended assemblies 2944A, 2944B when a seismic event is not occurring. With this arrangement, without the use of the base clamp assembly 2960, if someone walked on the pedestals 2914A, 2914B, the suspended assemblies 2944A, 2944B can move and become excited. This can reduce the accuracy of the features of the images being transferred to the wafer 2942.

With this design, the isolation system 2916 supports and isolates the platforms 2914A, 2914B and the precision manufacturing apparatus 2912 during a seismic disturbance, and the base clamp assembly 2960 selectively locks the platforms 2914A, 2914B and the precision manufacturing apparatus 2912 to the mounting base 20 when a seismic disturbance is not occurring. Further, in this design, when the base clamp assembly 2960 is locked, the mounting base 2920 acts as a large low pass filter that inhibits the transfer of vibration between the suspended assemblies 2944A, 2944B.

The design of the base clamp assembly 2960 can be varied to achieve the desired level of locking of the suspended assemblies 2944A, 2944B and the desired degrees of motion of the suspended assemblies 2944A, 2944B during a seismic disturbance. In one embodiment, the base clamp assembly 2960 includes (i) one or more spaced apart vertical clamps 2960A (two are illustrated for each pedestal 2914A, 2914B) that cooperate to selectively inhibit movement of the respective suspended assembly 2944A, 2944B along the Z axis, about the X axis, and about the Y axis relative to the mounting base 2920, and (ii) one or more spaced apart horizontal clamps 2960B (two are illustrated for each pedestal 2914A, 29146) that cooperate to selectively inhibit movement of the respective suspended assembly 2944A, 2944B along the X axis, along the Y axis, and about the Z axis relative to the mounting base 2920. With this design, the base clamp assembly 2960 prevents movement of the suspended assemblies 2944A, 2944B with six degrees of freedom. Alternatively, the base clamp assembly 2960 can be designed to lock the suspended assemblies 2944A, 2944B with less than six degrees of freedom.

In one non-exclusive example, each clamp 2960A, 2960B can be somewhat similar in design to a disk brake system and can include a pair of calipers that selectively clamp a moving target. Alternatively, each clamp 2960A, 2960B can have a different design. For example, each clamp 2960A, 2960B can be a plunger (not shown) positioned in magnetorheological fluid (not shown). With this design, when no current is applied across the magnetorheological fluid, the plunger is free to move. Alternatively, when current is applied across the magnetorheological fluid, the plunger is inhibited from moving.

The clamp control system 2962 is electrically connected and controls the base clamps 2960A, 2960B to selectively lock and unlock the pedestals 2914A, 2914B to the mounting base 2920. The clamp control system 2962 can include one or more processors and circuits.

In one embodiment, the clamp control system 2962 is in electrical communication with a notification system 2964 (illustrated as a box) that provides an early warning notification signal that a seismic disturbance is about to disturb the mounting base 20. Upon receipt of the early warning notification signal, the clamp control system 2962 can cause the base clamps 2960A, 2960B to unlock and release the pedestals 2914A, 2914B and the suspended assemblies 2944A, 2944B prior to the seismic disturbance reaching the mounting base 2920.

Additionally, the notification signal can be transferred to the lithography control system 2938. With this information, the lithography control system 2938 can (i) control the wafer stage assembly 2934 to move the wafer 2942 to a safe location, (ii) turn off the illumination source 2928A, and/or (iii) adjust the isolators 2946A-2946D of the exposure apparatus 2922 just prior to the locking assembly 2918 releasing the pedestal assembly 2914.

Figure 30:
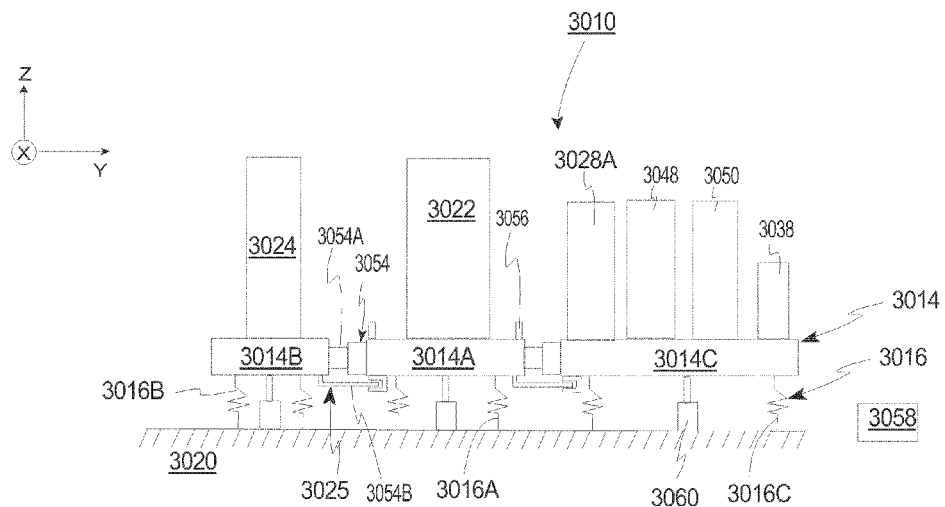
FIG. 30 is a simplified schematic illustration of another embodiment of a precision assembly having features of the present invention.

FIG. 30 is a schematic illustration of another embodiment of a precision assembly 3010 that is somewhat similar to the precision assembly 2910 illustrated in FIG. 29 and described above. However, in FIG. 30, many of the components of the precision assembly 3010, namely, the exposure apparatus 3022, the transfer mechanism 3024, the illumination source 3028A, the control system 3038, the fluid sources 3048, and the temperature control system 3050 are illustrated as boxes.

However, in FIG. 30, the pedestal assembly 3014 includes a first pedestal 3014A, a second pedestal 3014B, and a third pedestal 3014C that are positioned side by side on the same level. In this embodiment, (i) the first pedestal 3014A supports the exposure apparatus 3022; (ii) the second pedestal 3014B supports the transfer mechanism 3024; and (ii) the third pedestal 3014C supports the illumination source 3028A, the control system 3038, the fluid sources 3048, and the temperature control system 3050. Alternatively, the pedestal assembly 3014 can be designed with more pedestals, and/or the arrangement of the components on the pedestals can be different than that illustrated in FIG. 30.

Additionally, in FIG. 30, each of the pedestals 3014A, 3014B, 3014C is independently supported relative to the mounting base 3020 with the isolation system 3016. More specifically, in this embodiment, the isolation system 3016 includes (i) a first isolation assembly 3016A that is coupled between the mounting base 3020 and the first pedestal 3014A, the first isolation assembly 3016A inhibiting the transfer of motion between the mounting base 3020 and the first pedestal 3014A; (ii) a second isolation assembly 3016B that is coupled between the mounting base 3020 and the second pedestal 3014B, the second isolation assembly 3016B inhibiting the transfer of motion between the mounting base 3020 and the second pedestal 3014B; and (iii) a third isolation assembly 3016C that is coupled between the mounting base 3020 and the third pedestal 3014C, the third isolation assembly 3016C inhibiting the transfer of motion between the mounting base 3020 and the third pedestal 3014C. With this arrangement, the isolation system 3016 inhibits the transfer of vibration between the components on the first pedestal 3014A, the second pedestal 3014B, and the third pedestal 3014C.

It should be noted that in the simplified illustration of FIG. 30, the isolation system 3016 only isolates the pedestals 3014A, 3014B, 3014C with three degrees of freedom. However, the isolation system 3016 can be designed to isolate with more than three degrees of freedom.

Moreover, in FIG. 30, the precision assembly 3010 includes a base clamp assembly 3060 that selectively locks the platforms 3014A, 3014B, 3014C to the mounting base 3020 when a seismic disturbance is not occurring.

In FIG. 30, the precision assembly 3010 also includes a pedestal synchronization system 3018 that causes the pedestals 3014A, 3014B, 3014C to move concurrently during a seismic event to prevent them from knocking into each other and to prevent any physical connections between the components on the pedestals 3014A, 3014B, 3014C from being strained or severed.

In this embodiment, the pedestal synchronization system 3025 includes (i) a pedestal mover assembly 3054 that moves the pedestals 3014A, 3014B, 30114C during a seismic event, (ii) a pedestal measurement system 3056 (illustrated as a box) that monitors the position of the pedestals 3014A, 3014B, 3014C relative to each other, and (iii) a pedestal control system 3058 that controls the pedestal mover assembly 3054.

In FIG. 30, the pedestal mover assembly 3054 includes (i) two, first movers 3054A that extend between adjacent pedestals 3014A, 3014B, 3014C, and that adjust the relative position of the pedestals 3014A, 3014B, 3014C along the Z axis, about the X axis, and about the Y axis; and (ii) two, second movers 3054B that extend between adjacent pedestals 3014A, 3014B, 3014C, and that adjust the relative position of the pedestals 3014A, 3014B, 3014C along the X axis, along the Y axis, and about the Z axis. With this design, the pedestal synchronization system 3025 can control the relative positions of the pedestals 3014A, 3014B, 3014C with six degrees of freedom.

Figure 31:
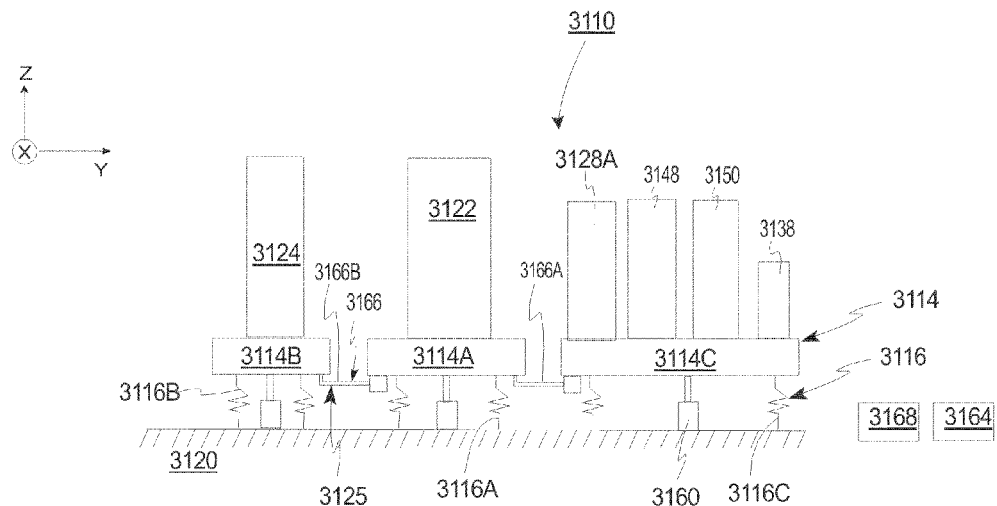
FIG. 31 is a simplified schematic illustration of yet another embodiment of a precision assembly having features of the present invention.

FIG. 31 is a schematic illustration of another embodiment of a precision assembly 3190 that is somewhat similar to the precision assembly 3110 illustrated in FIG. 31 and described above. In FIG. 31, the exposure apparatus 3122, the transfer mechanism 3124, the illumination source 3128A, the control system 3138, the fluid sources 3148, and the temperature control system 3150 are again illustrated as boxes. Similarly, in FIG. 31, (i) the pedestal assembly 3194 includes a first pedestal 3194A, a second pedestal 3194B, and a third pedestal 3194C, (ii) the isolation system 3116 includes a first isolation assembly 3116A, a second isolation assembly 3116B, and a third isolation assembly 3116C that inhibit the transfer of vibration between the pedestals 3114A, 3114B, 3114C, and (iii) a base clamp assembly 3160 that selectively lock the platforms 3114A, 3114B, 3114C to the mounting base 3120 when a seismic disturbance is not occurring.

In FIG. 31, the precision assembly 3110 also includes a pedestal synchronization system 3118 that causes the pedestals 3114A, 3114B, 3114C to move concurrently during a seismic event to prevent them from knocking into each other and to prevent any physical connections between the components on the pedestals 3114A, 3114B, 3114C from being strained or severed. However, in this embodiment, the pedestal synchronization system 3125 is a different design. More specifically, in this embodiment, the pedestal synchronization system 3198 includes a pedestal lock assembly 3166 and a lock control system 3168 that controls the pedestal lock assembly 3166.

In one embodiment, the pedestal lock assembly 3166 includes (i) a first lock 3166A that extends between and selectively locks the first pedestal 3114A to the third pedestal 3114C, and (ii) a second lock 3166B that extends between and selectively locks the first pedestal 3114A to the second pedestal 3114B. When the locks 3166A, 3166B are engaged, the pedestals 3114A, 3114B, 3114C move concurrently and when the locks 3166A, 3166B are disengaged, the pedestals 3114A, 3114B, 3114C are free to move independently.

In one non-exclusive example, each lock 3166A, 3166B can be somewhat similar in design to a disk brake system and can include a pair of calipers that selectively clamp a moving target. Alternatively, each lock 3166A, 3166B can have a different design. For example, each lock 3166A, 3166B can be a plunger (not shown) positioned in magnetorheological fluid (not shown). With this design, when no current is applied across the magnetorheological fluid, the plunger is free to move. Alternatively, when current is applied across the magnetorheological fluid, the plunger is inhibited from moving.

The lock control system 3168 is electrically connected and controls the locks 3166A, 3166B to selectively lock and unlock the pedestals 3114A, 3114B, 3114C together. The lock control system 3168 can include one or more processors and circuits.

In one embodiment, the lock control system 3168 is in electrical communication with a notification system 3164 (illustrated as a box) that provides an early warning notification signal that a seismic disturbance is about to disturb the mounting base 3120. Upon receipt of the early warning notification signal, the lock control system 3168 can cause the base clamp assembly 3160 to unlock and release the pedestals 3114A, 3114B, 3114C, and the locks 3166A, 3166B to secure the pedestals 3114A, 3114B, 3114C together prior to the seismic disturbance reaching the mounting base 3120.

It should be noted that in another embodiment, the pedestal synchronization system can be designed to include some combination of locks 3066A, 3066B and movers 3054A, 3054B (illustrated in FIG. 30).

Figure 32:
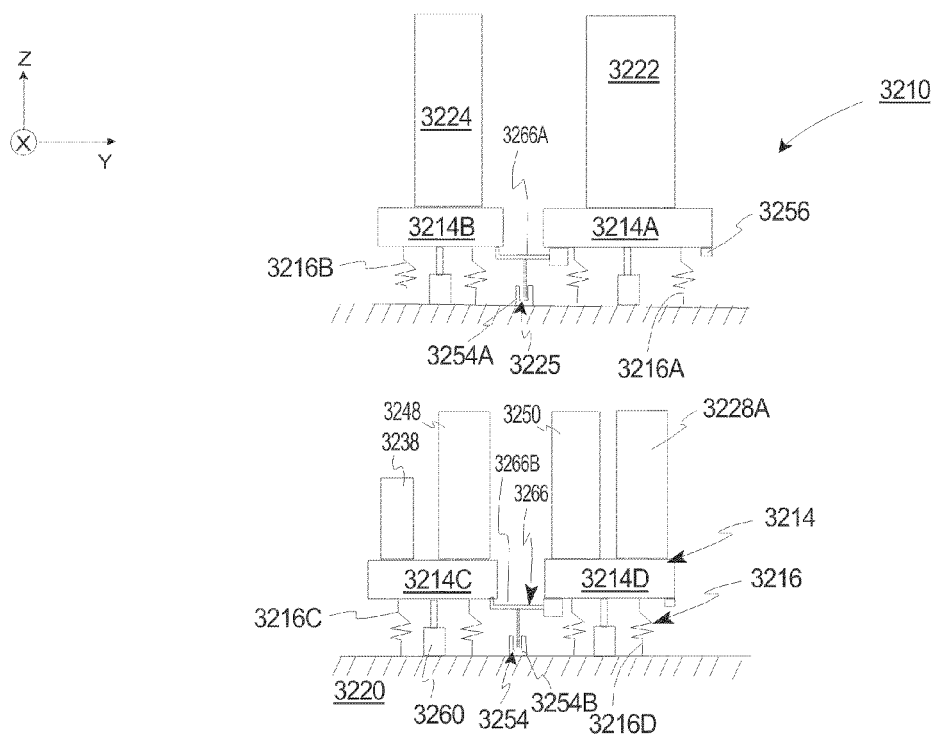
FIG. 32 is a simplified schematic illustration of still another embodiment of a precision assembly having features of the present invention.

FIG. 32 is a schematic illustration of another embodiment of a precision assembly 3210 that is somewhat similar to the precision assembly 3210 illustrated in FIG. 31 and described above. In FIG. 32, the exposure apparatus 3222, the transfer mechanism 3224, the illumination source 3228A, the control system 3238, the fluid sources 3248, and the temperature control system 3250 are again illustrated as boxes.

In FIG. 32, (i) the pedestal assembly 3214 includes a first pedestal 3214A, a second pedestal 3214B, a third pedestal 3214C, and a fourth pedestal 3214D, (ii) the isolation system 3216 includes a first isolation assembly 3216A, a second isolation assembly 3216B, a third isolation assembly 3216C, and a fourth isolation assembly 3216D that inhibit the transfer of vibration between the pedestals 3214A, 3214B, 3214C, 3214D and (iii) a base clamp assembly 3260 that selectively lock the platforms 3214A, 3214B, 3214C, 3214D to the mounting base 3220 when a seismic disturbance is not occurring. In this embodiment, (i) the first and second pedestals 3214A, 3214B are side-by-side and are at the same level, (ii) the third and fourth pedestals 3214C, 3214D are side-by-side and are at the same level, and (iii) and the first and second pedestals 3214A, 3214B are positioned above the third and fourth pedestals 3214C, 3214D.

Additionally, in FIG. 32, the precision assembly 3210 also includes a pedestal synchronization system 3225 that causes the pedestals 3214A, 3214B, 3214C, 3214D to move concurrently during a seismic event to prevent them from knocking into each other and to prevent any physical connections between the components from being strained or severed. However, in this embodiment, the pedestal synchronization system 3225 includes (i) a pedestal lock assembly 3266 having a first lock 3266A that extends between and selectively locks the first pedestal 3214A to the second pedestal 3214B, and a second lock 3266B that extends between and selectively locks the third pedestal 3214C to the fourth pedestal 3214D, (ii) a pedestal mover assembly 3254 having a first mover 3254A that adjusts the position of the locked first and second pedestals 3214A, 3214B relative to the mounting base 3220, and a second mover 3254B that adjusts the position of the locked third and fourth pedestals 3214C, 3214D relative to the mounting base 3220, and (iii) a pedestal measurement system 3256 that monitors the positions of the pedestals 3214A, 3214B, 3214C, 3214D. With the design discussed above, the pedestal synchronization system 3225 can control the relative positions of the pedestals 3214A, 3214B, 3214C, 3214D.

Figure 33:
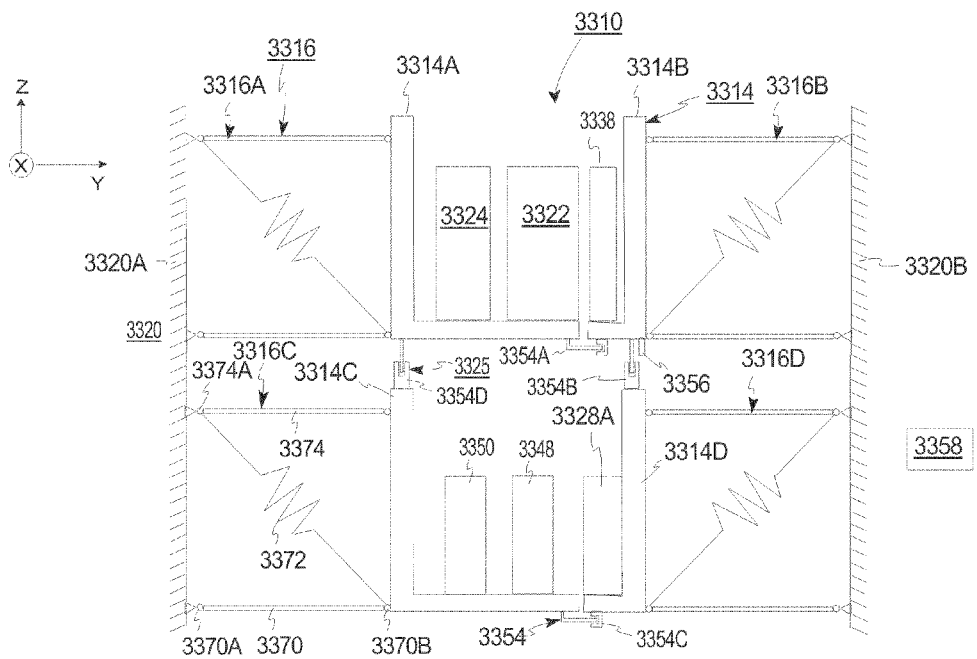
FIG. 33 is a simplified schematic illustration of another embodiment of a precision assembly having features of the present invention.

FIG. 33 is a schematic illustration of still another embodiment of a precision assembly 3310 that is somewhat similar to the precision assemblies described above. In FIG. 33, the exposure apparatus 3322, the transfer mechanism 3324, the illumination source 3328A, the control system 3338, the fluid sources 3348, and the temperature control system 3350 are illustrated as boxes.

In FIG. 33, (i) the pedestal assembly 3314 includes a first pedestal 3314A, a second pedestal 3314B, a third pedestal 3314C, and a fourth pedestal 3314D, and (ii) the isolation system 3316 includes a first isolation assembly 3316A, a second isolation assembly 3316B, a third isolation assembly 3316C, and a fourth isolation assembly 3316D that inhibit the transfer of vibration between the pedestals 3314A, 3314B, 3314C, 3314D. In this embodiment, (i) the first and second pedestals 3314A, 3314B are side-by-side and are at the same level, (ii) the third and fourth pedestals 3314C, 3314D are side-by-side and are at the same level, (iii) and the first and second pedestals 3314A, 3314B are positioned above the third and fourth pedestals 3314C, 3314D, and (iv) each of the pedestals 3314A, 3314B, 3314C, 3314D is somewhat "L" shaped.

Moreover, in FIG. 33, the mounting base 3320 includes a pair of spaced apart, vertically oriented walls 3320A, 3320B.

Additionally, in FIG. 33, each of the isolation assemblies 3316A, 3316B, 3316C, 3316D is a LaCoste type suspension that couples one of the pedestals 3314A, 3314B, 3314C, 3314D to one of the walls 3320A, 3320B. In this embodiment, each of the isolation assemblies 3316A, 3316B, 3316C, 3316D includes (i) a rigid hinged boom 3370 having a proximal end that is pivotable connected with a boom pivot 3370A to the mounting base 3320, and a distal end that is pivotable connected with a pedestal pivot 3370B to one of the pedestals 3314A, 3314B, 3314C, 3314D, and (ii) a resilient assembly 3372 that is connected to the mounting base 3320 and the distal end of the boom 3370. As a non-exclusive example, each pivot 3370A, 3370B, 3374A can be a hinge or a ball type connection. In alternative, non-exclusive embodiments, the boom 3370 is at least approximately forty, sixty, one-hundred, or two hundred centimeters in length.

In one embodiment, the resilient assembly 3372 is a pre-stressed zero length spring that exerts zero force when it has zero length. In this embodiment, the mounting base 3320, the boom 3370, and the resilient assembly 3372 cooperate to have a generally triangular shape. With this design, the hinged boom 3380A functions as a pendulum that pivots about the base pivot 3381A having a very long period.

Moreover, in this embodiment, each isolation assembly 3316A, 3316B, 3316C, 3316D can include a rigid, stabilization beam 3374 that extends between and is pivotable connected with pivots 3374A to the mounting base 3320 and the respective pedestal 3314A, 3314B, 3314C, 3314D. In this embodiment, the mounting base 3320, the boom 3370, the stabilization beam 3374, and the respective pedestal 3314A, 3314B, 3314C, 3314D cooperate to have a generally rectangular shape. Further, the boom 3370 and the stabilization beam 3374 are spaced apart and substantially parallel. The stabilization beam 3374 provides another connection between the mounting base 3320 and the respective pedestal 3314A, 3314B, 3314C, 3314D. With this design, the stabilization beam 3374 maintains the respective pedestal 3314A, 3314B, 3314C, 3314D in the proper orientation about the X axis. Alternatively, the stabilization beam 3374 could be eliminated if there is a very rigid connection is used between the boom 3370 and the respective pedestal 3314A, 3314B, 3314C, 3314D instead of the pedestal pivot 3370B.

Further, in FIG. 33, the precision assembly 3310 also includes a pedestal synchronization system 3318 that causes the pedestals 3314A, 3314B, 3314C, 3314D to move approximately concurrently during a seismic event to prevent them from knocking into each other and to prevent any physical connections between the components on the pedestals 3314A, 3314B, 3314C, 3314D from being strained or severed.

In this embodiment, the pedestal synchronization system 3318 includes (i) a pedestal mover assembly 3354 that moves the pedestals 3314A, 3314B, 3314C, 3314D during a seismic event, (ii) a pedestal measurement system 3356 (illustrated as a box) that monitors the position of the pedestals 3314A, 3314B, 3314C, 3314D relative to each other, and (iii) a pedestal control system 3358 that controls the pedestal mover assembly 3354.

In FIG. 33, the pedestal mover assembly 3354 includes (i) one or more first movers 3354A that extend between the first and second pedestals 3314A, 3314B, and that adjust the relative position of these two pedestals 3314A, 3314B; (ii) one or more second movers 3354B that extend between the second and fourth pedestals 3314B, 3314D, and that adjust the relative position of these two pedestals 3314B, 3314D; (iii) one or more third movers 3354C that extend between the third and fourth pedestals 3314C, 3314D, and that adjust the relative position of these two pedestals 3314C, 3314D; and (iv) one or more fourth movers 3354D that extend between the first and third pedestals 3314A, 3314C, and that adjust the relative position of these two pedestals 3314A, 3314C.

Figure 34:
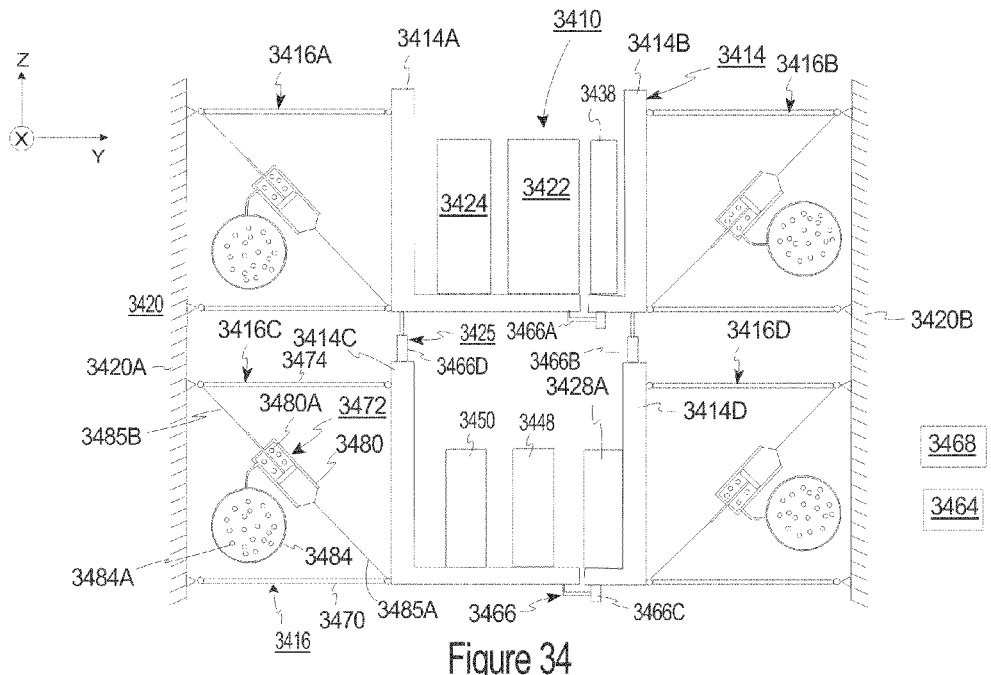
FIG. 34 is a simplified schematic illustration of yet another embodiment of a precision assembly having features of the present invention.

FIG. 34 is a schematic illustration of still another embodiment of a precision assembly 3410 that is somewhat similar to the precision assembly 3310 illustrated in FIG. 33 and described above. In FIG. 34, the exposure apparatus 3422, the transfer mechanism 3424, the illumination source 3428A, the control system 3438, the fluid sources 3448, and the temperature control system 3450 are illustrated as boxes.

Moreover, in FIG. 34, (i) the pedestal assembly 3414 includes a first pedestal 3414A, a second pedestal 3414B, a third pedestal 3414C, and a fourth pedestal 3414D, and (ii) the isolation system 3416 includes a first isolation assembly 3416A, a second isolation assembly 3416B, a third isolation assembly 3416C, and a fourth isolation assembly 3416D that inhibit the transfer of vibration between the pedestals 3414A, 3414B, 3414C, 3414D. Additionally, in FIG. 34, the mounting base 3420 includes a pair of spaced apart, vertically oriented walls 3420A, 3420B.

Further, in FIG. 34 each of the isolation assemblies 3416A, 3416B, 3416C, 3416D is a LaCoste type suspension that couples one of the pedestals 3414A, 3414B, 3414C, 3414D to one of the walls 3420A, 3420B. In this embodiment, each of the isolation assemblies 3416A, 3416B, 3416C, 3416D includes (i) a rigid hinged boom 3470 that is pivotable connected to the mounting base 3420, and a distal end that is connected to one of the pedestals 3414A, 3414B, 3414C, 3414D, (ii) a resilient assembly 3472 that is connected to the mounting base 3420 and the distal end of the boom 3470; and (iii) a stabilization beam 3474 that is pivotable connected to the mounting base 3420 and the respective pedestal 3414A, 3414B, 3414C, 3414D.

In this embodiment, the resilient assembly 3472 functions similar to a zero length spring over an operational range of the suspension. More specifically, in this embodiment, the resilient assembly 3472 is a fluid piston assembly that includes a piston cylinder 3480, a piston 3482, an additional chamber 3484, a cylinder connector 3485A, and a piston connector 3485B. The design of each of these components can be varied to achieve the desired characteristics of the resilient assembly 3472.

The piston cylinder 3480 receives the piston 3482 and cooperates with the piston 3482 to create a piston chamber 3480A. The piston 3482 is generally disk shaped and the piston 3482 slides within the piston cylinder 3480 to adjust the size of a piston chamber 3480A. Additionally, the piston 3482 can include one or more seals (not shown) that seal the piston 3482 to the piston cylinder 3480.

The additional chamber 3484 provides an additional volume of fluid 3484A (illustrated as small circles) that is in fluid communication with the piston chamber 3480A via a fluid conduit. With this design, relative movement between the piston 3482 and the piston cylinder 3480 results in a change of pressure of the fluid 3484A in the piston chamber 3480A and the additional chamber 3484. The amount of change in pressure of the fluid 3484A that results from relative movement varies according to the amount of fluid 3484A and the type of fluid 3484A. Thus, size and shape of the additional chamber 3484 can be designed to achieve the performance characteristics of the resilient assembly 3472.

Further, the type of fluid 3484A can be chosen to achieve the performance characteristics of the resilient assembly 3472. Non-exclusive examples of possible fluids 1084A include air, nitrogen, or argon.

The cylinder connector 3485A mechanically connects the piston cylinder 3480 to the mounting base 3420 and the piston connector 3485B mechanically connects the piston 3482 to the boom 3470. As a non-exclusive example, each connector 3485A, 3485B can be cable or a rigid beam.

Further, in FIG. 34, the precision assembly 3410 also includes a pedestal synchronization system 3418 that causes the pedestals 3414A, 3414B, 3414C, 3414D to move concurrently during a seismic event. In this embodiment, the pedestal synchronization system 3425 includes a pedestal lock assembly 3466, a lock control system 3468 that controls the pedestal lock assembly 3466, and a notification system 3464 (illustrated as a box) that provides an early warning notification signal that a seismic disturbance is about to disturb the mounting base 3420. In FIG. 34, the pedestal lock assembly 3466 includes (i) a first lock 3466A that extends between and selectively locks the first and second pedestals 3414A, 3414B together; (ii) a second lock 3466B that extends between and selectively locks the second and fourth pedestals 3414B, 3414D together; (iii) a third lock 3466C that extends between and selectively locks the third and fourth pedestals 3414C, 3414D together; and (iv) a fourth lock 3466D that extends between and selectively locks the first and third pedestals 3414A, 3414C together. These locks 3466A-3466D can be similar in design to the locks described above.

Figure 35:
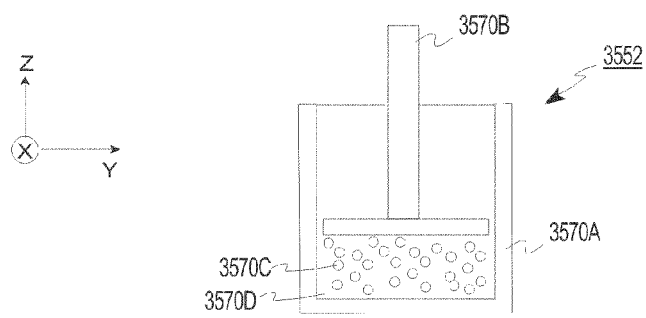
FIG. 35 is a simplified perspective view of one embodiment of an isolator having features of the present invention.

FIG. 35 is a simplified side illustration of another embodiment of an isolator 3552 that can be used in the isolation systems described above. In this embodiment, the isolator 3552 is a fluid type suspension that includes a cylinder body 3570A, a piston 3570B that is movable in the cylinder body 3570A, and a fluid 3570C (illustrated as circles) that is compressed in a piston chamber 3570D formed between the piston 3570B and the piston cylinder body 3570A. For example, the fluid 3570C can be air or another gas.

In one embodiment, the piston 3570B is fixedly secured to the pedestal (not shown in FIG. 35) and the cylinder body 3570A is fixedly secured to the mounting base (not shown in FIG. 35). Alternatively, the isolator 3552 can be flipped so that the piston 3570B is fixedly secured to the mounting base and the cylinder body 3570A is fixedly secured to the pedestal.

Figure 36:
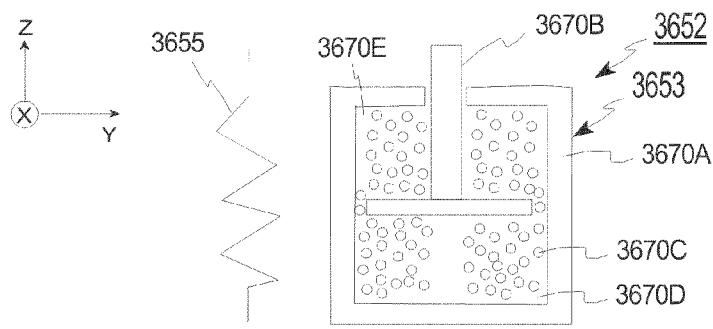
FIG. 36 is a simplified view of another embodiment of an isolator having features of the present invention.

FIG. 36 is a simplified illustration of another embodiment of an isolator 3652 that can be used in the isolation systems described above. In this embodiment, the isolator 3652 includes a damper 3653 and a resilient suspension 3655 (illustrated as a spring) which are connected in parallel. In this embodiment, the damper 3653 dampens motion and the resilient suspension 3655 inhibits the transfer of motion. As non-exclusive examples, the resilient suspension 3655 can be a spring, a fluid type suspension like illustrated in FIG. 35, or the LaCoste type suspensions described above.

In FIG. 36, the damper 3653 includes a cylinder body 3670A, a piston 3670B that is movable in the cylinder body 3670A, and a fluid 3670C (illustrated as circles) that is positioned (i) in a first piston chamber 3670D formed between the bottom of the piston 3670B and the cylinder body 3670A, and (ii) in a second piston chamber 3670E formed between the top of the piston 3670B and the cylinder body 3670A. In this embodiment, the fluid 3670C can be a Thixotropic fluid, a shear thinning fluid, a magneto-rheological fluid, an electro-rheological fluid, or another type of smart fluid. The fluid 3670C can have a non-linear viscosity or a very high viscosity (or elastic behavior) at low stresses or velocity.

Further, in this embodiment, to dampen motion, the fluid 3670C can bypass the piston, e.g. through one or more orifices in the piston 3670B or through a leaky seal between the side of the piston 3670B and the cylinder body 3670A.

In this design, the damper 3653 can act to fix or hold the position during normal operation. However, when an earthquake creates greater shear stresses, the fluid can flow and allow relative motion. Magneto-rheological fluids can also exhibit both elastic and viscous, depending on the strength of the magnetic field.

In one embodiment, the piston 3670B and the top of the resilient suspension 3655 are fixedly secured to the pedestal (not shown in FIG. 36) and the cylinder body 3670A and the bottom of the resilient suspension 3655 are fixedly secured to the mounting base (not shown in FIG. 36). Alternatively, the isolation subassembly 3616A can be flipped so that the piston 3670B is fixedly secured to the mounting base and the cylinder body 3670A is fixedly secured to the pedestal.

Figure 37:
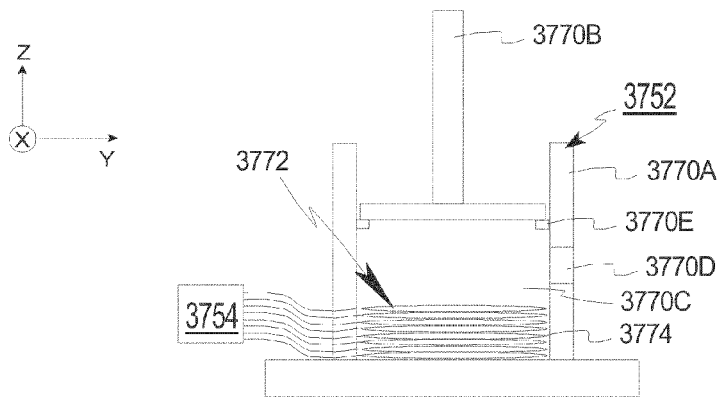
FIG. 37 is a simplified view of still embodiment of an isolator having features of the present invention.

FIG. 37 is a simplified illustration of still another embodiment of an isolator 3752 that can be used in the isolation systems described above. In this embodiment, the isolator 3752 is another fluid type suspension that includes a cylinder body 3770A and a piston 3770B that is movable in the cylinder body 3770A to form a piston chamber 3770C. Further, in this embodiment, the isolator 3752 additionally includes a fluid release system 3772 that is controlled by a control system 3754 to selectively release pressurized fluid (not shown in FIG. 37) into the piston chamber 3770C. In one embodiment, the fluid release system 3772 includes a plurality of quick burning propellant packages 3774 that can be somewhat similar to air-bag type quick burning propellants.

Moreover, in FIG. 37, the cylinder body 3770A includes one or more cylinder apertures 3770D and a stop 3770E. The cylinder apertures 3770D extend through the cylinder body 3770A into the piston chamber 3770B. The stop 3770E is secured to the inner diameter of the cylinder body 3770A and is engaged by the piston 3770B to inhibit movement of the piston 3770B downward past a predetermined distance along an axis (the Z axis in FIG. 37).

With this design, the during normal operation, and prior to a seismic disturbance, the piston 3770B rests against the stop 3770E to inhibit movement of the piston 3770B and the pedestal downward. This may eliminate the need for the base clamping assembly in this embodiment. Subsequently, during a seismic disturbance, the control system 3754 sends electrical signals that sequentially activate the quick burning propellant packages 3774 as needed. For example, each of the propellant packages 3774 can include a chemical propellant such as sodium azide. With this design, upon activation, the chemical propellant undergoes a rapid chemical reaction that produces nitrogen gas in the piston chamber 3770C that lifts the piston 3770B off of the piston stop 3770E. As the gas is filling the piston chamber 3770C, it is also being vented from the cylinder aperture 3770D. The sequentially activation of the propellant packages 3774 achieves a constant pressure on the piston 3770B for the duration of the seismic disturbance.

In one embodiment, the piston 3770B is fixedly secured to the pedestal (not shown in FIG. 37) and the cylinder body 3770A is fixedly secured to the mounting base (not shown in FIG. 37). Alternatively, the isolator 3752 can be flipped so that the piston 3770B is fixedly secured to the mounting base and the cylinder body 3770A is fixedly secured to the pedestal.

It should be noted that the number of isolators used in any of the isolation system will depend upon the characteristics of what is being suspended and the characteristics of the isolators. In alternative, non-exclusive embodiments, the isolation system can include approximately 10, 20, 30, or 50 spaced apart isolators. Typically, heavier suspended assemblies require a larger number of isolators than lighter suspended assemblies.

Figure 38:
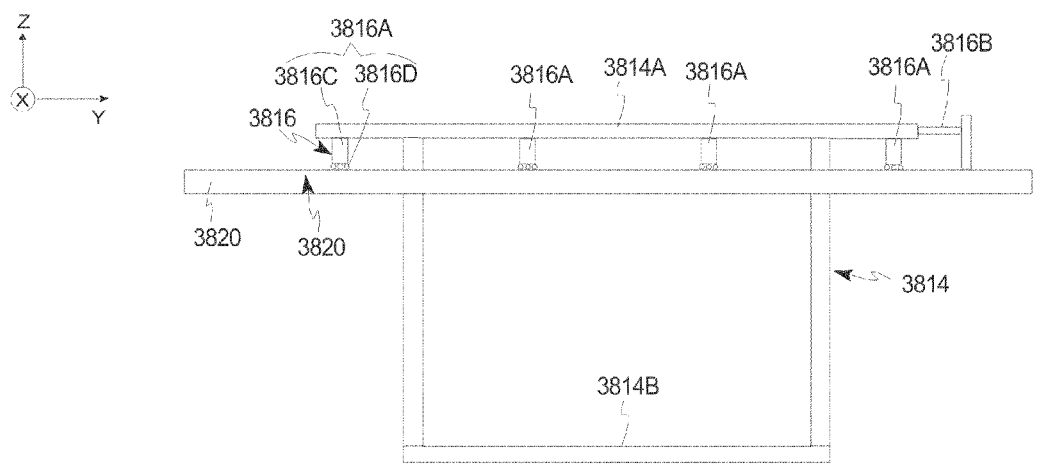
FIG. 38 is a simplified illustration of yet another embodiment of an isolation system and a pedestal having features of the present invention.

FIG. 38 is a simplified illustration of yet another embodiment of an isolation system 3816 that can be coupled to the pedestal 814 and that can be used to support the suspended assembly. In this embodiment, the isolation system 3816 is secured to the first pedestal level 3814A instead of the second pedestal level 814B. Further, in this embodiment, the isolation system 3816 includes (i) a plurality of vertical isolation subassemblies 3816A that isolate along the Z axis and about the X and Y axes, and (ii) one or more horizontal isolation subassemblies 3816B (only one is illustrated in FIG. 38) that isolate along the X and Y axes, and about the Z axis. With this design, the isolation system 3816 attenuates vibration with six degrees of freedom.

In this embodiment, for example, the mounting base 3820B can include a pair of spaced apart beams 3820A (only one is illustrated in FIG. 38) that are positioned on opposite sides of the pedestal 3814. Further, the vertical isolation subassemblies 3816A can include a resilient assembly 3816C that isolates, and a roller assembly 3816D that allows pedestal 814 to move along the X axis and along the Y axis. The resilient assembly 816C and the horizontal isolation subassemblies 3816B can include one or more springs, dampers, and/or can be similar to the designs described above.

Figure 39A:
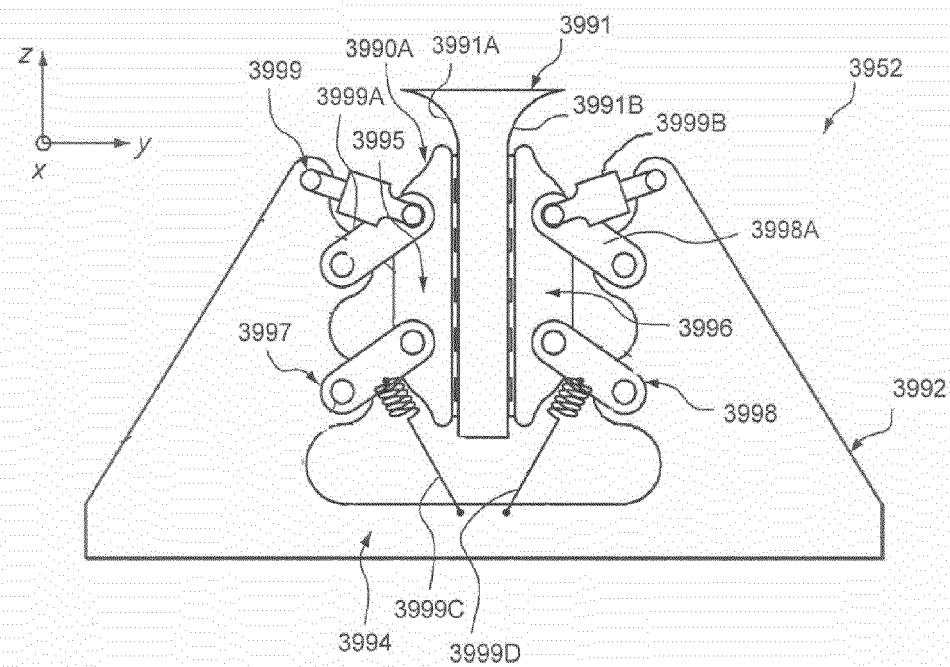
FIG. 39A is a simplified illustration of one embodiment of a lock having features of the present invention in a locked position.
Figure 39B:
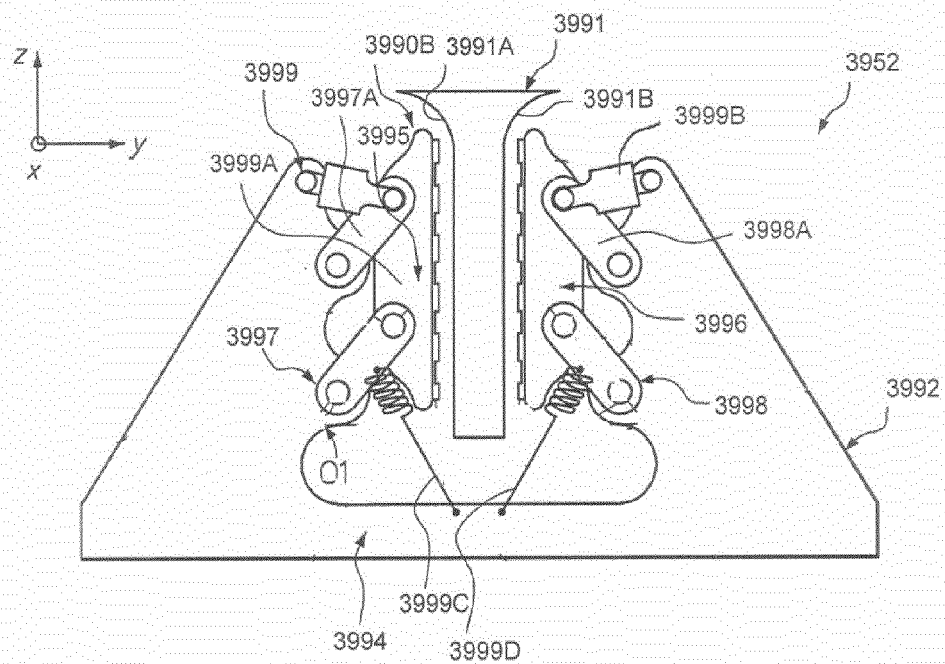
FIG. 39B is a simplified illustration of the lock of FIG. 39A in an unlocked position.

FIG. 39A is a simplified side illustration of one, non-exclusive embodiment of a lock 3952 in a locked position 990A that can be used in the assembly to selectively inhibit movement of suspended assembly downward along an axis (e.g. the Z axis in FIG. 39A), and FIG. 39B is a simplified side illustration of the lock 3952 in an unlocked position 3990B.

In this embodiment, the vertical lock 3952 includes a lock beam 3991, and one or more lock subassemblies 3992 (only one is shown in FIGS. 39A and 39B). For example, the lock beam 3991 can be a long, generally rectangular shaped beam. Further, in this embodiment, the lock beam 991 includes a first beam side 991A and an opposed second beam side 3991B that are selectively engaged by the lock subassembly 3992 to selectively lock the lock subassembly 3992 to the lock beam 991. In this embodiment, each of the beam sides 3991A, 3991B is a generally planar surface and each is substantially parallel to the Z axis (the axis in which the motion is inhibited). Additionally, one or both of the beam sides 3991A, 3991B can include one or more surface features (not shown) that increases the friction between the beam sides 3991A, 3991B and the lock sub-assembly 3992.

In this embodiment, the lock beam 3991 is fixedly secured (e.g. via welds, bolts or another type of fastener) to the pedestal, and the lock subassembly 3992 is fixedly secured (e.g. via welds, bolts or another type of fastener) to the mounting base. Alternatively, the lock beam 3991 can be secured to the mounting base, and the lock subassembly 3992 can be secured to the pedestal.

The lock sub-assembly 3992 selectively retains the lock beam 3991. In one embodiment, the lock sub-assembly 3992 includes (i) a lock base 3994, (ii) a first beam engager 3995, (iii) a second beam engager 3996, (iv) a first connector assembly 3997, (v) a second connector assembly 3998, and (vi) a contact mover assembly 3999. The shape, size, and design of each of these components can be varied to achieve the desired locking and releasing requirements of the lock 3952. Further, one or more of these components may be optional.

The lock base 3994 is coupled to and secures the lock sub-assembly 3992 to the pedestal or the mounting base. In one embodiment, the lock base 3994 is shaped somewhat similar to a truncated triangle.

The beam engagers 3995, 3996 are movable between the locked position 3990A in which the beam engagers 3995, 3996 engage and retain the respective beam side 3991A, 3991B and the unlocked position 3990B in which the beam engagers 3995, 3996 does not sufficiently engage the beam sides 3991A, 3991B and the lock beam 3994 is free to move relative to the beam engagers 3995, 3996.

The connector assemblies 3997, 3998 movable and pivotable connect the beam engagers 3995, 3996 to the lock base 3994 so that the beam engager 3995, 3996 can be moved and pivoted between the locked position 3990A and the unlocked position 3990B. In one embodiment, each connector assembly 3997, 3998 includes two pairs of connector beams 3997A, 3998A (only one pair for each is illustrated) that are shaped somewhat similar to a long oval shaped flat plate. In this embodiment, each of the connector beams 3997A is pivotable connected at a proximal end to the lock base 3994, and is pivotable connected at a distal end to one of the beam engagers 3995, 3996.

In certain embodiments, the connector assemblies 3997, 3998 are oriented so that when the beam engagers 3995, 3996 are engaging the lock beam 3991, (i) movement of (or force on) the lock beam 3991 in the first direction along the first axis (downward along the Z axis in FIGS. 39A and 39B) urges the beam engagers 3995, 3996 towards each other, and (ii) movement of (or force on) the lock beam 3991 in a second direction along the first axis (upward along the Z axis) urges the beam engagers 3995, 3996 away from each other. As a result of this design, the lock 3952 is a self-seizing, quick release mechanism that can support a very large load with a minimal required release force. Further, the load itself is used in the seizing/binding arrangement of the lock.

The contact mover assembly 3999 moves the beam engagers 3995, 3996 between the positions 3990A, 3990B. In one embodiment, the contract mover assembly 3999 includes (i) a first mover 3999A that is connected to and quickly moves the first beam engager 3995 between the positions 3990A, 3990B and the lock base 3991, and (ii) a second mover 3999B that is connected to and quickly moves the second beam engager 3996 between the positions 3990A, 3990B and the lock base 3991. For example, each mover 3999A, 3999B can be a linear motor, a solenoid, a rotary actuator, a fluid actuator, or another type of actuator.

Additionally, the contact mover assembly 3999 can include (i) a first preload 3999C that is connected to and urges (biases) the first beam engager 3995 against the first beam side 3991A and the locked position 3990A, and (ii) a second preload 3999D that is connected to and urges (biases) the second beam engager 3996 against the second beam side 3991B and the locked position 3990A. For example, each preload 3999C, 3999D can be a spring, or another resilient member.

Figure 40A:
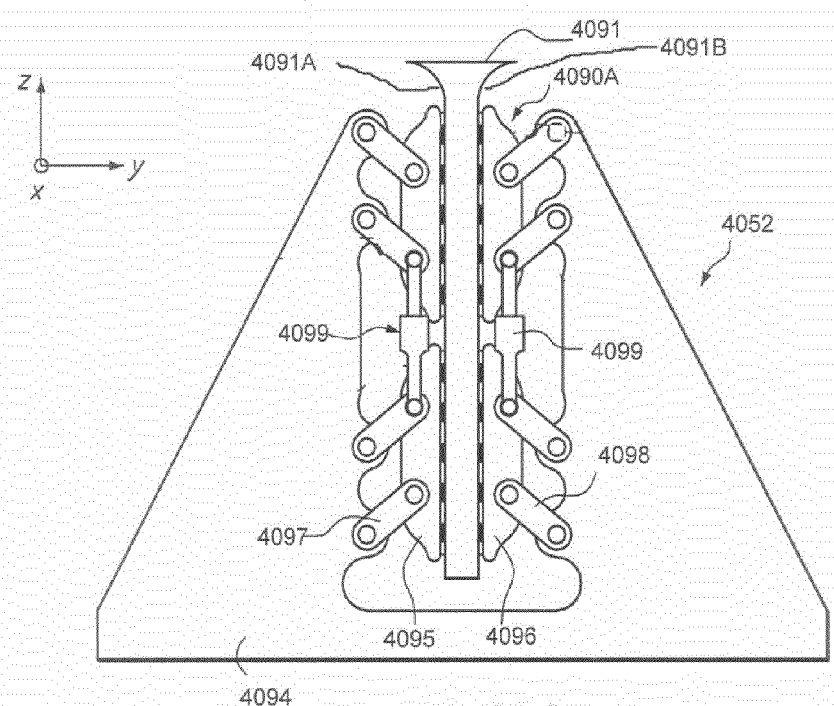
FIG. 40A is a simplified illustration of another embodiment of a lock having features of the present invention in a locked position.
Figure 40B:
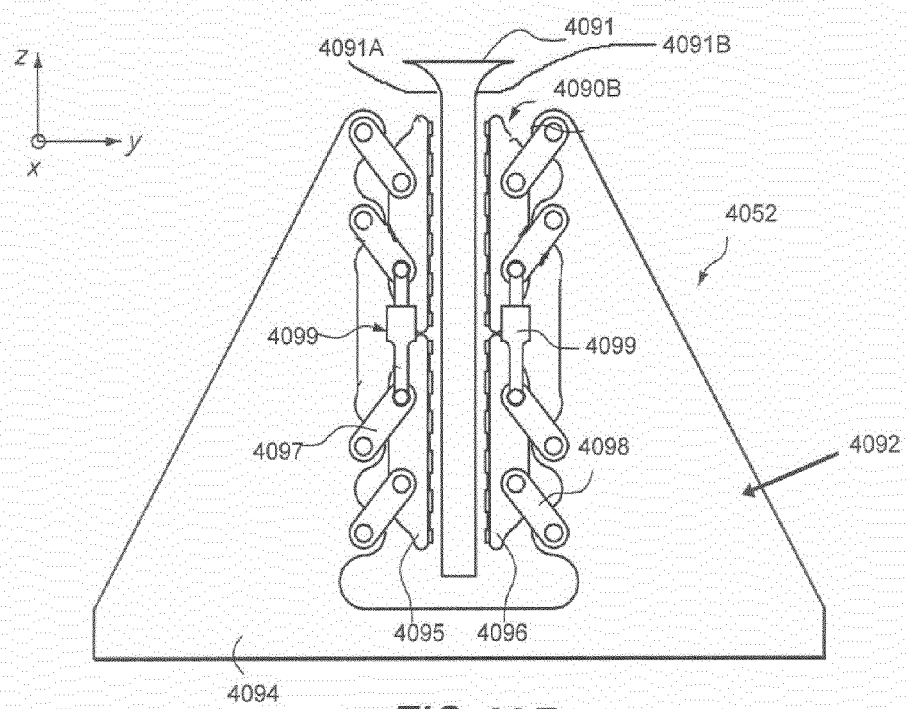
FIG. 40B is a simplified illustration of the lock of FIG. 40A in an unlocked position.

FIG. 40A is a simplified side illustration of another, non-exclusive embodiment of a lock 4052 in a locked position 4090A that can be used in the assembly of FIG. 29 to selectively inhibit movement of suspended assembly in both directions along an axis (e.g. the Z axis in FIG. 40A), and FIG. 40B is a simplified side illustration of the lock 4052 in an unlocked position 4090B.

In this embodiment, the vertical lock 4052 includes a lock beam 4091, and one or more lock subassemblies 4092 (only one is shown in FIGS. 40A and 40B). In this embodiment, the lock beam 4091 again includes a first beam side 4091A and an opposed second beam side 4091B that are selectively engaged by the lock subassembly 4092.

In one embodiment, the lock sub-assembly 4092 includes (i) a lock base 4094, (ii) a pair of first beam engagers 4095, (iii) a pair of second beam engagers 4096, (iv) a pair of first connector assemblies 4097, (v) a pair of second connector assemblies 4098, and (vi) a contact mover assembly 4099 that are similar to the corresponding components described above and illustrated in FIGS. 39A and 39B. However, in this embodiment, the beam engagers 4095, 4096 and the connector assemblies 4097, 4098 are oriented to selectively inhibit motion in both directions along the Z axis.

In yet another non-exclusive example, each lock can be somewhat similar in design to a disk brake system and can include a pair of calipers that selectively clamp a moving target. Alternatively, each lock can have a different design. For example, each lock can be a plunger (not shown) positioned in magnetorheological fluid (not shown). With this design, when no current is applied across the magnetorheological fluid, the plunger is free to move. Alternatively, when current is applied across the magnetorheological fluid, the plunger is inhibited from moving.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 41A:
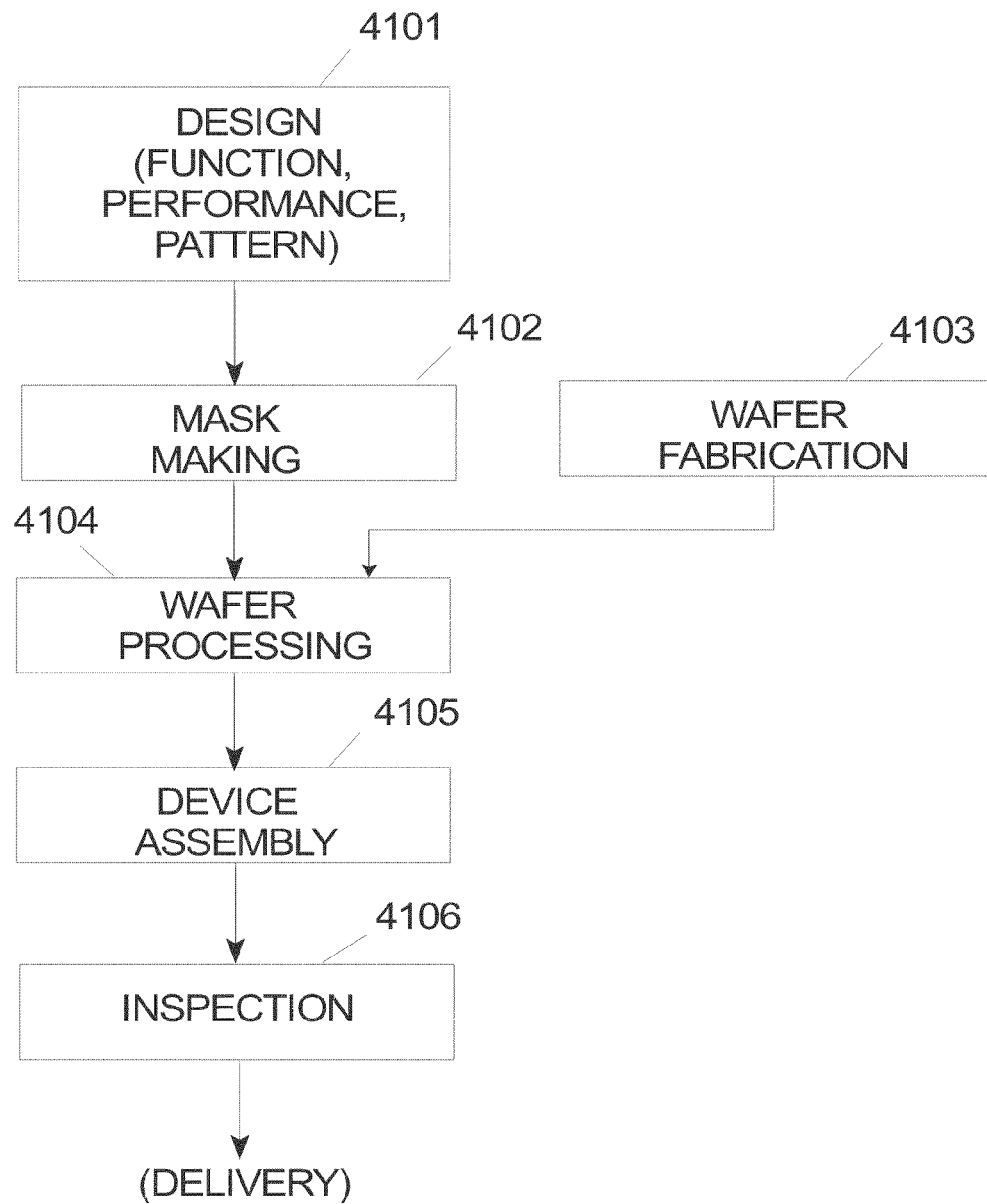
FIG. 41A is a flow chart that outlines a process for manufacturing a device in accordance with the present invention.

Semiconductor devices can be fabricated using the above described, systems, by the process shown generally in FIG. 41A. In step 4101 the device's function and performance characteristics are designed. Next, in step 4102, a mask (reticle) having a pattern is designed according to the previous designing step, and in a parallel step 4103 a wafer is made from a silicon material. The mask pattern designed in step 4102 is exposed onto the wafer from step 4103 in step 4104 by a photolithography system described hereinabove in accordance with the present invention. In step 4105, the semiconductor device is assembled (including the dicing process, bonding process and packaging process), finally, the device is then inspected in step 4106.

Figure 41B:
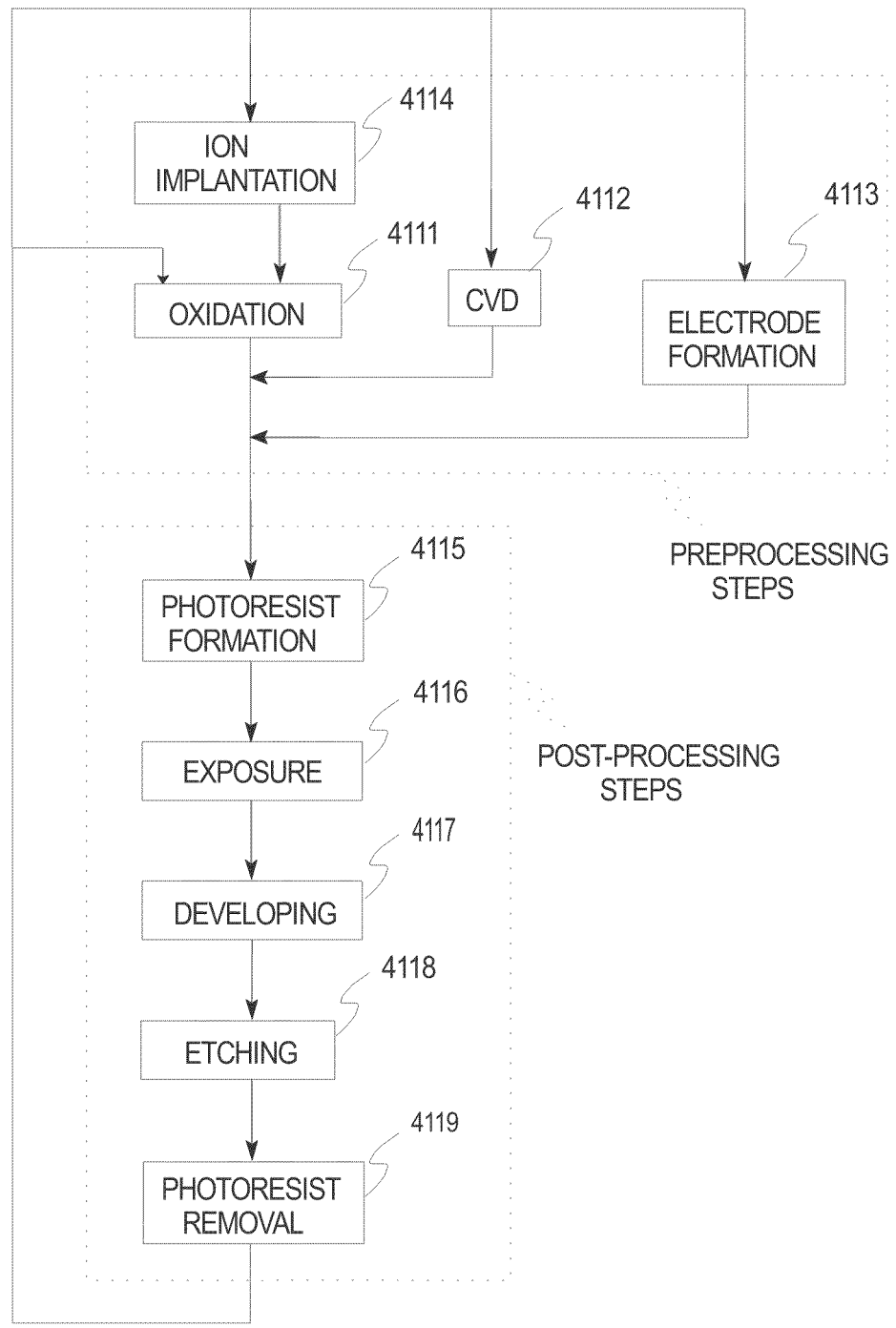
FIG. 41B is a flow chart that outlines device processing in more detail.

FIG. 41B illustrates a detailed flowchart example of the above-mentioned step 4104 in the case of fabricating semiconductor devices. In FIG. 41B, in step 4111 (oxidation step), the wafer surface is oxidized. In step 4112 (CVD step), an insulation film is formed on the wafer surface. In step 4113 (electrode formation step), electrodes are formed on the wafer by vapor deposition. In step 4114 (ion implantation step), ions are implanted in the wafer. The above mentioned steps 4111-4114 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 4115 (photoresist formation step), photoresist is applied to a wafer. Next, in step 4116 (exposure step), the above-mentioned exposure device is used to transfer the circuit pattern of a mask (reticle) to a wafer. Then in step 4117 (developing step), the exposed wafer is developed, and in step 4118 (etching step), parts other than residual photoresist (exposed material surface) are removed by etching. In step 4119 (photoresist removal step), unnecessary photoresist remaining after etching is removed. Multiple circuit patterns are formed by repetition of these preprocessing and post-processing steps.

While the designs as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims. For example, the suspensions disclosed herein can be used in other seismic isolation or vibration isolation systems. More specifically, the suspensions can be used in applications where actuators, such as electromagnetic actuators, are used to control the motion of heavy objects against gravity, and/or active automotive suspensions.

What is claimed is:

1. An isolation system for inhibiting the transfer of motion between a first object and a second object, the isolation system comprising:
   a pedestal assembly on which the first object is mounted; and
   a suspension assembly coupling the pedestal assembly and the second object, the suspension assembly supporting the pedestal assembly with substantially zero stiffness, the suspension assembly including a positive stiffness resilient mechanism and a negative stiffness resilient mechanism.

2. The isolation system of claim 1 wherein the negative stiffness resilient mechanism includes (i) a boom connector that is fixedly secured to the first object; (ii) a boom that pivotably cantilevers from the boom connector, the boom being adapted to be coupled to the second object; (iii) a movable mount that is movable relative to the boom connector; and (iv) a boom resilient assembly that is coupled between the movable mount and the boom.

3. The isolation system of claim 1 wherein the suspension system includes (i) a first mount that is coupled to the first object; (ii) a second mount that is coupled to the second object; (iii) a first subassembly that inhibits movement of the first mount from being transferred to the second mount, the first subassembly including a first boom that pivotably cantilevers from the first mount, and a first resilient member that is coupled between the first mount and the first boom; and (iv) a second subassembly that inhibits movement of the first mount from being transferred to the second mount, the second resilient subassembly including a second boom that pivotably cantilevers from one of the mounts, and a second resilient member that is coupled between one of the mounts and the second boom.

4. The isolation system of claim 1 wherein the suspension assembly includes (i) a first mount that is secured to the first object; (ii) a first support that is secured to the second object; and (iii) a mechanism that couples the first mount to the first support, the mechanism inhibiting the transfer of motion along a first axis and along a second axis, and the mechanism defining a LaCoste type system and a garden gate type assembly.

5. The isolation system of claim 4 wherein the LaCoste type system is secured to the first mount, and wherein the garden gate type assembly extends between and hingeably connects the LaCoste type system and the first support.

6. The isolation system of claim 1 wherein the pedestal assembly includes a first pedestal and a second pedestal, and wherein the suspension assembly includes a first suspension that is coupled between the mounting base and the first pedestal and a second suspension that is coupled between the mounting base and the second pedestal, and further comprising a pedestal synchronization system that causes the first pedestal to move approximately together with the second pedestal during a disturbance which exceeds a predetermined tolerance.

7. The precision assembly of claim 1 wherein the first object includes an exposure apparatus that transfers an image to a substrate, the exposure apparatus being mounted to the pedestal assembly.

8. The isolation system of claim 1 wherein the negative stiffness resilient mechanism is a passive, negative stiffness resilient mechanism.

9. The precision assembly of claim 8 wherein the suspension system inhibits the transfer of motion between the mounting base and the pedestal assembly, the suspension system including (i) a first boom that is coupled to the mounting base and the pedestal assembly, the first boom being pivotably coupled to at least one of the mounting base and the pedestal assembly, and (ii) a first resilient assembly that is coupled between the mounting base and at least one of the first boom and the pedestal assembly.

10. The precision assembly of claim 9 wherein the first resilient assembly includes a piston cylinder and a piston that is movable relative to the piston cylinder.

11. The precision assembly of claim 9 wherein the suspension system includes (i) a second boom that is coupled to the mounting base and the pedestal assembly, the second boom being pivotably coupled to at least one of the mounting base and the pedestal assembly, and (ii) a second resilient assembly that is coupled between the mounting base and at least one of the second boom and the pedestal assembly.

12. The precision assembly of claim 9 wherein the suspension system includes a movable mount that movably couples the first resilient assembly to the mounting base, a boom connector that pivotably connects the boom to the mounting base, and a mount resilient assembly that maintains the movable mount spaced apart from the boom connector.

13. The precision assembly of claim 9 wherein the precision manufacturing apparatus is an exposure apparatus that is adapted to transfer the image to the substrate, the exposure apparatus includes a plurality of first level components and a plurality of second level components; and wherein the pedestal assembly includes a first pedestal level, and a spaced apart second pedestal level that are fixedly secured together so that movement of one of the pedestal levels results in movement of the other pedestal level, the first pedestal level supporting the first level components, and the second pedestal level supporting the second level components, wherein one of the pedestal levels is at least partly positioned above the other pedestal level.

14. The precision assembly of claim 9 further comprising a locking assembly for selectively securing the pedestal assembly in a first direction along a first axis to the mounting base, the locking assembly comprising (i) a lock beam that is coupled to one of the pedestal assembly and the mounting base, the lock beam including a first beam side and an opposed second beam side; and (ii) a lock sub-assembly that selectively retains the lock beam, the lock sub-assembly including (i) a lock base that is coupled to one of the pedestal assembly and the mounting base, (ii) a first beam engager that is movable between a locked position in which the first beam engager engages the first beam side, and an unlocked position in which the first beam engager allows the first beam side to move relative to the first beam engager, (iii) a second beam engager that is movable between the locked position in which the second beam engager engages the second beam side, and the unlocked position in which the second beam engager allows the second beam side to move relative to the second beam engager, (iv) a first connector assembly that movable connects the first beam engager to the lock base so that the first beam engager can be moved between the locked position and the unlocked position, and (v) a second connector assembly that movable connects the second beam engager to the lock base so that the second beam engager can be moved between the locked position and the unlocked position; wherein the connector assemblies are oriented so that when the beam engagers are engaging the lock beam, movement of the lock beam in the first direction along the first axis urges the beam engagers towards each other.

15. The precision assembly of claim 9 wherein the precision fabrication apparatus includes an exposure apparatus that transfers an image to the substrate, the exposure apparatus being mounted to the pedestal assembly.

16. A method of making a wafer including the steps of providing a substrate, and transferring an image to the substrate with the precision assembly of claim 15.

17. A precision assembly for fabricating a substrate, the precision assembly being supported by a mounting base, the precision assembly comprising a precision fabrication apparatus adapted for fabricating the substrate, and the isolation system of claim 1 that supports at least a portion of the precision fabrication apparatus.

18. A method for inhibiting the transfer of motion between a first object and a second object, the method comprising the steps of:
mounting the first object onto a pedestal assembly; and
coupling the pedestal assembly to the second object with a suspension assembly that supports the pedestal assembly with substantially zero stiffness, the step of coupling including the steps of coupling the pedestal assembly to the second object with a positive stiffness resilient mechanism, and coupling the pedestal assembly to the second object with a passive, negative stiffness resilient mechanism.

19. The method of claim 18 wherein the step of coupling includes the steps of (i) coupling a first mount to the first object; (ii) coupling a second mount to the second object; (iii) inhibiting movement of the first mount from being transferred to the second mount with a first subassembly, the first subassembly including a first boom that pivotably cantilevers from the first mount, and a first resilient member that is coupled between the first mount and the first boom; and (iv) inhibiting movement of the first mount from being transferred to the second mount with a second subassembly, the second resilient subassembly including a second boom that pivotably cantilevers from one of the mounts, and a second resilient member that is coupled between one of the mounts and the second boom.

20. The method of claim 18 wherein the step of coupling includes the steps of (i) securing a first mount to the first object; (ii) securing a first support to the second object; and (iii) coupling the first mount to the first support with a mechanism that inhibits the transfer of motion along a first axis and along a second axis, and the mechanism defining a LaCoste type system and a garden gate type assembly.

21. The method of claim 18 wherein the pedestal assembly includes a first pedestal and a second pedestal, and wherein the suspension assembly includes a first suspension that is coupled between the mounting base and the first pedestal and a second suspension that is coupled between the mounting base and the second pedestal, and wherein the method includes the step of causing the first pedestal to move approximately together with the second pedestal during a disturbance which exceeds a predetermined tolerance with a pedestal synchronization system.

22. An isolation system for inhibiting the transfer of motion between a first object and a second object, the isolation system comprising:
 a pedestal assembly on which the first object is mounted; and
 a suspension assembly coupling the pedestal assembly and the second object, the suspension assembly supporting the pedestal assembly with substantially zero stiffness, the suspension assembly including a positive stiffness resilient mechanism and a negative stiffness resilient mechanism; and
 wherein the negative stiffness resilient mechanism includes (i) a boom connector that is fixedly secured to the first object; (ii) a boom that pivotably cantilevers from the boom connector, the boom being adapted to be coupled to the second object; (iii) a movable mount that is movable relative to the boom connector; and (iv) a boom resilient assembly that is coupled between the movable mount and the boom.

23. The isolation system of claim 22 wherein the boom resilient assembly functions substantially similar to a zero-length spring over an operational range of the boom first resilient assembly.

24. The isolation system of claim 23 further comprising a mount resilient assembly that maintains the movable mount spaced apart from the boom connector.

25. An isolation system for inhibiting the transfer of motion between a first object and a second object, the isolation system comprising:
 a pedestal assembly on which the first object is mounted; and
 a suspension assembly coupling the pedestal assembly and the second object, the suspension assembly supporting the pedestal assembly with substantially zero stiffness, wherein the suspension system includes (i) a first mount that is coupled to the first object; (ii) a second mount that is coupled to the second object; (iii) a first subassembly that inhibits movement of the first mount from being transferred to the second mount, the first subassembly including a first boom that pivotably cantilevers from the first mount, and a first resilient member that is coupled between the first mount and the first boom; and (iv) a second subassembly that inhibits movement of the first mount from being transferred to the second mount, the second resilient subassembly including a second boom that pivotably cantilevers from one of the mounts, and a second resilient member that is coupled between one of the mounts and the second boom.

26. The isolation system of claim 25 wherein the first boom includes a boom distal end that is mechanically coupled to the second mount; wherein the second boom is pivotably connected to the first mount, and the second resilient member is coupled between the first mount and the second boom; and wherein each resilient member functions similar to a zero length spring over an operation range, each of the subassemblies is a LaCoste type system, and the first and second subassemblies are arranged in parallel.

27. An isolation system for inhibiting the transfer of motion between a first object and a second object, the isolation system comprising:
 a pedestal assembly on which the first object is mounted, the pedestal assembly including a first pedestal and a second pedestal;
 a suspension assembly coupling the pedestal assembly and the second object, the suspension assembly supporting the pedestal assembly with substantially zero stiffness, the suspension assembly including a first suspension that is coupled between a mounting base and the first pedestal and a second suspension that is coupled between the mounting base and the second pedestal; and
 a pedestal synchronization system that causes the first pedestal to move approximately together with the second pedestal during a disturbance which exceeds a predetermined tolerance.

28. The isolation system of claim 27 wherein the pedestal synchronization system includes a pedestal lock assembly that selectively locks the first pedestal to the second pedestal.

29. The isolation system of claim 27 wherein the pedestal synchronization system includes a pedestal mover assembly that causes the first pedestal to move approximately together with the second pedestal during a seismic event.

30. A method for inhibiting the transfer of motion between a first object and a second object, the method comprising the steps of:
 mounting the first object onto a pedestal assembly; and
 coupling the pedestal assembly to the second object with a suspension assembly that supports the pedestal assembly with substantially zero stiffness, the step of coupling including the steps of (i) coupling a first mount to the first object; (ii) coupling a second mount to the second object; (iii) inhibiting movement of the first mount from being transferred to the second mount with a first subassembly, the first subassembly including a first boom that pivotably cantilevers from the first mount, and a first resilient member that is coupled between the first mount and the first boom; and (iv) inhibiting movement of the first mount from being transferred to the second mount with a second subassembly, the second resilient subassembly including a second boom that pivotably cantilevers from one of the mounts, and a second resilient member that is coupled between one of the mounts and the second boom.

31. A method for inhibiting the transfer of motion between a first object and a second object, the method comprising the steps of:
 mounting the first object onto a pedestal assembly, the pedestal assembly including a first pedestal and a second pedestal;
 coupling the pedestal assembly to the second object with a suspension assembly that supports the pedestal assembly with substantially zero stiffness, the suspension assembly including a first suspension that is coupled between a mounting base and the first pedestal and a second suspension that is coupled between the mounting base and the second pedestal; and
 causing the first pedestal to move approximately together with the second pedestal during a disturbance which exceeds a predetermined tolerance with a pedestal synchronization system.

* * * * *

UNITED STATES PATENT AND TRADEMARK OFFICE
CERTIFICATE OF CORRECTION

PATENT NO. : 8,441,615 B2  
APPLICATION NO. : 12/548895  
DATED : May 14, 2013  
INVENTOR(S) : Fardad A. Hashemi Page 1 of 1

It is certified that error appears in the above-identified patent and that said Letters Patent is hereby corrected as shown below:

In the Claims:

Column 53, Line 35, delete "first".

Signed and Sealed this  
Sixteenth Day of July, 2013

Teresa Stanek Rea  
*Acting Director of the United States Patent and Trademark Office*